(12) United States Patent
Adachi et al.

(10) Patent No.: US 12,720,955 B2
(45) Date of Patent: Aug. 25, 2026

(54) METHOD OF MANUFACTURING DISPLAY DEVICE AND DISPLAY DEVICE HAVING A LIQUID-REPELLENT BANK FOR PREVENTING COATING LIQUID OUTFLOW

(71) Applicant: SHARP KABUSHIKI KAISHA, Sakai City (JP)

(72) Inventors: Takahiro Adachi, Sakai City (JP); Yasushi Asaoka, Sakai City (JP)

(73) Assignee: SHARP KABUSHIKI KAISHA, Sakai City (JP)

( * ) Notice: Subject to any disclaimer, the term of this patent is extended or adjusted under 35 U.S.C. 154(b) by 397 days.

(21) Appl. No.: 18/278,825

(22) PCT Filed: Apr. 19, 2022

(86) PCT No.: PCT/JP2022/018195
§ 371 (c)(1),
(2) Date: Aug. 24, 2023

(87) PCT Pub. No.: WO2022/224963
PCT Pub. Date: Oct. 27, 2022

(65) Prior Publication Data

US 2024/0147766 A1 May 2, 2024

(30) Foreign Application Priority Data

Apr. 19, 2021 (WO) .................. PCT/JP2021/015897

(51) Int. Cl.
*H10K 59/12* (2023.01)
*H10K 59/122* (2023.01)
*H10K 59/131* (2023.01)
*H10K 59/70* (2023.01)
*H10K 102/00* (2023.01)

(52) U.S. Cl.
CPC ....... *H10K 59/1201* (2023.02); *H10K 59/122* (2023.02); *H10K 59/131* (2023.02); *H10K 59/70* (2023.02); *H10K 2102/351* (2023.02)

(58) Field of Classification Search
None
See application file for complete search history.

(56) References Cited

U.S. PATENT DOCUMENTS

2003/0143845 A1 7/2003 Mori et al.
2006/0220543 A1 10/2006 Makiura
(Continued)

FOREIGN PATENT DOCUMENTS

JP 2005-142118 A 6/2005
JP 2005-158494 A 6/2005
(Continued)

*Primary Examiner* — Nduka E Ojeh
(74) *Attorney, Agent, or Firm* — ScienBiziP, P.C.

(57) ABSTRACT

A method of manufacturing a display device includes: a liquid-repelling bank formation step of forming a liquid-repellent bank containing a liquid-repelling material that repels a coating liquid; a functional layer formation step of forming a functional layer in a region including an area surrounded by the liquid-repellent bank by applying the coating liquid to the area; and a removal step of, subsequent to the functional layer formation step, removing at least a part of the liquid-repellent bank.

15 Claims, 41 Drawing Sheets

(56) References Cited

U.S. PATENT DOCUMENTS

| | | | | |
|---|---|---|---|---|
| 2010/0289728 | A1* | 11/2010 | Nakatani | H10K 71/12 345/76 |
| 2012/0313509 | A1 | 12/2012 | Takagi et al. | |
| 2015/0115233 | A1* | 4/2015 | Kim | H10K 50/15 257/40 |
| 2016/0181532 | A1* | 6/2016 | Ando | H10K 59/122 438/46 |
| 2016/0202542 | A1* | 7/2016 | Kwak | G02F 1/133512 349/110 |
| 2018/0309060 | A1 | 10/2018 | Ando et al. | |
| 2019/0334088 | A1 | 10/2019 | Ando et al. | |
| 2020/0373364 | A1* | 11/2020 | Yoon | H10K 59/122 |
| 2021/0066673 | A1* | 3/2021 | Zhang | H10K 71/441 |

FOREIGN PATENT DOCUMENTS

| | | | |
|---|---|---|---|
| JP | 2006-310282 | A | 11/2006 |
| JP | 2009-064727 | A | 3/2009 |
| JP | 2009-218128 | A | 9/2009 |
| JP | 2011-238377 | A | 11/2011 |
| JP | 2012-256587 | A | 12/2012 |
| JP | 2014-075260 | A | 4/2014 |
| WO | 03048864 | A1 | 6/2003 |
| WO | 2009113239 | A1 | 9/2009 |
| WO | 2015041053 | A1 | 3/2015 |

* cited by examiner

TOP-FACE OVERHEAD VIEW
A-A CROSS-SECTIONAL VIEW
26
27
28
2
A 132
88
87
EXPOSED TO LIGHT AND DEVELOPED
EXPOSED PART
QD APPLIED
85
SOLVENT REMOVED
COMPONENTS DISSOLVED
ADHERING AGAIN
133
86

METHOD OF MANUFACTURING DISPLAY DEVICE AND DISPLAY DEVICE HAVING A LIQUID-REPELLENT BANK FOR PREVENTING COATING LIQUID OUTFLOW

TECHNICAL FIELD

The present disclosure relates to a method of manufacturing a display device and to a display device.

BACKGROUND ART

A technique is known of forming a functional layer by lift-off. In this technique, a coating liquid is applied to an area surrounded by a photoresist, thereby forming a functional layer, and thereafter the photoresist is removed.

Examples of such a functional layer include layers containing at least one of, for example, a light-emitting layer and a charge transport layer. The light-emitting layer is typically a light-emitting layer that emits light owing to quantum dots (which may be hereinafter referred to as a "quantum-dot light-emitting layer"). When the functional layer includes a quantum-dot light-emitting layer, the coating liquid may be, for example, a solution containing quantum dots (which may be hereinafter referred to as a "quantum-dot solution"). When the functional layer includes a charge transport layer, the coating liquid may be, for example, a solution containing a major component(s) of the charge transport layer.

CITATION LIST

Patent Literature

Patent Literature 1

PCT International Application Publication No. WO2009/113239

SUMMARY

Technical Problem

According to the technique, a display device intermediate to which a coating liquid has been applied is exposed to light and developed, and the photoresist is removed from this intermediate. In this development, the technique inevitably allows a film formed from the coating liquid applied to the photoresist to flow out into the development solution. The technique consequently may, for example, allow the filter of the effluent of the development solution to be clogged, which could undesirably necessitate an increased number of manufacturing steps of the display device and/or allow the film to flow out into the development solution and adhere to the intermediate, which could undesirably degrade the performance of the display device.

The present disclosure, in an aspect thereof, has an object to provide a method of manufacturing a display device capable of restraining increases in the number of manufacturing steps of a display device and restraining degradation of the performance of a display device and to provide such a display device.

Solution to Problem

The present disclosure, in an aspect thereof, is directed to a method of manufacturing a display device, the method including: a liquid-repelling bank formation step of forming a liquid-repellent bank containing a liquid-repelling material that repels a coating liquid; a functional layer formation step of forming a functional layer in a region including an area surrounded by the liquid-repellent bank by applying the coating liquid to the area; and a removal step of, subsequent to the functional layer formation step, removing at least a part of the liquid-repellent bank.

The present disclosure, in an aspect thereof, is directed to a display device including: a functional layer; and a liquid-repelling material between the functional layer and another layer stacked on or below the functional layer, the liquid-repelling material being configured to repel a coating liquid that is to form the functional layer.

Advantageous Effects of Disclosure

The present disclosure, in an aspect thereof, enables restraining increases in the number of manufacturing steps of a display device and restraining degradation of the performance of the display device.

BRIEF DESCRIPTION OF DRAWINGS

FIG. 80 is a schematic cross-sectional view of a structure of a display device in accordance with Embodiment 15 of the present disclosure.

DESCRIPTION OF EMBODIMENTS

Figure 1:
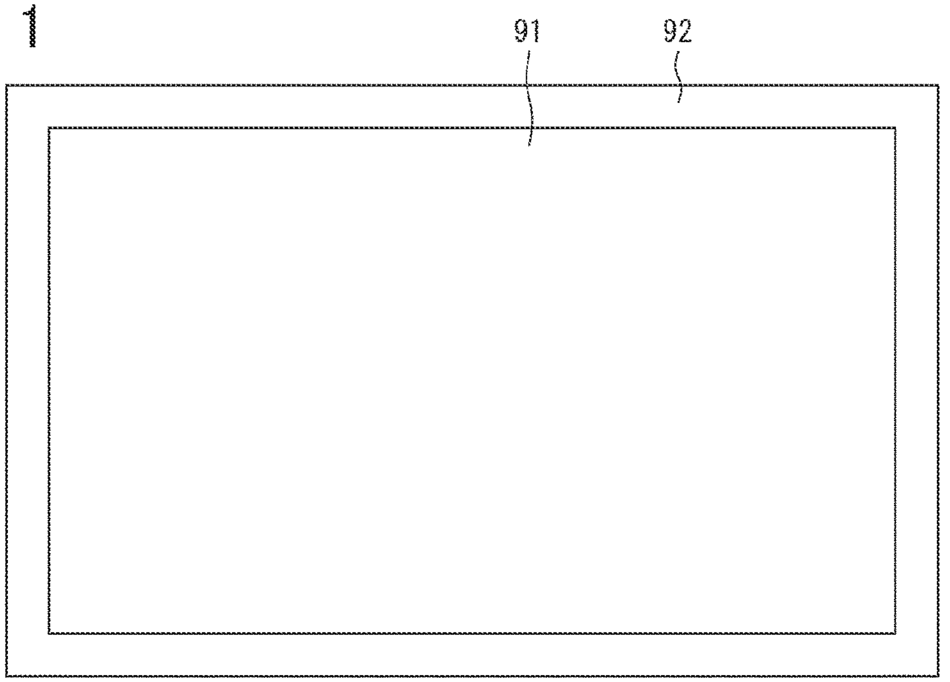
FIG. 1 is a schematic view of a display device.

The following will describe modes of the present disclosure. Note that for convenience of description, those members which have the same function as previously described members will be indicated by the same reference numerals, and description thereof may not be repeated.

FIG. 1 is a schematic view of a display device 100. The display device 100 includes: a display area 91 where the display device 100 produces a display; and a non-display area 92 where the display device 100 dose not produce a display. The non-display area 92 is positioned surrounding the display area 91.

Throughout the following, the drawings illustrating a method of manufacturing the display device 100 only show major parts of the whole manufacturing process of the display device 100. Those parts of the whole manufacturing process of the display device 100 that are not shown in the drawings can be carried out by a well-known technique.

Embodiment 1

FIGS. 2 to 9 are cross-sectional views illustrating a method of manufacturing the display device 100 in accordance with Embodiment 1 of the present disclosure.

The steps shown in FIGS. 2 to 5 correspond to a liquid-repelling bank formation step in accordance with the present disclosure. The following will describe the step shown in FIG. 2, the step shown in FIG. 3, the step shown in FIG. 4, and the step shown in FIG. 5.

Figure 2:
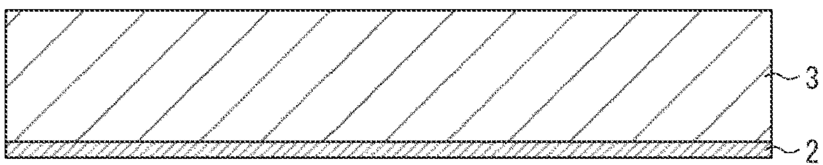
FIG. 2 is a cross-sectional view illustrating a method of manufacturing a display device in accordance with Embodiment 1 of the present disclosure.

In the step shown in FIG. 2, a liquid-repelling bank-formation-use solution 3 is applied to a substrate 2 including electrodes (not shown) formed thereon. The liquid-repelling bank-formation-use solution 3 is applied to the substrate 2 by, for example, spin-coating, slit-coating, bar-coating, printing, or a like method. In addition, in the step shown in FIG. 2, the liquid-repelling bank-formation-use solution 3 applied to the substrate 2 is baked, for example, on a hotplate. For example, the baking temperature is from 50° C. to 200° C., both inclusive, and the baking time is from 30 seconds to 30 minutes, both inclusive.

The liquid-repelling bank-formation-use solution 3 is a solution containing a liquid-repelling material, a photoresist, and a solvent. The liquid-repelling material is a material with such a property as to repel a coating liquid 4 detailed later (hereinafter, may be referred to as a "liquid repellent property"). An example of the liquid-repelling material is a perfluoroalkyl compound. The liquid-repelling material preferably accounts for at least 0.1 wt % of the liquid-repelling bank-formation-use solution 3. The "liquid repellent property" can be more specifically described as such a property that the material can repel the solvent in the coating liquid 4. The photoresist is suitably a positive photoresist.

Figure 3:
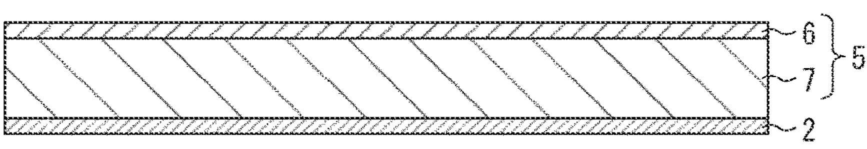
FIG. 3 is a cross-sectional view illustrating the method of manufacturing a display device in accordance with Embodiment 1 of the present disclosure.

FIG. 3 shows the liquid-repelling bank-formation-use solution 3 having solidified to form a resist layer 5 in the step shown in FIG. 2. The liquid-repelling material moves when the liquid-repelling bank-formation-use solution 3 solidifies. Therefore, on the front face of the resist layer 5 is there provided a liquid-repellent layer 6 that contains the liquid-repelling material in a high concentration. In addition, on the opposite side of the front face of the resist layer 5 is there provided a photosensitive layer 7 that contains the liquid-repelling material in a lower concentration than does the liquid-repellent layer 6. The liquid-repelling material accounts for, as an example, less than 0.1 wt % of the photosensitive layer 7, and the photosensitive layer 7 can be described as a region where the photoresist is the major component. The liquid-repelling material accounts for, as an example, at least 0.1 wt % of the liquid-repellent layer 6, and the liquid-repellent layer 6 can be described as a region that contains the liquid-repelling material in a higher proportion than does the photosensitive layer 7. In other words, the resist layer 5 includes: the photosensitive layer 7 where the photoresist is the major component; and the liquid-repellent layer 6 that contains the liquid-repelling material in a higher proportion than does the photosensitive layer 7.

Note that FIG. 3 shows the liquid-repellent layer 6 and the photosensitive layer 7 as two clearly distinct layers. However, the resist layer 5 is not necessarily formed in such a manner that the liquid-repellent layer 6 and the photosensitive layer 7 form two distinct layers. The resist layer 5 may have a structure where the concentration of the liquid-repelling material changes abruptly as in the liquid-repellent layer 6 and the photosensitive layer 7 or a structure where the concentration of the liquid-repelling material changes continuously, so long as the concentration of the liquid-repelling material increases toward the front face of the resist layer 5.

In addition, a layered structure of a photoresist and a liquid-repellent layer may be used in place of the resist layer 5. This liquid-repellent layer may be formed by applying a solution containing a liquid-repelling material in a solvent to the photoresist or may be formed by transferring a liquid-repelling material to a photoresist-containing film. When a liquid-repelling material is transferred to a photoresist-containing film, the liquid-repelling material may be directly transferred to the photoresist or may not be directly transferred to the photoresist.

Alternatively, the layered structure may be formed by, first, applying a liquid-repelling material, patterning, for example, a photoresist as a protective film thereon, and removing the liquid-repelling material from the areas exposed from the protective film. Examples of the technique of removing the liquid-repelling material include use of a solvent, dry etching, and plasma etching. In so doing, the protective film is preferably removed after the completion of the patterning of the liquid-repelling material, but before the application of the coating liquid 4. This is because the protective film would be hardly liquid repellent, and the coating liquid 4 could be undesirably applied to the protective film if the coating liquid 4 is applied without removing the protective film.

In the step shown in FIG. 4, the areas where a liquid-repellent bank 8 (detailed later) is to be formed are covered with a photomask 9, and the resist layer 5 is exposed to light. Note that the photomask 9 is not necessarily used if the areas of the resist layer 5 in which the liquid-repellent bank 8 is not to be formed can be selectively exposed to light.

Figure 4:
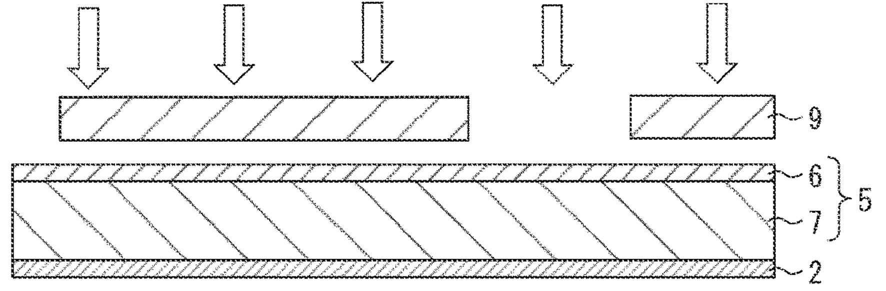
FIG. 4 is a cross-sectional view illustrating the method of manufacturing a display device in accordance with Embodiment 1 of the present disclosure.
Figure 5:
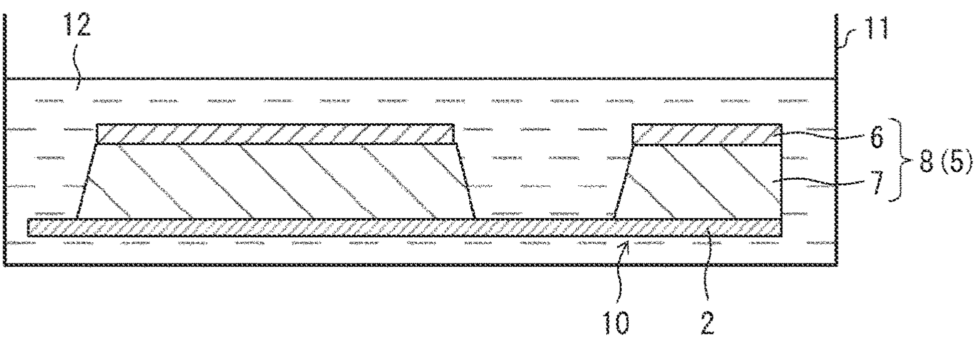
FIG. 5 is a cross-sectional view illustrating the method of manufacturing a display device in accordance with Embodiment 1 of the present disclosure.

In the step shown in FIG. 5, an intermediate 10, for the display device 100, that is obtained from the step shown in FIG. 4 is immersed in a development solution 12 in a beaker 11. Hence, the areas, of the resist layer 5, that are exposed to light in the step shown in FIG. 4 are removed from the intermediate 10. The development solution 12 may be, for example, an alkali development solution or an organic-solvent development solution. The alkali development solution may be, for example, KOH or TMAH. The organic-solvent development solution is, for example, PGMEA, acetone, or IPA. The areas of the resist layer 5 that are remaining on the intermediate 10 after the step shown in FIG. 5 correspond to the liquid-repellent bank 8. Since the liquid-repellent bank 8 contains the liquid-repellent layer 6 and the photosensitive layer 7 and contains a liquid-repelling material, the liquid-repellent bank 8 is liquid repellent. The concentration of the liquid-repelling material increases toward the front face of the liquid-repellent bank 8 by the provision of the liquid-repellent layer 6 and the photosensitive layer 7.

Figure 6:
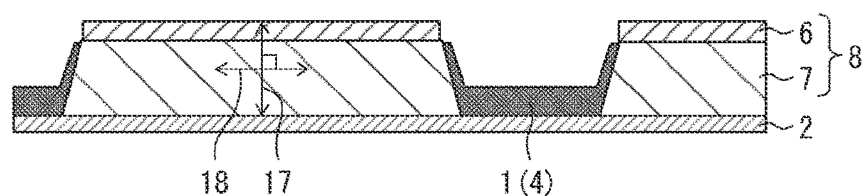
FIG. 6 is a cross-sectional view illustrating the method of manufacturing a display device in accordance with Embodiment 1 of the present disclosure.

In the step shown in FIG. 6, the coating liquid 4 is applied to a region including the area surrounded by the liquid-repellent bank 8 to form a functional layer 1 in that area (functional layer formation step). Examples of the functional layer 1 include layers containing at least one of, for example, a light-emitting layer, which is typically a quantum-dot light-emitting layer, and a charge transport layer. When the functional layer 1 contains a quantum-dot light-emitting layer, the coating liquid 4 may be, for example, a quantum-dot solution. When the functional layer 1 contains a charge transport layer, the coating liquid 4 may be, for example, a solution of a major component(s) of the charge transport layer. When the coating liquid 4 is a quantum-dot solution, the solvent in the quantum-dot solution may be, for example, a hydrocarbon (which may be a straight-chain, a branched-chain, or a cyclic hydrocarbon), an aromatic hydrocarbon, an ether (which may be a glycol ether), an ester, an alcohol, a ketone, or water.

Note that the coating liquid 4 is applied to the liquid-repellent bank 8 in the step shown in FIG. 6. It should be understood however that since the liquid-repellent bank 8 (particularly the liquid-repellent layer 6 on the front face of the liquid-repellent bank 8) is liquid repellent, the liquid-repellent bank 8 repels the coating liquid 4. Therefore, a film is restrained from being formed from the coating liquid 4 on the liquid-repellent bank 8.

Figure 7:
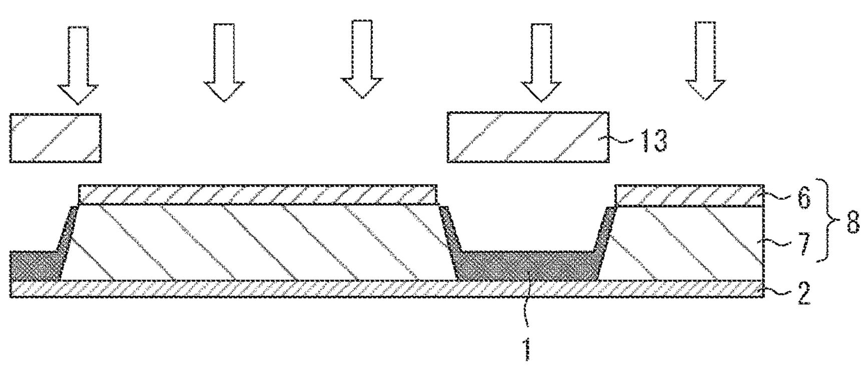
FIG. 7 is a cross-sectional view illustrating the method of manufacturing a display device in accordance with Embodiment 1 of the present disclosure.
Figure 8:
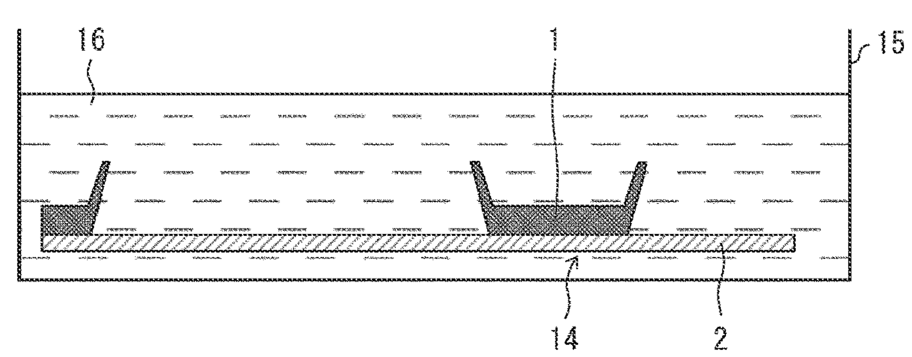
FIG. 8 is a cross-sectional view illustrating the method of manufacturing a display device in accordance with Embodiment 1 of the present disclosure.
Figure 9:
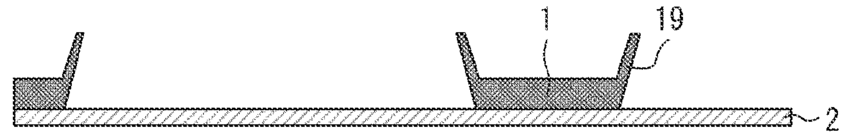
FIG. 9 is a cross-sectional view illustrating the method of manufacturing a display device in accordance with Embodiment 1 of the present disclosure.

The steps shown in FIGS. 7 to 9, which follow the functional layer formation step, correspond to a removal step in accordance with the present disclosure. The following will describe the step shown in FIG. 7, the step shown in FIG. 8, and the step shown in FIG. 9.

In the step shown in FIG. 7, the functional layer 1 is covered with a photomask 13, and the liquid-repellent bank 8 is exposed to light. Note that the photomask 13 is not necessarily used if the liquid-repellent bank 8 can be selectively exposed to light.

In the step shown in FIG. 8, an intermediate 14, for the display device 100, that is obtained from the step shown in FIG. 7 is immersed in a development solution 16 in a beaker 15. Hence, the liquid-repellent bank 8 is either partially or entirely removed from the intermediate 14. The development solution 16 may be, for example, the same solution as an example of the development solution 12. The condition where the intermediate 14 has been taken out of the development solution 16 following the completion of the step shown in FIG. 8 corresponds to FIG. 9.

After the condition shown in FIG. 9, the display device 100 can be manufactured by repeating the step shown in FIG. 2 through the step shown in FIG. 8 to, for example, form a large number of functional layers 1 and form each layer overlying the functional layers 1. In this display device 100, a liquid-repelling material is present between the functional layer 1 and another layer that is stacked on or below the functional layer 1. The other layer that is stacked on or below the functional layer 1 may be, for example, an electrode overlying or underlying the functional layer 1 or one of various layers provided between the functional layer 1 and this electrode.

Meanwhile, in the display device 100, no liquid-repelling material may be present between at least one of the large number of functional layers 1 and the other layer stacked on or below that functional layer 1. Such a functional layer 1 corresponds to a liquid-repelling-material-missing functional layer in accordance with the present disclosure.

As clearly shown in, for example, FIG. 6, the functional layer 1 has a shape that fits the shape of the liquid-repellent bank 8.

Figure 10:
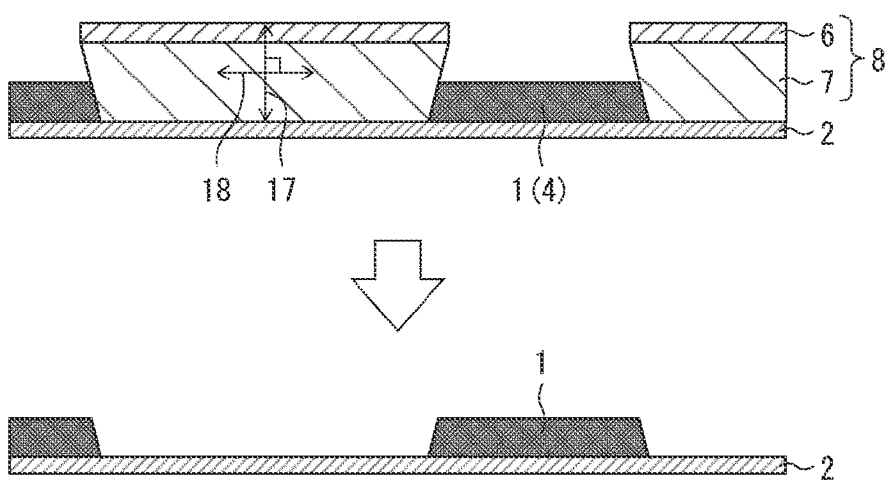
FIG. 10 is a cross-sectional view illustrating a first variation example of the method of manufacturing a display device in accordance with Embodiment 1 of the present disclosure.

FIG. 10 is a cross-sectional view illustrating a first variation example of the method of manufacturing the display device 100 in accordance with Embodiment 1 of the present disclosure. Specifically, the step shown in FIG. 10 is a variation example of the step shown in FIG. 6 and the step shown in FIG. 9.

In the step shown in FIG. 6, the liquid-repellent bank 8 has, in a direction 18 that is substantially perpendicular to a thickness direction 17 of the liquid-repellent bank 8, a dimension that is rendered in the earlier liquid-repelling bank formation step to decrease toward the top end of the liquid-repellent bank 8. Here, the coating liquid 4 extends onto the side face of the liquid-repellent bank 8 and can therefore more readily remain thereon. The functional layer 1 formed by the step shown in FIG. 6 therefore has burrs 19 formed on the top end thereof as shown in FIG. 9.

In contrast, in the step shown in FIG. 10, the dimension of the liquid-repellent bank 8 in the direction 18 that is substantially perpendicular to the thickness direction 17 of the liquid-repellent bank 8 is rendered in the earlier liquid-repelling bank formation step to increase toward the top end of the liquid-repellent bank 8. Here, the coating liquid 4 does not extend onto the side face of the liquid-repellent bank 8 and is therefore less likely to remain thereon. The functional layer 1 formed by the step shown in FIG. 10 can therefore prevent the formation of the burrs 19 on the top end thereof.

Figure 11:
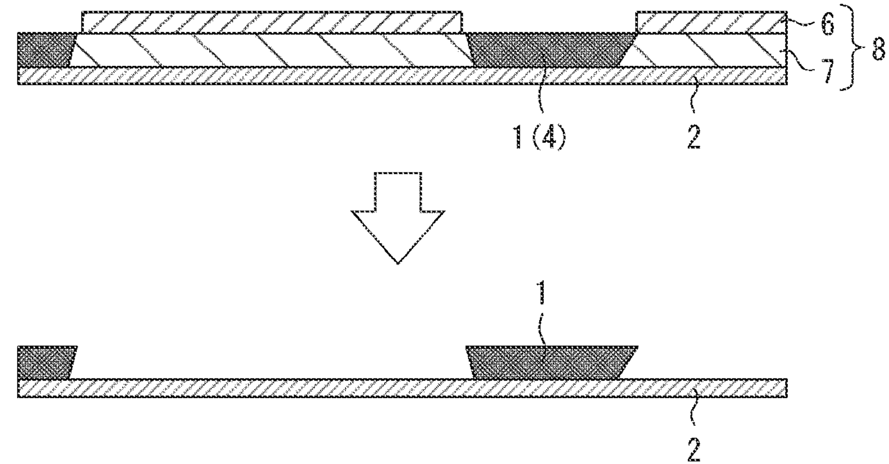
FIG. 11 is a set of cross-sectional views illustrating a second variation example of the method of manufacturing a display device in accordance with Embodiment 1 of the present disclosure.

FIG. 11 is a set of cross-sectional views illustrating a second variation example of the method of manufacturing the display device 100 in accordance with Embodiment 1 of the present disclosure. Specifically, the step shown in FIG. 11 is a variation example of the step shown in FIG. 6 and the step shown in FIG. 9.

In the step shown in FIG. 11, the height of the liquid-repellent bank 8 is rendered lower in the earlier liquid-repelling bank formation step than in the step shown in FIG. 6. Hence, again, the coating liquid 4 does not extend onto the side face of the liquid-repellent bank 8 and is less likely to remain thereon. Therefore, the functional layer 1 formed by the step shown in FIG. 11 can also prevent the formation of the burrs 19 on the top end thereof.

Figure 12:
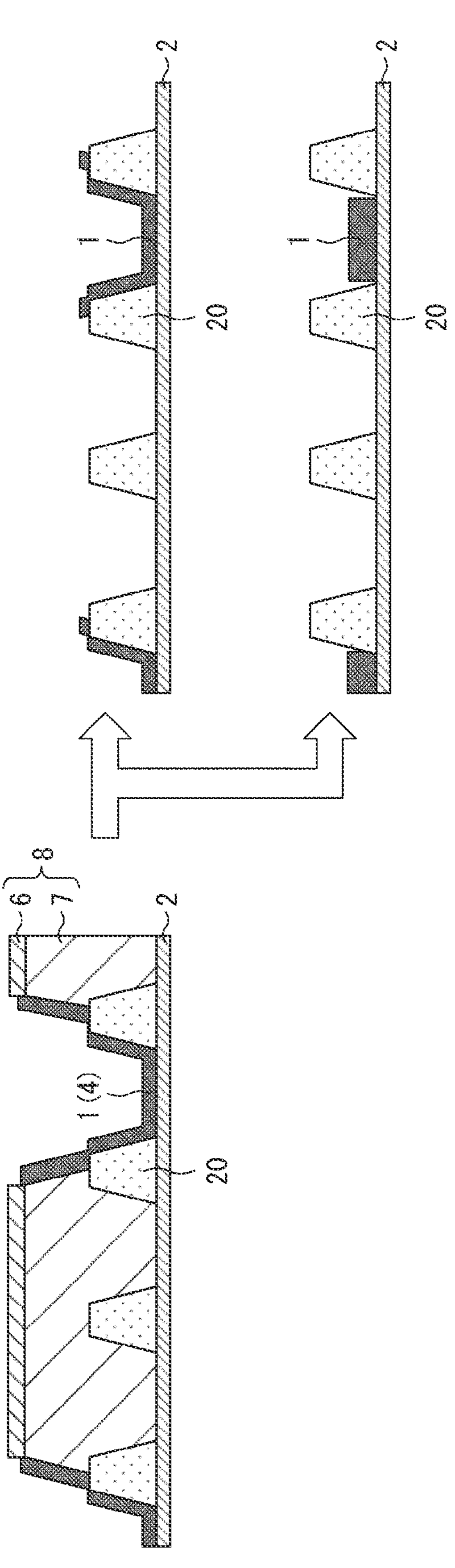
FIG. 12 is a set of cross-sectional views illustrating a third variation example of the method of manufacturing a display device in accordance with Embodiment 1 of the present disclosure.

FIG. 12 is a set of cross-sectional views illustrating a third variation example of the method of manufacturing the display device 100 in accordance with Embodiment 1 of the present disclosure. Specifically, the step shown in FIG. 12 is a variation example of the step shown in FIG. 6 and the step shown in FIG. 9.

In the step shown in FIG. 12, a bank 20 is formed on the substrate 2. The bank 20 is formed in advance in the liquid-repelling bank formation step to electrically isolate and thus separate adjacent pixels. When the bank 20 is formed on the substrate 2, the functional layer 1 may be formed on the bank 20 as shown in FIG. 12 or may not be formed on the bank 20.

Figure 13:
FIG. 13 is an illustration of an example of a cross-sectional structure of a display device in accordance with Embodiment 1 of the present disclosure.
Figure 13:
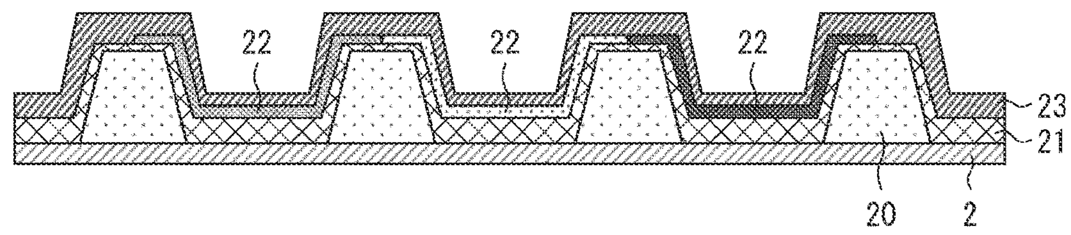

FIG. 13 is an illustration of an example of a cross-sectional structure of the display device 100 in accordance with Embodiment 1 of the present disclosure.

The display device 100 shown in FIG. 13 includes, for example: the substrate 2; the bank 20; a light-emitting layer 22, which is a specific example of the functional layer 1; an underlying layer 21 formed below the light-emitting layer 22; and an overlying layer 23 formed above the light-emitting layer 22. The underlying layer 21 and the overlying layer 23 extend beyond the bank 20, in other words, formed integral all across a plurality of areas surrounded by the bank 20. One light-emitting layer 22 is formed for each area surrounded by the bank 20.

Note that if the material for the underlying layer 21 is present on the liquid-repellent bank 8, a liquid-repellent bank 8 may fail to sufficiently exhibit the liquid repellent property thereof. Attention should therefore be paid. In addition, the overlying layer 23 is not necessarily formed integral all across a plurality of areas surrounded by the bank 20, and one overlying layer 23 may be formed for each area surrounded by the bank 20.

Figure 14:
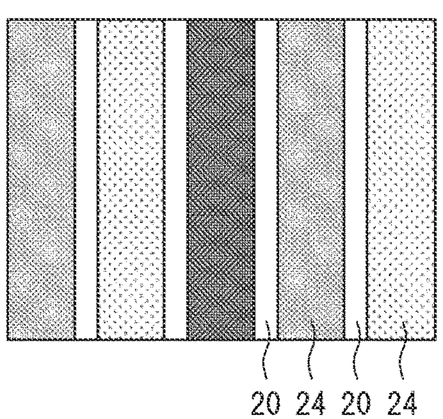
FIG. 14 is a top-face overhead view illustrating a formation example of a coating film of a display device in accordance with Embodiment 1 of the present disclosure.

FIG. 14 is a top-face overhead view illustrating a formation example of a coating film 24 of the display device 100 in accordance with Embodiment 1 of the present disclosure. The coating film 24 refers to a film formed from the coating liquid 4, including the functional layer 1.

Referring to FIG. 14, the bank 20 is formed between two adjacent coating films 24. FIG. 14 does not indicate that the coating film 24 extends onto the bank 20, which demonstrates that the coating liquid 4 is highly uniformly applied in the display device 100.

The method of manufacturing the display device 100 in accordance with Embodiment 1 of the present disclosure can be described as having the following advantages over the known lift-off formation of the functional layer.

- Less waste is produced.
- The coating liquid 4 is used in smaller quantities and hence more efficiently.
- The resist layer 5 can be more readily removed in development than photoresist. In addition, the resist layer 5 can be formed thinner than photoresist. In other words, the photoresist needs a thickness of approximately 1.5 μm, but the resist layer 5 has a thickness of approximately 0.1 μm, which is sufficient.

The coating liquid 4 is typically a quantum-dot solution, and the functional layer 1 is typically a quantum-dot light-emitting layer. These are however mere examples.

Embodiment 2

Figure 15:
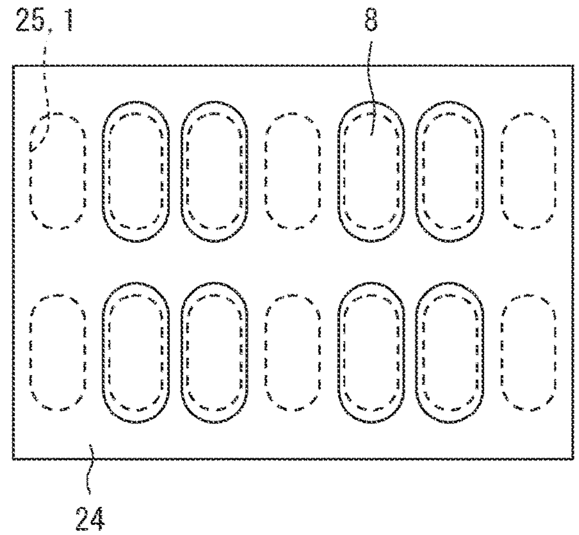
FIG. 15 is a plan view illustrating a method of manufacturing a display device in accordance with Embodiment 2 of the present disclosure.

FIG. 15 is a plan view illustrating a method of manufacturing a display device 100 in accordance with Embodiment 2 of the present disclosure.

A predetermined pixel-formation portion 25 is an area where the coating liquid 4 is applied to form the functional layer 1 and corresponds to a single pixel in the display device 100. FIG. 15 shows a plurality of predetermined pixel-formation portions 25 arranged in a lattice and a total of eight liquid-repellent banks 8 arranged in an insular manner.

In the step shown in FIG. 15, one functional layer 1 is formed for each of the predetermined pixel-formation portions 25, and a plurality of functional layers 1 are formed interconnected in the form of a single coating film 24, by applying the coating liquid 4 from above the plane shown in FIG. 15 (in the functional layer formation step). This enables reducing the size of obstacles in letting the remaining coating liquid 4 that does not constitute the functional layer 1 move out of the display area 91 of the display device 100, thereby facilitating the remaining coating liquid 4 to move out of the display area 91.

Figure 16:
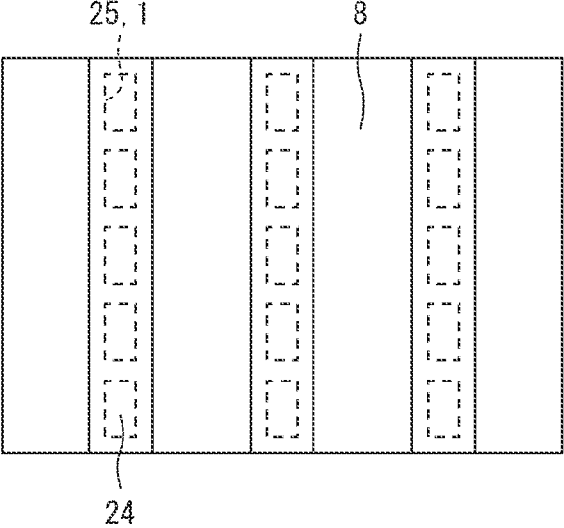
FIG. 16 is a plan view illustrating a first variation example of the method of manufacturing a display device in accordance with Embodiment 2 of the present disclosure.

FIG. 16 is a plan view illustrating a first variation example of the method of manufacturing the display device 100 in accordance with Embodiment 2 of the present disclosure.

FIG. 16 shows the plurality of predetermined pixel-formation portions 25 arranged in vertical stripes and the liquid-repellent bank 8 formed in spaces between the vertical stripes.

In the step shown in FIG. 16, one functional layer 1 is formed for each predetermined pixel-formation portion 25 for each vertical stripe, and a plurality of functional layers 1 are formed interconnected in the form of a single coating film 24, by applying the coating liquid 4 from above the plane shown in FIG. 16 (in the functional layer formation step). This enables reducing the size of obstacles in letting the remaining coating liquid 4 that does not constitute the functional layer 1 move out of the display area 91 of the display device 100, thereby facilitating the remaining coating liquid 4 to move out of the display area 91.

Figure 17:
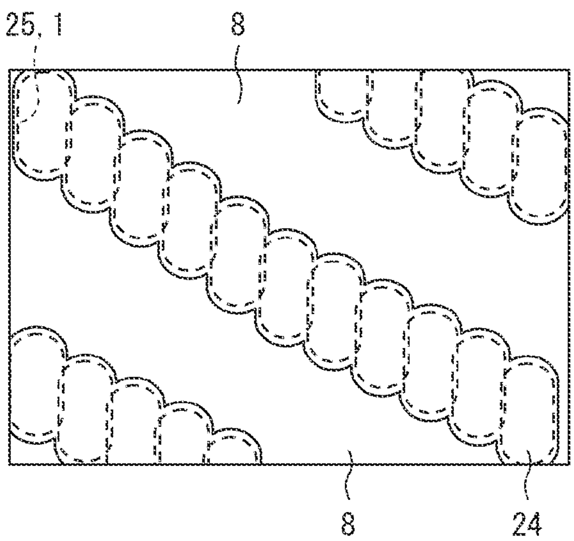
FIG. 17 is a plan view illustrating a second variation example of the method of manufacturing a display device in accordance with Embodiment 2 of the present disclosure.

FIG. 17 is a plan view illustrating a second variation example of the method of manufacturing the display device 100 in accordance with Embodiment 2 of the present disclosure.

FIG. 17 shows the plurality of predetermined pixel-formation portions 25 arranged in oblique stripes and the liquid-repellent bank 8 formed in spaces between the oblique stripes.

In the step shown in FIG. 17, one functional layer 1 is formed for each predetermined pixel-formation portion 25 for each oblique stripe, and a plurality of functional layers 1 are formed interconnected in the form of a single coating film 24, by applying the coating liquid 4 from above the plane shown in FIG. 17 (in the functional layer formation step). This enables reducing the size of obstacles in letting the remaining coating liquid 4 that does not constitute the functional layer 1 move out of the display area 91 of the display device 100, thereby facilitating the remaining coating liquid 4 to move out of the display area 91.

Figure 18:
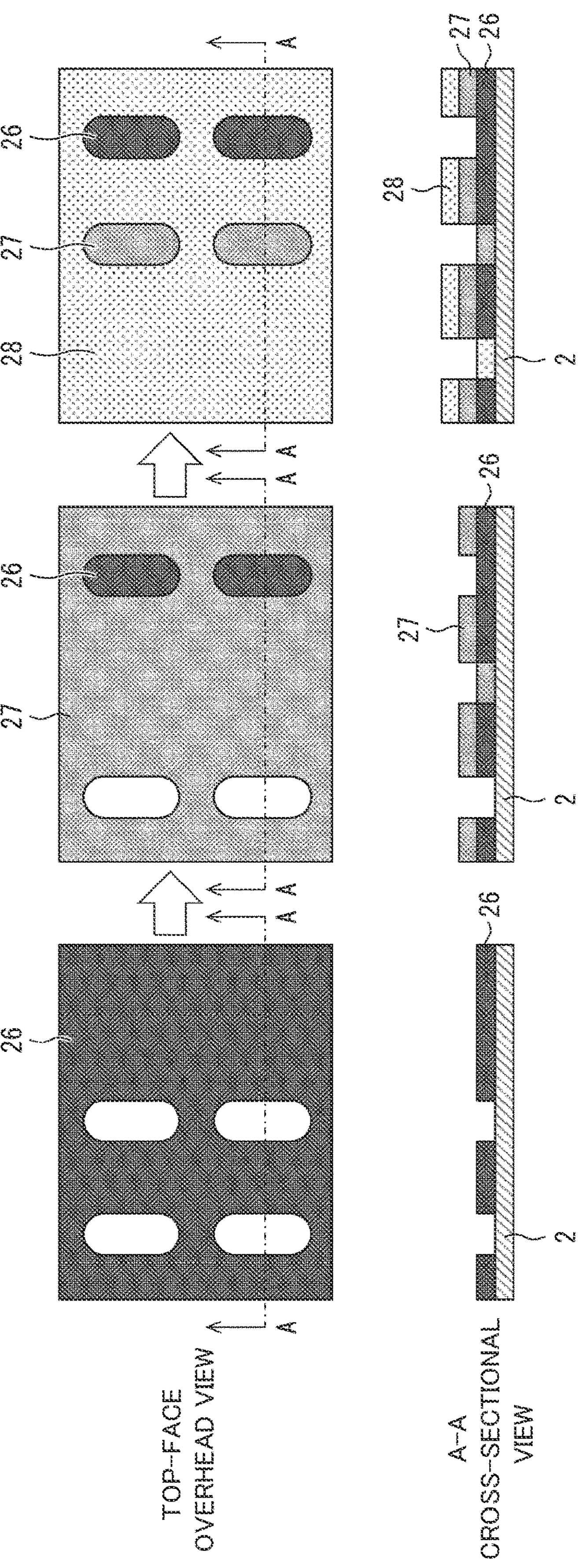
FIG. 18 is a set of top-face overhead views and A-A cross-sectional views of an example of the formation of a plurality of coating films from different materials.

FIG. 18 is a set of top-face overhead views and A-A cross-sectional views of an example of the formation of a plurality of coating films 24 from different materials.

As an example of the formation of a plurality of coating films 24 from different materials, a first coating film 26, a second coating film 27, and a third coating film 28 may be formed from different materials. The first coating film 26, the second coating film 27, and the third coating film 28 may be, for example, a film containing a red-light-emitting material, a film containing a blue-light-emitting material, and a film containing a green-light-emitting material respectively.

To form the plurality of coating films 24 from different materials, first, the first coating film 26 is formed as well as an area of the second coating film 27 where the functional layer 1 is to be provided and an area of the third coating film 28 where the functional layer 1 is to be provided. Subsequently, the second coating film 27 is formed as well as an area of the third coating film 28 where the functional layer 1 is to be provided. Finally, the third coating film 28 is formed.

Figure 19:
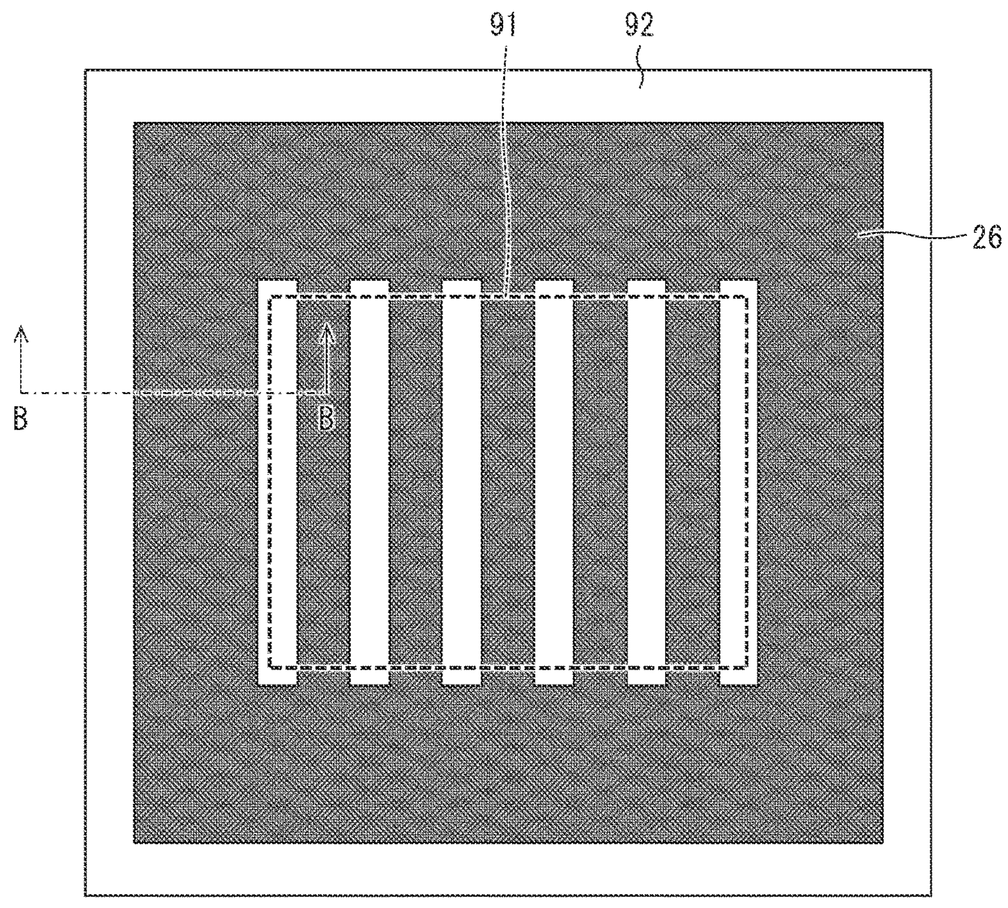
FIG. 19 is a plan view of a first and a second variation example of the formation of a plurality of coating films from different materials.
Figure 20:
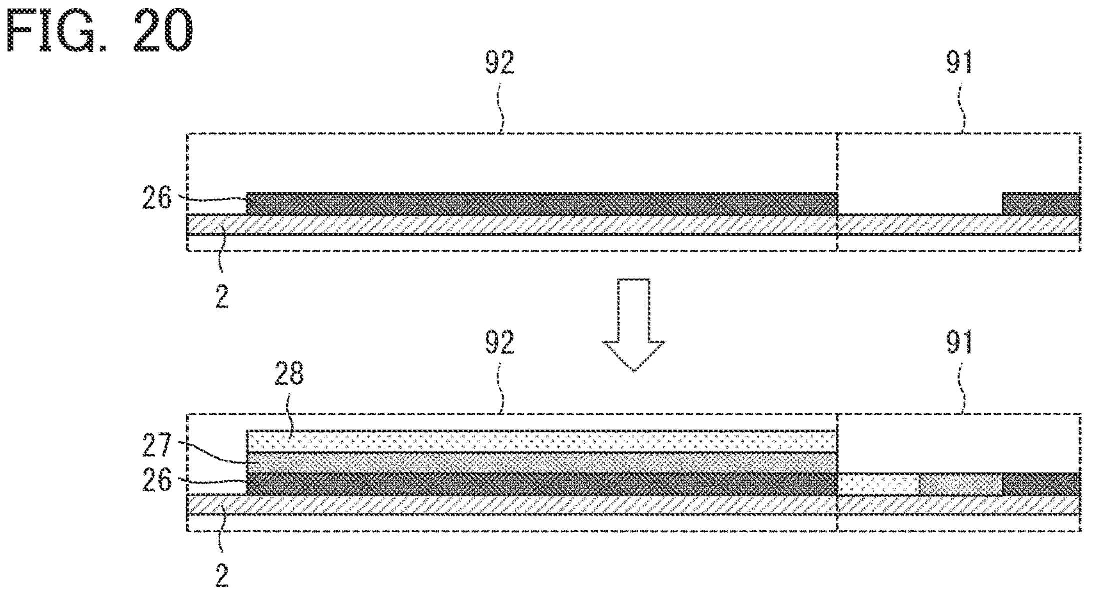
FIG. 20 is a set of cross-sectional views, taken along line B-B, of the first variation example of the formation of a plurality of coating films from different materials.
Figure 21:
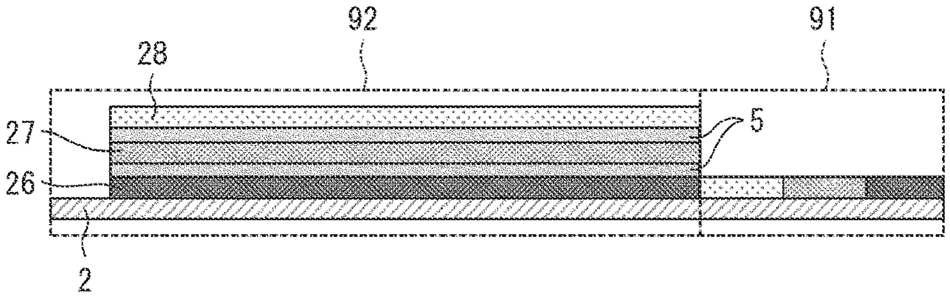
FIG. 21 is a cross-sectional view, taken along line B-B, of the second variation example of the formation of a plurality of coating films from different materials.

FIG. 19 is a plan view of a first and a second variation example of the formation of the plurality of coating films 24 from different materials. FIG. 20 is a set of cross-sectional views, taken along line B-B, of the first variation example of the formation of the plurality of coating films 24 from different materials. FIG. 21 is a cross-sectional view, taken along line B-B, of the second variation example of the formation of the plurality of coating films 24 from different materials.

FIG. 19 shows that the first coating film 26 is formed like vertical stripes in the display area 91 and formed in the substantially entire area in the non-display area 92, except for the periphery of the non-display area 92.

Referring to FIG. 20, as a result of the formation of the plurality of coating films 24 from different materials, the first coating film 26, the second coating film 27, and the third coating film 28 are stacked in this order in the non-display area 92.

Specifically, the layered structure of the first coating film 26, the second coating film 27, and the third coating film 28 is formed as follows. To provide the functional layer 1 in the form of the first coating film 26, the remaining coating liquid 4 that does not contribute to the formation of this functional layer 1 is guided outside the display area 91 to form the first coating film 26 in the non-display area 92. To provide the functional layer 1 in the form of the second coating film 27, the remaining coating liquid 4 that does not contribute to the formation of this functional layer 1 is guided outside the display area 91 to form the second coating film 27 on the first coating film 26 in the non-display area 92. To provide the functional layer 1 in the form of the third coating film 28, the remaining coating liquid 4 that does not contribute to the formation of this functional layer 1 is guided outside the display area 91 to form the third coating film 28 on the second coating film 27 in the non-display area 92 (in the functional layer formation step).

Referring to FIG. 21, the resist layer 5 may be provided between the first coating film 26 and the second coating film 27 in the non-display area 92, in addition to the example shown in FIG. 20. This structure enables preventing the functional layer 1 from emitting light of a mixed color due to the dissolution of the first coating film 26 in the non-display area 92.

Referring to FIG. 21, the resist layer 5 may be provided between the second coating film 27 and the third coating film 28 in the non-display area 92 in addition to the example shown in FIG. 20. This structure enables preventing the functional layer 1 from emitting light of a mixed color due to the dissolution of the second coating film 27 in the non-display area 92.

The examples shown in FIG. 20 and FIG. 21 can be described as examples where in the functional layer formation step, the remaining coating liquid 4 that does not contribute to the formation of the functional layer 1 is guided outside the display area 91 where the display device 100 produces a display (in other words, guided to the non-display area 92). In so doing, the first coating film 26, the second coating film 27, or the third coating film 28 is preferably not provided in those portions of the non-display area 92 that are brought into contact with an upper electrode.

Embodiment 3

FIGS. 22 to 26 are plan views illustrating a method of manufacturing a display device 100 in accordance with Embodiment 3 of the present disclosure.

A bar 29 is used to apply the coating liquid 4 in the steps shown in FIGS. 22 to 26. The coating liquid 4 is applied using the bar 29 in a direction 30 that is from the top toward the bottom in each of FIGS. 22 to 26.

The steps shown in FIGS. 22 to 26 can be described as falling in the category of the functional layer formation step. Here, grooves 31 to 33 are formed by the liquid-repellent bank 8 sequentially from upstream with respect to the direction 30 in advance in the liquid-repelling bank formation step prior to the step shown in FIG. 22. A plurality of grooves 31 and a plurality of grooves 33 are provided like vertical stripes. The groove 32 is provided in a direction substantially perpendicular to the application direction of the coating liquid 4 in the functional layer formation step, in other words, in a direction 34 substantially perpendicular to the direction 30. Specifically, the groove 32 has an opening shaped like a rectangle with the longer sides thereof extending in the direction 34.

Figure 23:
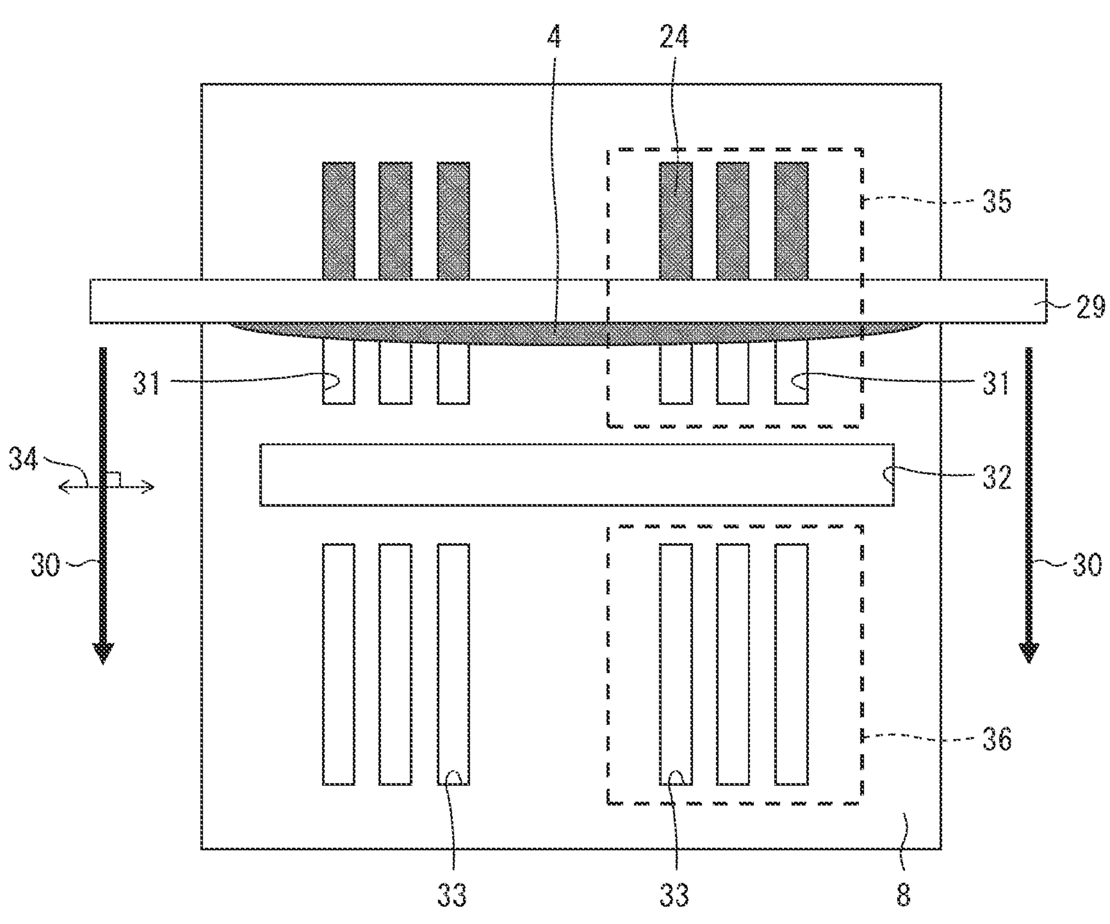
FIG. 23 is a plan view illustrating the method of manufacturing a display device in accordance with Embodiment 3 of the present disclosure.

In the step shown in FIG. 23, the coating liquid 4 is applied to the inner side of each groove 31 to form the coating film 24. For example, a set 35 of those three grooves 31 that are arranged side by side with narrow pitches corresponds to a single cell in the display area 91. Here, the coating liquid 4 adhering to the bar 29 can be distributed in an irregular manner because, for example, the coating liquid 4 adhering to the bar 29 bumps onto the inner wall of the groove 31.

Figure 24:
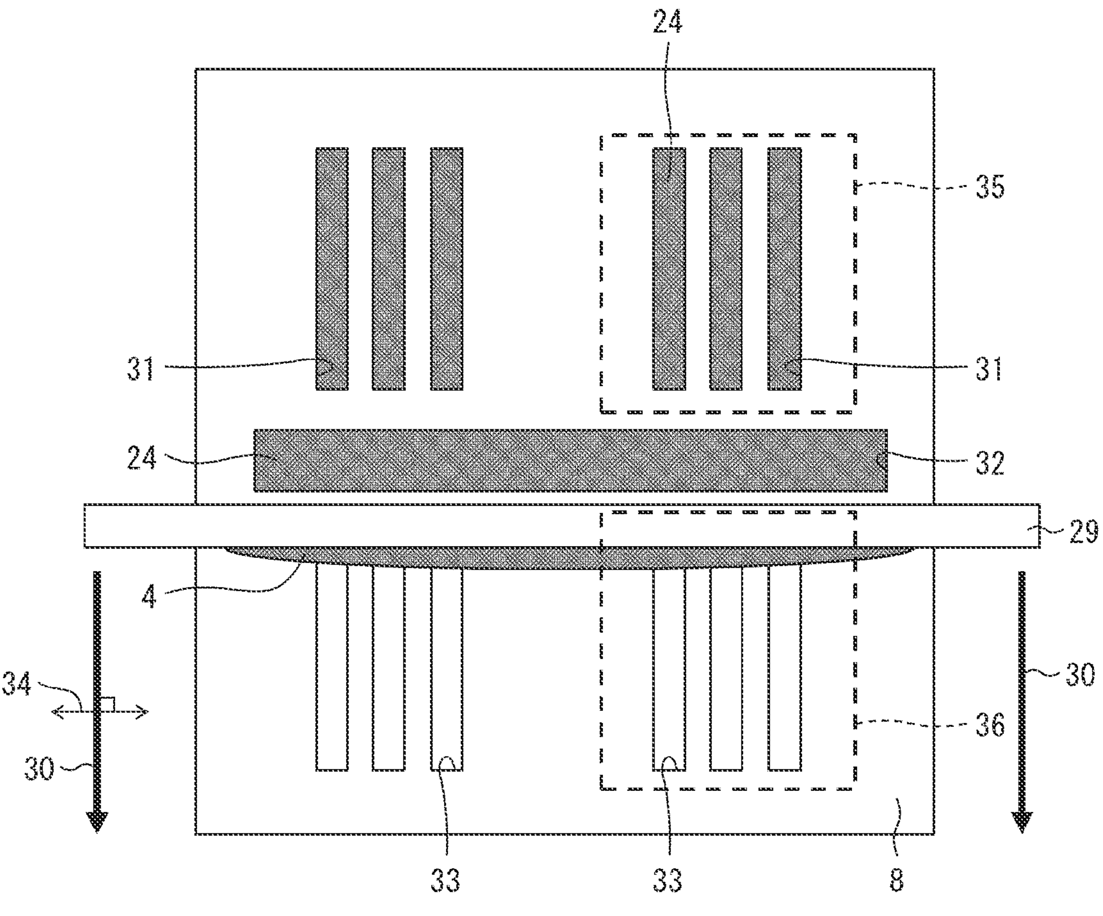
FIG. 24 is a plan view illustrating the method of manufacturing a display device in accordance with Embodiment 3 of the present disclosure.

In the step shown in FIG. 24, the coating liquid 4 is applied to the inner side of the groove 32. The irregular distribution of the coating liquid 4 adhering to the bar 29 can be amended by applying the coating liquid 4 to the inner side of the groove 32 in the direction 30 using the bar 29.

Figure 25:
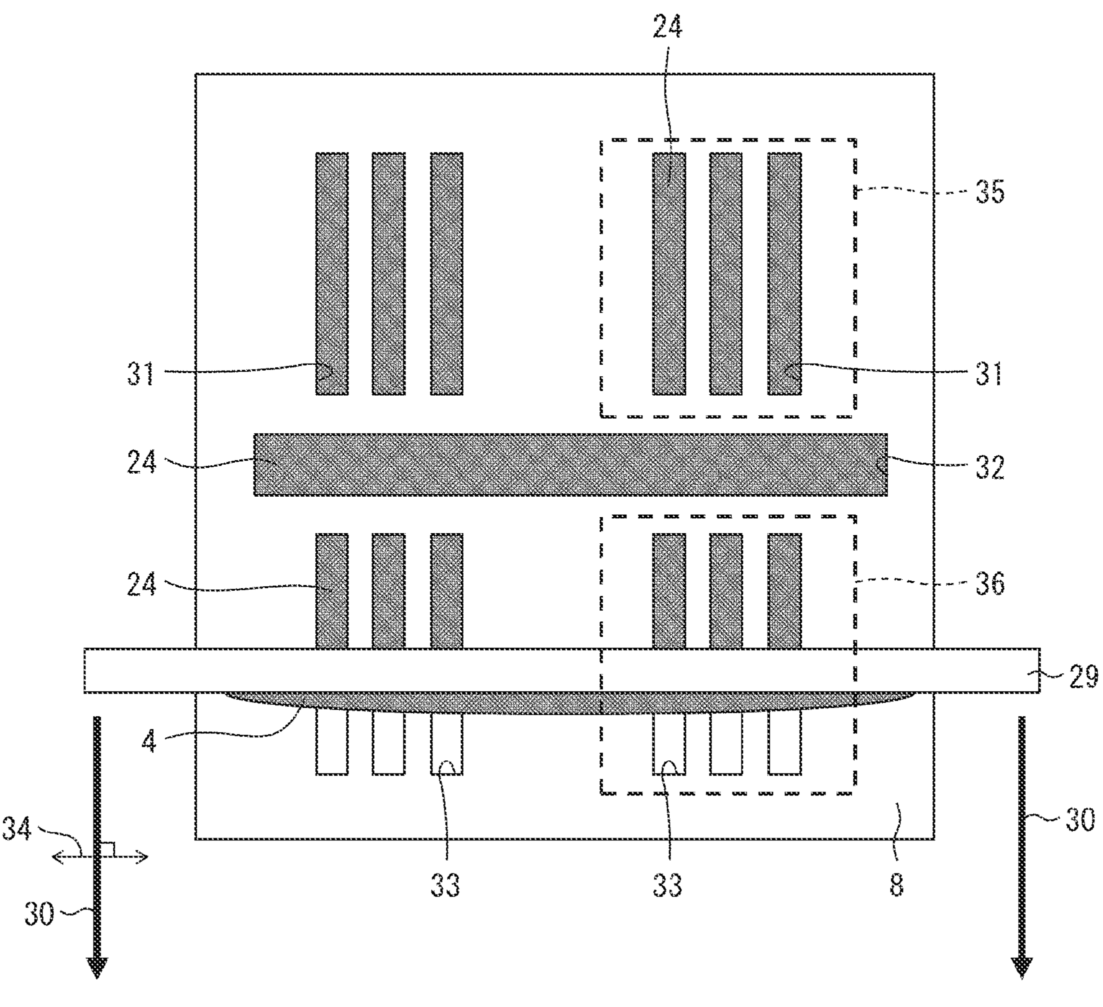
FIG. 25 is a plan view illustrating the method of manufacturing a display device in accordance with Embodiment 3 of the present disclosure.
Figure 26:
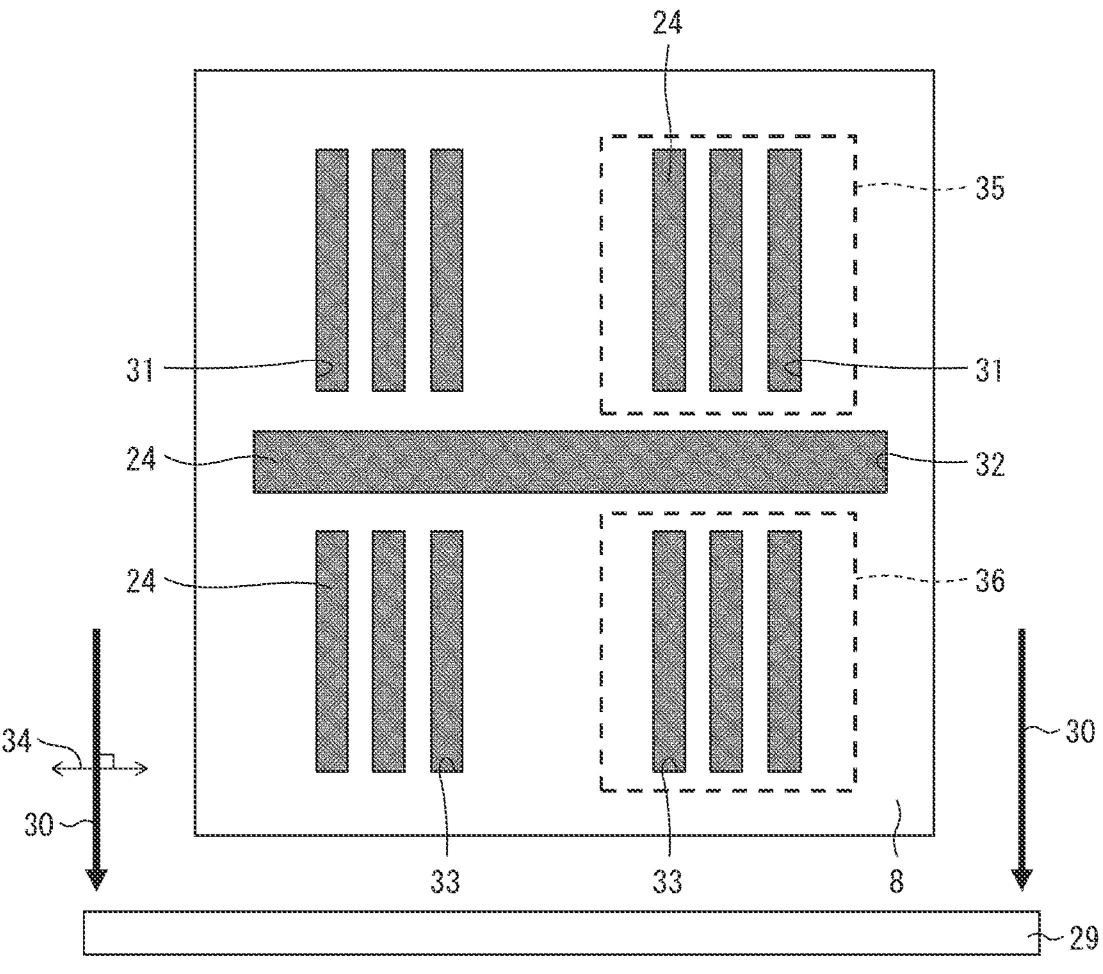
FIG. 26 is a plan view illustrating the method of manufacturing a display device in accordance with Embodiment 3 of the present disclosure.

In the step shown in FIG. 25, the coating liquid 4 is applied to the inner side of each groove 33 to form the coating film 24. For example, a set 36 of those three grooves 33 that are arranged side by side with narrow pitches corresponds to a single cell in the display area 91. The step shown in FIG. 24 enables restraining the non-uniform application of the coating liquid 4 on the inner side of each groove 33. FIG. 26 shows a condition where the step shown in FIG. 25 is completed.

FIGS. 27 to 30 are plan views illustrating various variation examples of the method of manufacturing the display device 100 in accordance with Embodiment 3 of the present disclosure.

Figure 22:
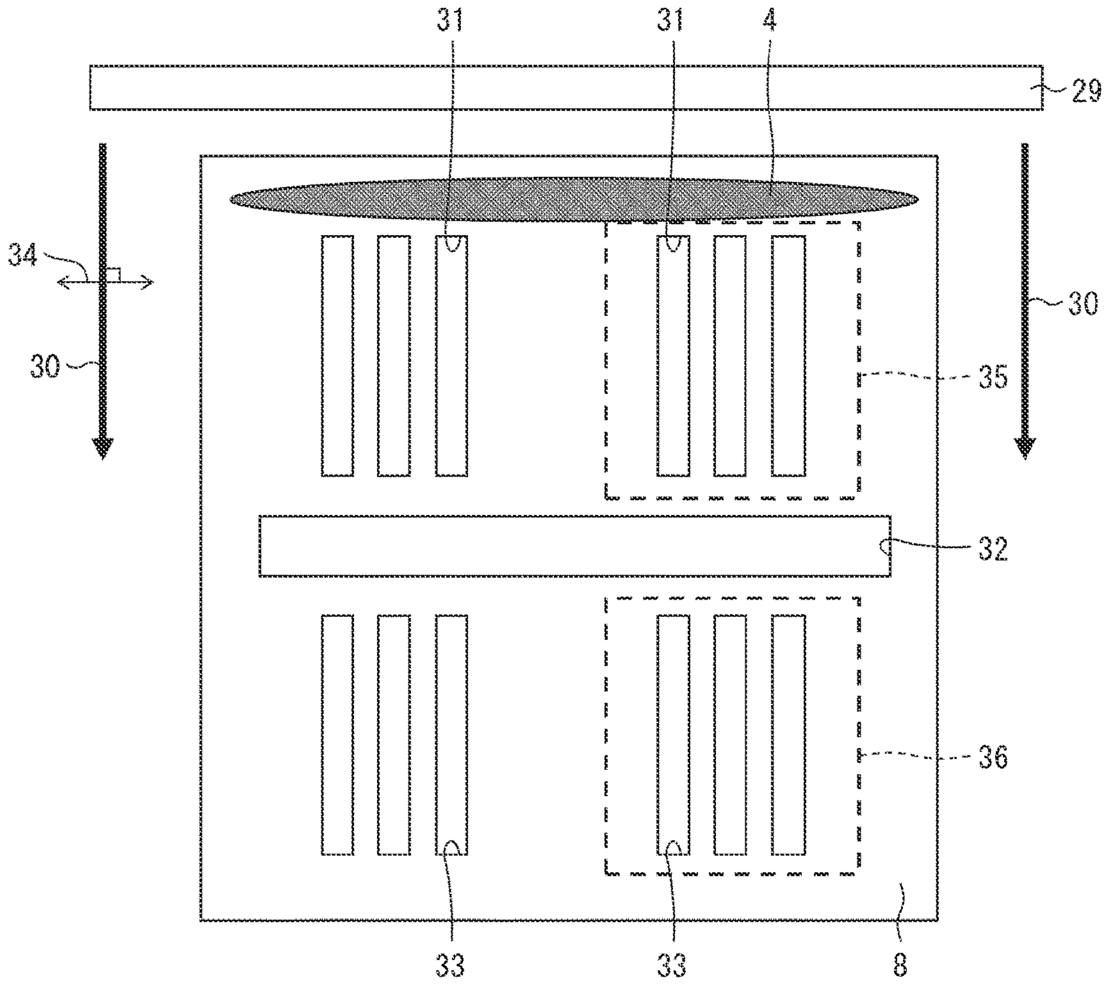
FIG. 22 is a plan view illustrating a method of manufacturing a display device in accordance with Embodiment 3 of the present disclosure.
Figure 27:
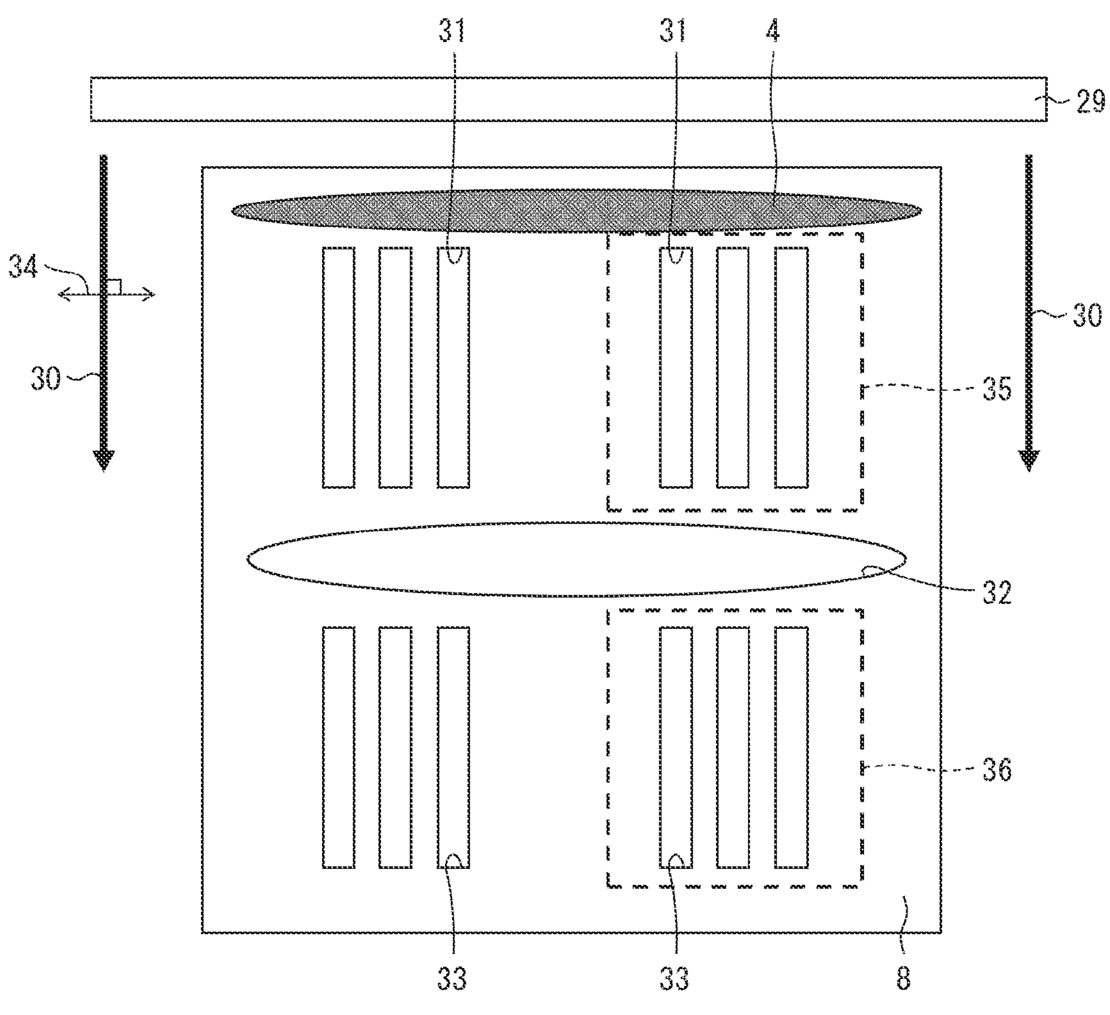
FIG. 27 is a plan view illustrating various variation examples of the method of manufacturing a display device in accordance with Embodiment 3 of the present disclosure.

Referring to FIG. 27, the groove 32 may have an opening shaped like an ellipse with the longer axis thereof extending in the direction 34, instead of the rectangle shown in FIG. 22.

Figure 28:
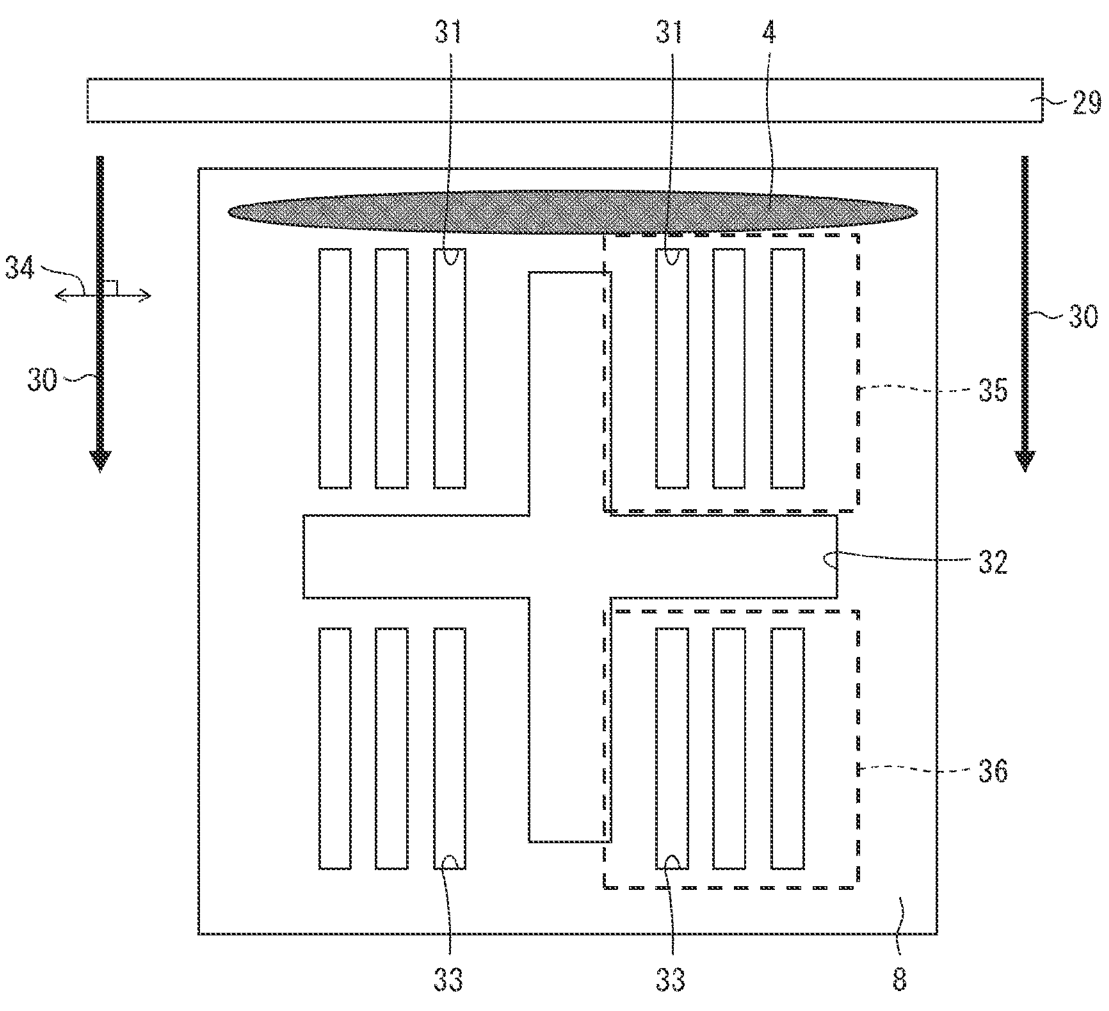
FIG. 28 is a plan view illustrating various variation examples of the method of manufacturing a display device in accordance with Embodiment 3 of the present disclosure.

Referring to FIG. 28, the groove 32 may have an opening shaped like a cross with a long piece extending in the direction 30 and another long piece extending in the direction 34, instead of the rectangle shown in FIG. 22.

Figure 29:
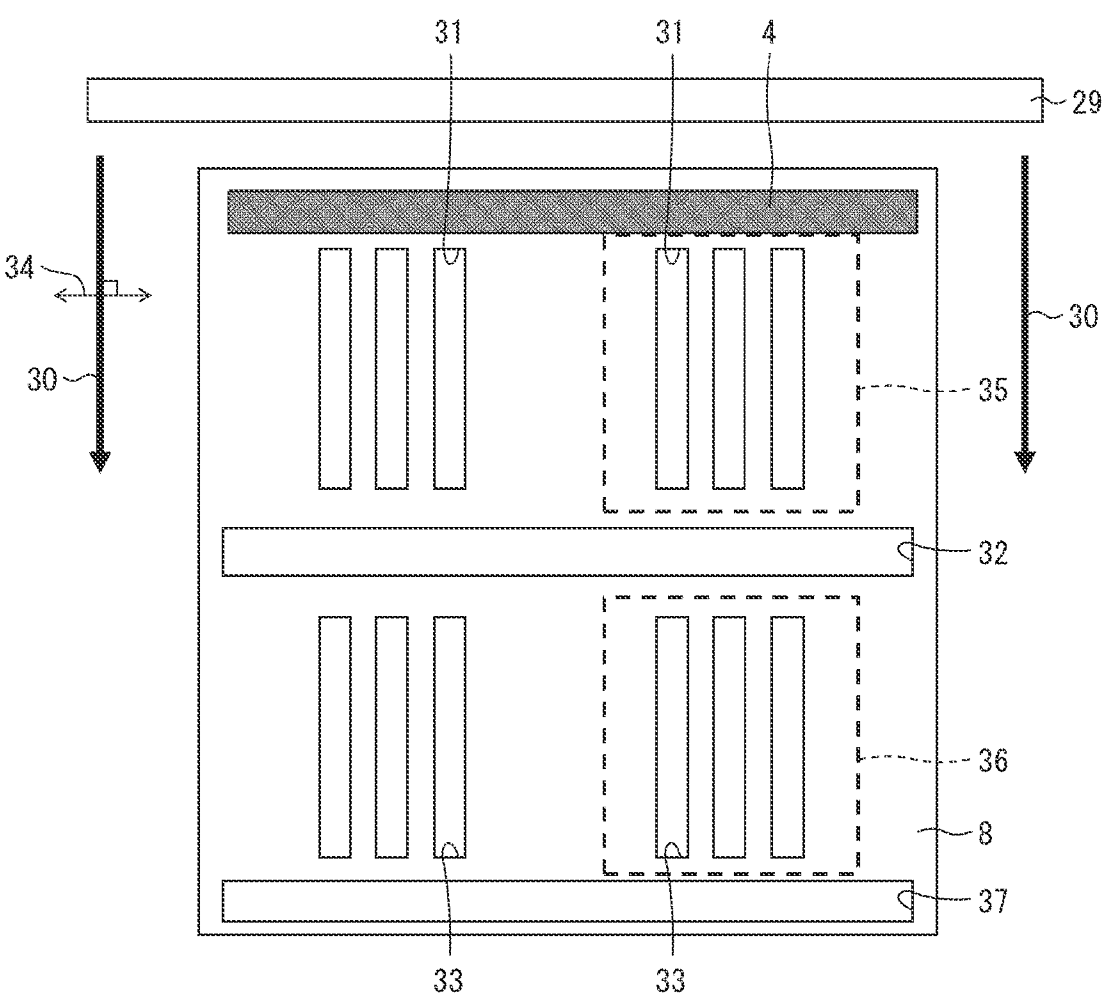
FIG. 29 is a plan view illustrating various variation examples of the method of manufacturing a display device in accordance with Embodiment 3 of the present disclosure.

Referring to FIG. 29, a groove 37 may be further provided downstream to the grooves 33 with respect to the direction 30. The groove 37 is provided in the direction 34. Specifically, the groove 37 has an opening shaped like a rectangle with the longer sides thereof extending in the direction 34. The groove 37 may have an opening shaped like an ellipse with the longer axis thereof extending in the direction 34.

Figure 30:
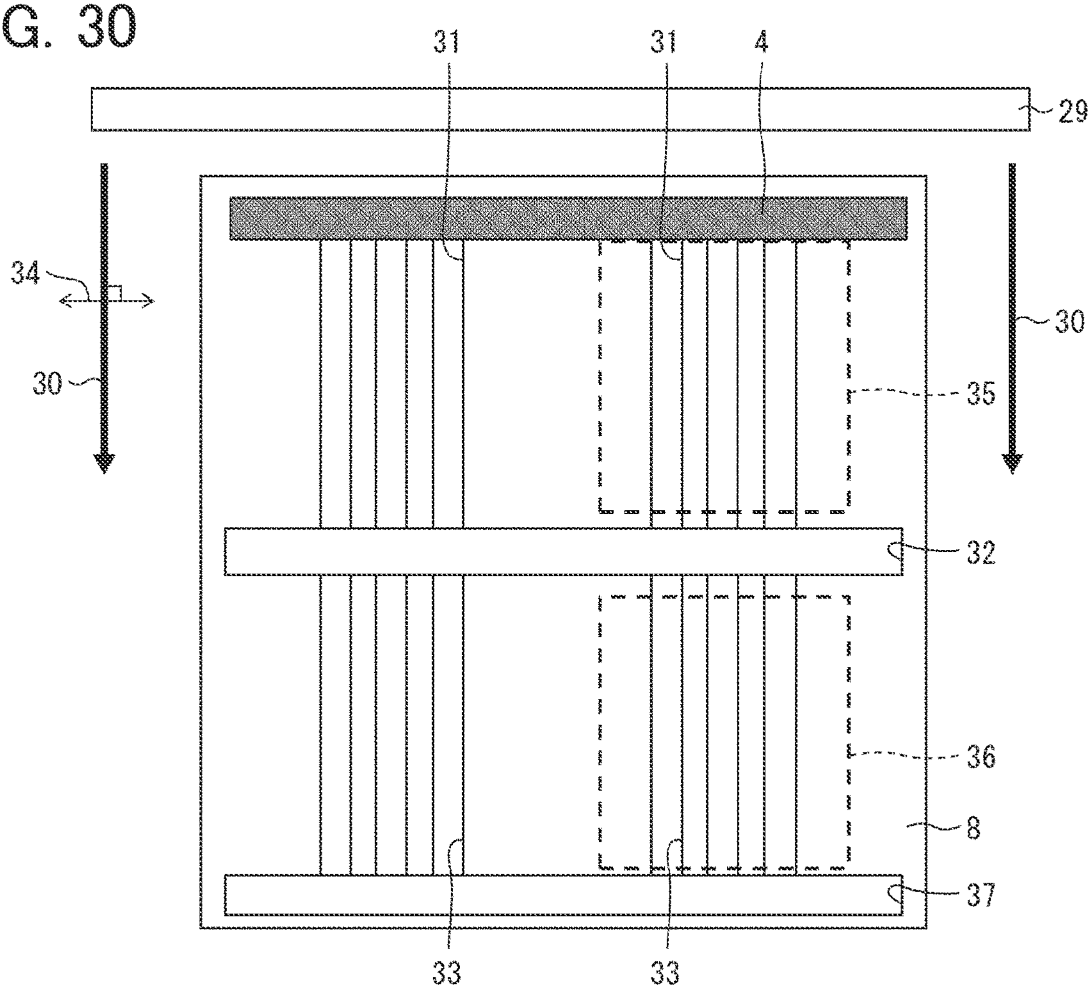
FIG. 30 is a plan view illustrating various variation examples of the method of manufacturing a display device in accordance with Embodiment 3 of the present disclosure.

Referring to FIG. 30, the grooves 31 and the groove 32 may be continuous as opposed to FIG. 29. Referring to FIG. 30, the groove 32 and the grooves 33 may be continuous as opposed to FIG. 29. Referring to FIG. 30, the grooves 33 and the groove 37 may be continuous as opposed to FIG. 29.

Another groove may be provided further upstream to the grooves 31 with respect to the direction 30. This groove may have the same opening shape as the groove 37. In addition, the groove may be continuous with the grooves 31.

To sum up the description above, the inner wall of the groove 32 extending substantially in the direction 34 is preferably either planar or gently curved. It is not preferred if the inner wall has small lumps and dents. Most preferably, the inner wall is planar, which suitably enables restraining a part of the coating liquid 4 adhering to the bar 29 from being undesirably applied to the inner side of the groove 33 before the other parts. The inner wall of the groove 37 extending substantially in the direction 34 is also preferably either planar or gently curved. It is not preferred if the inner wall has small lumps and dents.

Embodiment 4

Figure 31:
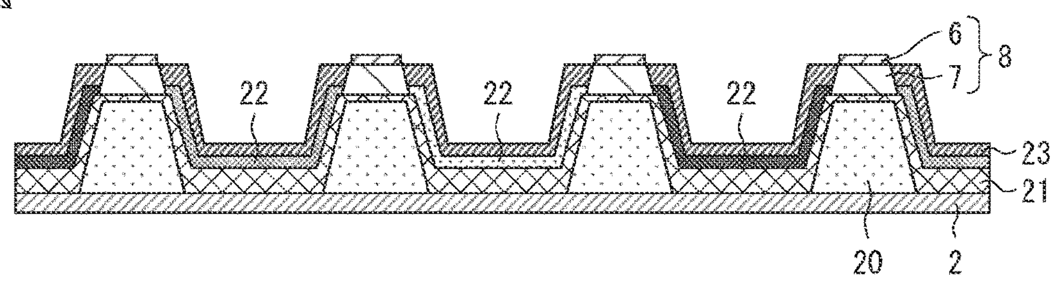
FIG. 31 is an illustration of an example of a cross-sectional structure of a display device in accordance with Embodiment 4 of the present disclosure.

FIG. 31 is an illustration of an example of a cross-sectional structure of a display device 100 in accordance with Embodiment 4 of the present disclosure.

Referring to FIG. 31, the display device 100 may include a liquid-repellent bank 8 containing a liquid-repelling material on a bank 20 provided in order to electrically isolate and thus separate adjacent pixels, as well as the structure shown in FIG. 13. In other words, the liquid-repellent bank 8 may be provided on the bank 20 provided in advance in order to electrically isolate and thus separate adjacent pixels in the liquid-repelling bank formation step. Although no liquid-repellent bank 8 is provided on the side face of the bank 20 in the display device 100 shown in FIG. 31, the liquid-repellent bank 8 may be provided on a side face of the bank 20. This structure enables separating the overlying layer 23 for each light-emitting layer 22, in other words, for each pixel, thereby restraining leak current and improving the properties of the display device 100.

Note that in the example shown in FIG. 31, the bank 20 itself may be omitted. When the bank 20 is omitted, the area of the bank 20 is replaced by, for example, the liquid-repellent bank 8.

Figure 32:
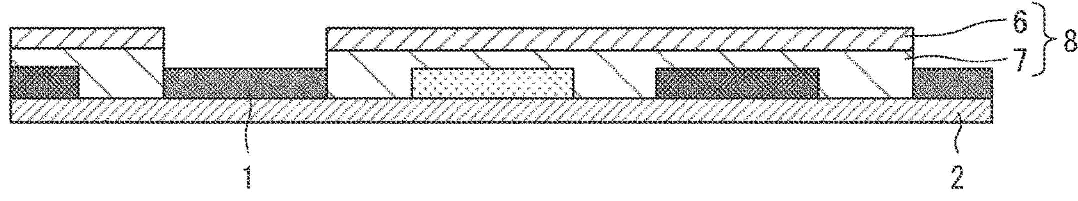
FIG. 32 is a cross-sectional view illustrating a method of manufacturing a display device in accordance with Embodiment 4 of the present disclosure.
Figure 33:
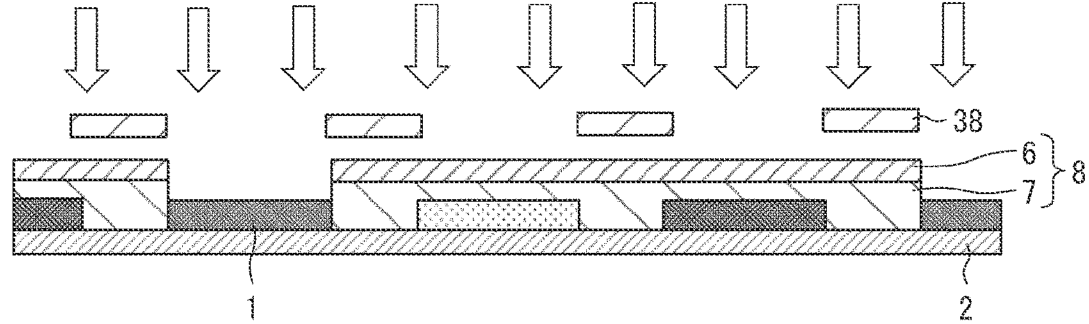
FIG. 33 is a cross-sectional view illustrating the method of manufacturing a display device in accordance with Embodiment 4 of the present disclosure.
Figure 34:
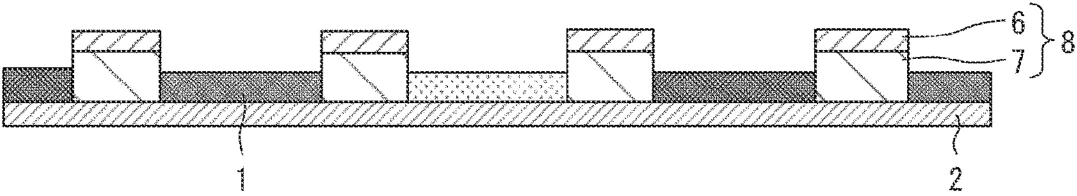
FIG. 34 is a cross-sectional view illustrating the method of manufacturing a display device in accordance with Embodiment 4 of the present disclosure.

FIGS. 32 to 34 are cross-sectional views illustrating a method of manufacturing the display device 100 in accordance with Embodiment 4 of the present disclosure.

In the step shown in FIG. 32, the coating liquid 4 is applied to a region including the area surrounded by the liquid-repellent bank 8 to form the functional layer 1 in the area (functional layer formation step).

The steps shown in FIGS. 33 to 34, which follow the functional layer formation step, correspond to the removal step in accordance with the present disclosure. The following will describe the step shown in FIG. 33 and the step shown in FIG. 34.

In the step shown in FIG. 33, the liquid-repellent bank 8 between two adjacent functional layers 1 is covered with a photomask 38, and the liquid-repellent bank on each functional layer 1 8 is exposed to light.

In the step shown in FIG. 34, the exposed liquid-repellent bank 8 (part of the liquid-repellent bank) is removed by, for example, development.

Embodiment 5

Figure 35:
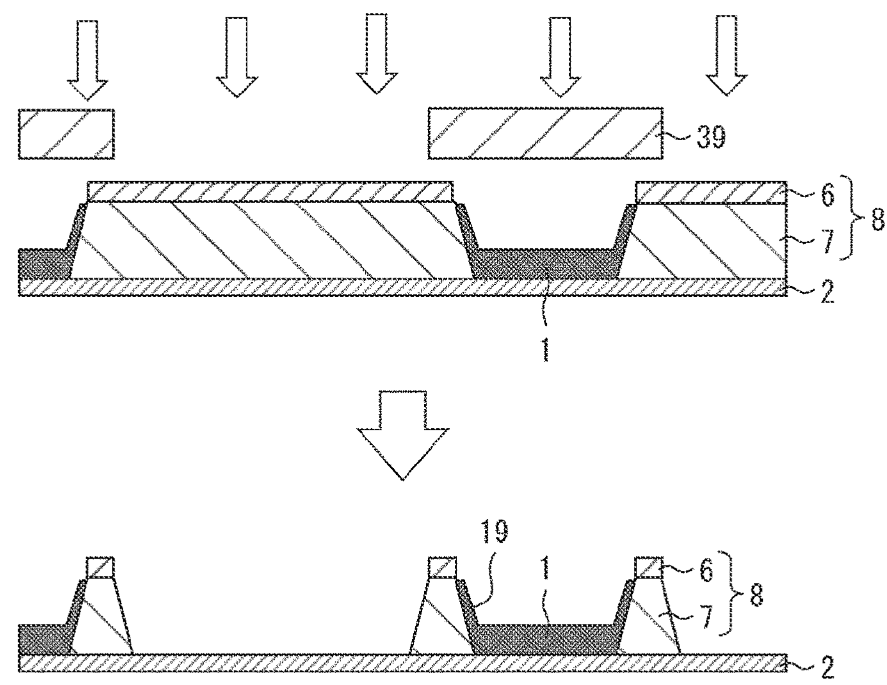
FIG. 35 is a set of cross-sectional views illustrating a method of manufacturing a display device in accordance with Embodiment 5 of the present disclosure.

FIG. 35 is a set of cross-sectional views illustrating a method of manufacturing a display device 100 in accordance with Embodiment 5 of the present disclosure.

In the step shown in FIG. 35, in the removal step, the functional layer 1 and the liquid-repellent bank 8 surrounding the functional layer 1 are covered with a photomask 39, the liquid-repellent bank 8, except for the periphery of the functional layer 1, is exposed to light, and thereafter the exposed liquid-repellent bank 8 (part of the liquid-repellent bank) is removed by, for example, development. In the liquid-repellent bank 8, the liquid-repellent layer 6 is not provided on the side face of the photosensitive layer 7.

This structure, when burrs 19 are formed on the functional layer 1, enables the liquid-repellent bank 8 to support the burrs 19 sideways, thereby preventing lift-off of the functional layer 1.

Figure 36:
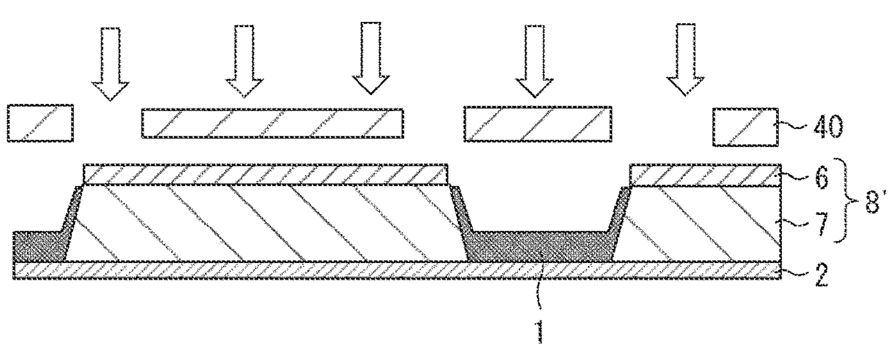
FIG. 36 is a cross-sectional view illustrating a variation example of the method of manufacturing a display device in accordance with Embodiment 5 of the present disclosure.
Figure 37:
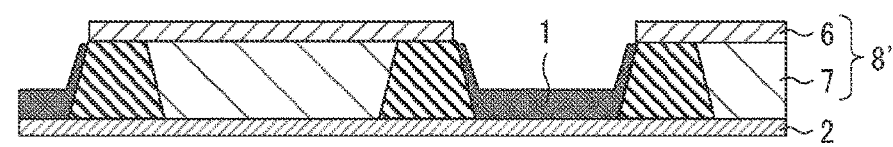
FIG. 37 is a cross-sectional view illustrating a variation example of the method of manufacturing a display device in accordance with Embodiment 5 of the present disclosure.
Figure 38:
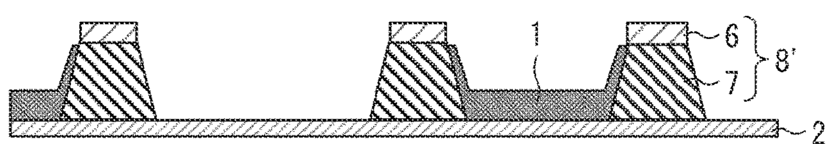
FIG. 38 is a cross-sectional view illustrating a variation example of the method of manufacturing a display device in accordance with Embodiment 5 of the present disclosure.

FIGS. 36 to 38 are cross-sectional views illustrating variation examples of the method of manufacturing the display device 100 in accordance with Embodiment 5 of the present disclosure.

In the steps shown in FIGS. 36 to 38, a liquid-repellent bank 8' is used in place of the liquid-repellent bank 8. The exposed areas of the liquid-repellent bank 8 can be removed, whereas the exposed areas of the liquid-repellent bank 8' can be retained (may not be removed). The liquid-repellent bank 8' has otherwise the same properties as the liquid-repellent bank 8.

The steps shown in FIGS. 36 to 38, which follow the functional layer formation step, correspond to the removal step in accordance with the present disclosure. The following will describe the step shown in FIG. 36, the step shown in FIG. 37, and the step shown in FIG. 38.

In the step shown in FIG. 36, the functional layer 1 and the liquid-repellent bank 8', except for the periphery of the functional layer 1, are covered with a photomask 40, and the liquid-repellent bank 8' surrounding the functional layer 1 is exposed to light.

In the step shown in FIG. 37, the liquid-repellent bank 8' is heated to cure the exposed liquid-repellent bank 8'.

In the step shown in FIG. 38, the non-exposed liquid-repellent bank 8' (part of the liquid-repellent bank) is removed by, for example, development.

The development in the step shown in FIG. 35 is generally a lift-off development. In particular, when an organic-solvent development solution is used in the lift-off development, it may not be easy in some cases to leave the liquid-repellent bank 8 only in desirable locations. The development in the steps shown in FIGS. 36 to 38 can readily leave the liquid-repellent bank 8' only in desirable locations because the development is generally a solvent development.

Embodiment 6

Figure 39:
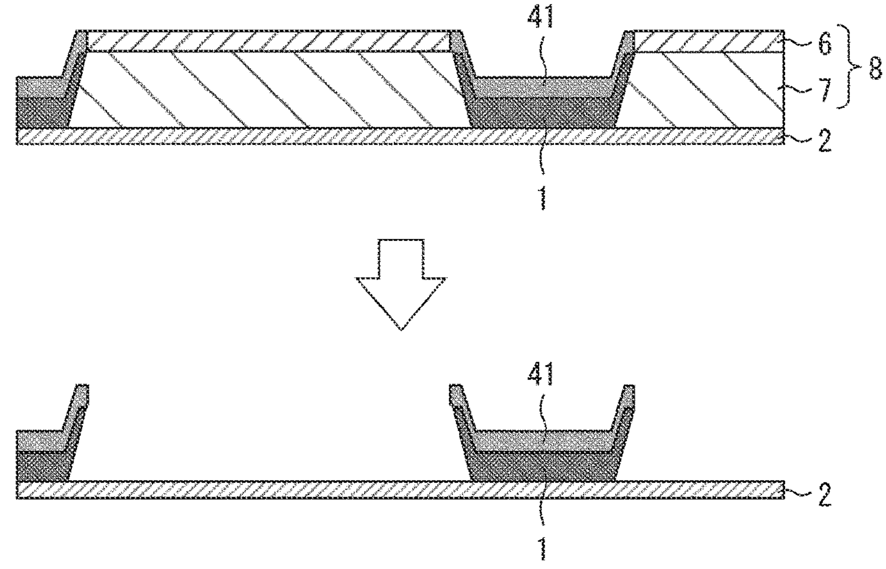
FIG. 39 is a set of cross-sectional views illustrating a method of manufacturing a display device in accordance with Embodiment 6 of the present disclosure.

FIG. 39 is a set of cross-sectional views illustrating a method of manufacturing a display device 100 in accordance with Embodiment 6 of the present disclosure.

In the step shown in FIG. 39, in the functional layer formation step, a layer 41 other than the functional layer 1 is formed on the functional layer 1.

No excess film is formed on the liquid-repellent bank 8, or if any, the film is thin. Therefore, even if the film formed in the functional layer formation step has a sum thickness as large as, for example, 50 nm or larger, the development solution 16 can readily reach the photosensitive layer 7 in the subsequent removal step, thereby restraining insufficient removal of the liquid-repellent bank 8.

Embodiment 7

FIGS. 40 to 48 are cross-sectional views illustrating a method of manufacturing a display device 100 in accordance with Embodiment 7 of the present disclosure.

Figure 40:
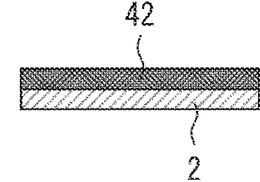
FIG. 40 is a cross-sectional view illustrating a method of manufacturing a display device in accordance with Embodiment 7 of the present disclosure.

In the step shown in FIG. 40, a first functional layer 42 is formed on the substrate 2 (first step).

Figure 41:
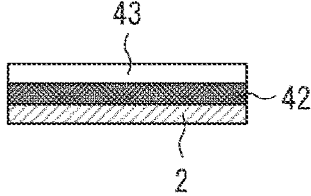
FIG. 41 is a cross-sectional view illustrating the method of manufacturing a display device in accordance with Embodiment 7 of the present disclosure.

In the step shown in FIG. 41, a first resist layer 43 is formed on the first functional layer 42. The first resist layer 43 contains a liquid-repelling material similarly to the resist layer 5 (second step).

Figure 42:
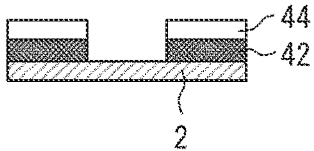
FIG. 42 is a cross-sectional view illustrating the method of manufacturing a display device in accordance with Embodiment 7 of the present disclosure.

In the step shown in FIG. 42, parts of the first resist layer 43 are exposed to light, and these parts of the first resist layer 43 and the first functional layer 42 thereunder are removed. Hence, a first liquid-repellent bank 44 is formed from the first resist layer 43 (third step).

Figure 43:
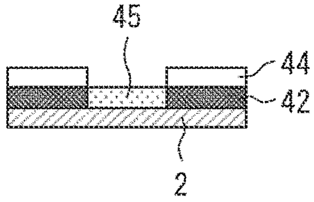
FIG. 43 is a cross-sectional view illustrating the method of manufacturing a display device in accordance with Embodiment 7 of the present disclosure.

In the step shown in FIG. 43, a second functional layer 45 is formed in the areas where the first functional layer 42 is removed in the third step (fourth step).

Figure 44:
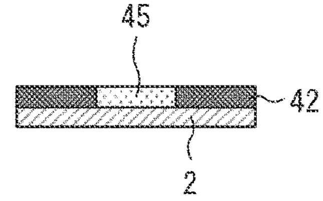
FIG. 44 is a cross-sectional view illustrating the method of manufacturing a display device in accordance with Embodiment 7 of the present disclosure.

In the step shown in FIG. 44, the first resist layer 43 remaining after the third step is removed (fifth step).

Figure 45:
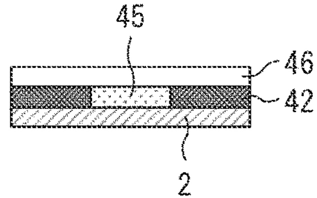
FIG. 45 is a cross-sectional view illustrating the method of manufacturing a display device in accordance with Embodiment 7 of the present disclosure.

In the step shown in FIG. 45, a second resist layer 46 is formed on the first functional layer 42 and on the second functional layer 45. The second resist layer 46 contains a liquid-repelling material similarly to the resist layer 5 (sixth step).

Figure 46:
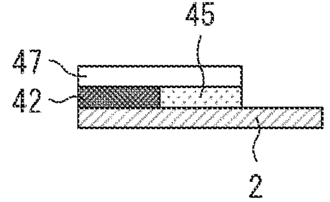
FIG. 46 is a cross-sectional view illustrating the method of manufacturing a display device in accordance with Embodiment 7 of the present disclosure.

In the step shown in FIG. 46, those parts of the second resist layer 46 that are located on the first functional layer 42 are exposed to light, and these parts of the second resist layer 46 and the first functional layer 42 thereunder are removed. Hence, a second liquid-repellent bank 47 is formed from the second resist layer 46, (seventh step).

Figure 47:
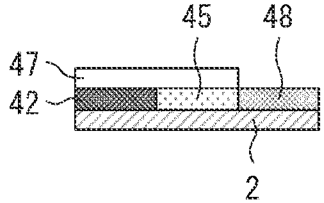
FIG. 47 is a cross-sectional view illustrating the method of manufacturing a display device in accordance with Embodiment 7 of the present disclosure.

In the step shown in FIG. 47, a third functional layer 48 is formed in the areas where the first functional layer 42 is removed in the seventh step (eighth step).

Figure 48:
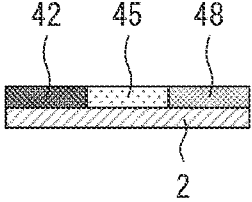
FIG. 48 is a cross-sectional view illustrating the method of manufacturing a display device in accordance with Embodiment 7 of the present disclosure.

In the step shown in FIG. 48, the second resist layer 46 remaining after the seventh step is removed.

This structure enables reducing the amount of residues produced due to the insufficient removal of the first functional layer 42 and/or the second functional layer 45. The structure therefore enables preventing the third functional layer 48 from emitting light of a mixed color.

Additionally, the category of the method of manufacturing the display device 100 in accordance with Embodiment 7 of the present disclosure requires no etching, thereby allowing for many options in selecting a development solution and selecting a removal method for the first functional layer 42 and the second functional layer 45.

Figure 49:
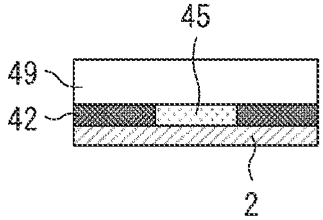
FIG. 49 is a cross-sectional view illustrating a variation example of the method of manufacturing a display device in accordance with Embodiment 7 of the present disclosure.
Figure 50:
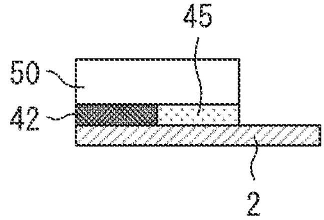
FIG. 50 is a cross-sectional view illustrating a variation example of the method of manufacturing a display device in accordance with Embodiment 7 of the present disclosure.
Figure 51:
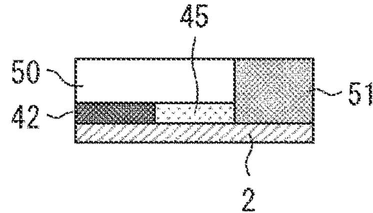
FIG. 51 is a cross-sectional view illustrating a variation example of the method of manufacturing a display device in accordance with Embodiment 7 of the present disclosure.

FIGS. 49 to 51 are cross-sectional views illustrating a variation example of the method of manufacturing the display device 100 in accordance with Embodiment 7 of the present disclosure. The steps shown in FIGS. 49 to 51 are variation examples of the steps shown in FIGS. 45 to 47 respectively.

In the step shown in FIG. 49, a second resist layer 49 is formed on the first functional layer 42 and on the second functional layer 45. The second resist layer 49 contains a liquid-repelling material similarly to the resist layer 5 and absorbs the light emitted by a transparent, third functional layer 51 (detailed later) (sixth step).

In the step shown in FIG. 50, those parts of the second resist layer 49 located on the first functional layer 42 are exposed to light, and these parts of the second resist layer 49 and the first functional layer 42 thereunder are removed. Hence, a second liquid-repellent bank 50 is formed from the second resist layer 49 (seventh step).

In the step shown in FIG. 51, the third functional layer 51 is formed in the areas where the first functional layer 42 is removed in the seventh step. The third functional layer 51 is a wavelength conversion member that absorbs and scatters the light emitted by the first functional layer 42 and/or the second functional layer 45 to convert the wavelength of the light (eighth step). Note that the second liquid-repellent bank 50 is retained after the step shown in FIG. 51.

The first functional layer 42, the second functional layer 45, and the third functional layer 51 are formed so as not to overlap and not to leave any gaps therebetween. Hence, the light that should be absorbed by the third functional layer 51 can be prevented from leaking.

At least one of the first resist layer 43, the second resist layer 46, and the second resist layer 49 is formed on each of the first functional layer 42 and the second functional layer 45. Therefore, when another layer is stacked on each of the first functional layer 42 and the second functional layer 45, the liquid-repelling material is present between the other layer and each of the first functional layer 42 and the second functional layer 45.

Meanwhile, none of the first resist layer 43, the second resist layer 46, and the second resist layer 49 is formed on the third functional layer 48 and the third functional layer 51. Therefore, when another layer is stacked on each of the third functional layer 48 and the third functional layer 51, no liquid-repelling material is present between the other layer and each of the third functional layer 48 and the third functional layer 51. In other words, each of the third functional layer 48 and the third functional layer 51 is an example of a liquid-repelling-material-missing functional layer in accordance with the present disclosure.

Embodiment 8

Figure 52:
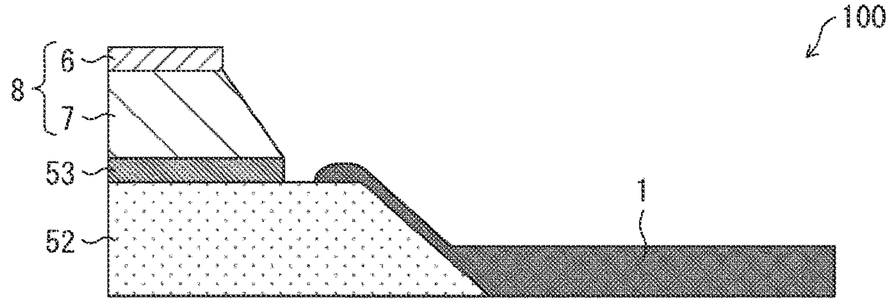
FIG. 52 is an illustration of an example of a cross-sectional structure of a display device in accordance with Embodiment 8 of the present disclosure.

FIG. 52 is an illustration of an example of a cross-sectional structure of a display device 100 in accordance with Embodiment 8 of the present disclosure.

Referring to FIG. 52, the display device 100 may include a liquid-repellent bank 8 so as to provide a liquid-repellent layer 53 between a photosensitive layer 7 and a bank 52 provided in advance in order to electrically isolate and thus separate adjacent pixels. This structure renders the coating liquid 4 less likely to be applied to the photosensitive layer 7 on the liquid-repellent layer 53, thereby enabling preventing burrs from being formed on the top end of the functional layer 1.

FIGS. 53 to 61 are cross-sectional views illustrating a method of manufacturing the display device 100 in accordance with Embodiment 8 of the present disclosure.

Figure 53:
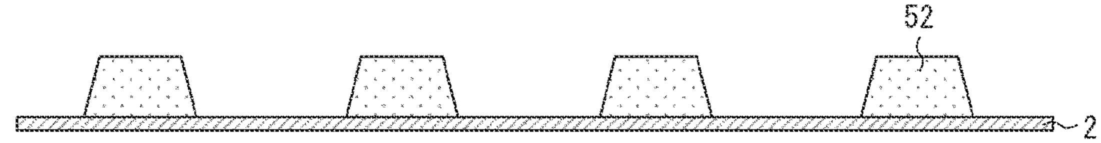
FIG. 53 is a cross-sectional view illustrating a method of manufacturing a display device in accordance with Embodiment 8 of the present disclosure.

In the step shown in FIG. 53, the bank 52 is formed on the substrate 2.

Figure 54:
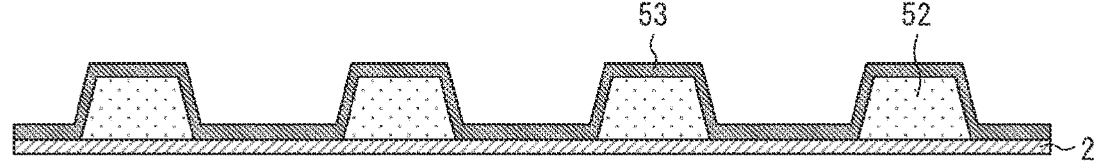
FIG. 54 is a cross-sectional view illustrating the method of manufacturing a display device in accordance with Embodiment 8 of the present disclosure.

In the step shown in FIG. 54, the liquid-repellent layer 53 is formed on the substrate 2 as well as on the bank 52.

Figure 55:
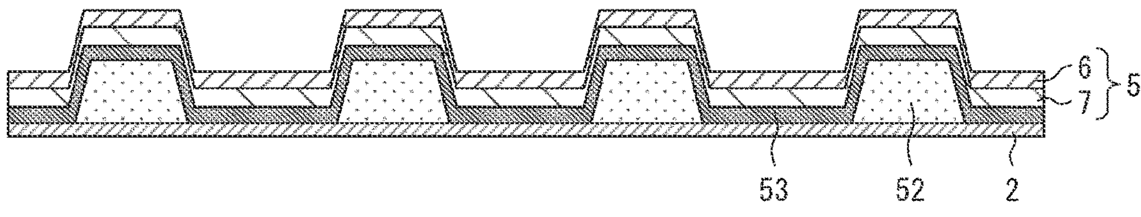
FIG. 55 is a cross-sectional view illustrating the method of manufacturing a display device in accordance with Embodiment 8 of the present disclosure.
Figure 56:
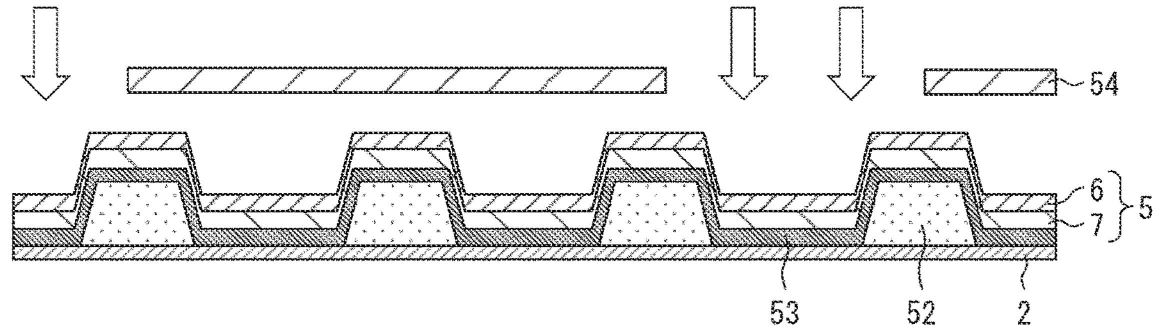
FIG. 56 is a cross-sectional view illustrating the method of manufacturing a display device in accordance with Embodiment 8 of the present disclosure.
Figure 57:
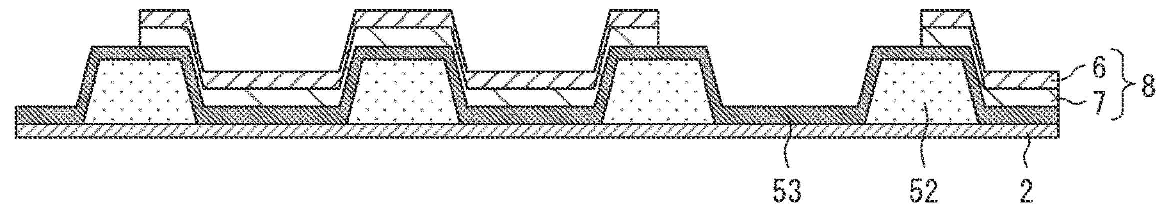
FIG. 57 is a cross-sectional view illustrating the method of manufacturing a display device in accordance with Embodiment 8 of the present disclosure.

The steps shown in FIGS. 55 to 57 correspond to the liquid-repelling bank formation step in accordance with the present disclosure. The following will describe the step shown in FIG. 55, the step shown in FIG. 56, and the step shown in FIG. 57.

In the step shown in FIG. 55, the resist layer 5 is formed on the liquid-repellent layer 53 to form a layered structure of the photosensitive layer 7 and the liquid-repellent layer 6.

In the step shown in FIG. 56, the areas where the liquid-repellent bank 8 is to be formed are covered with a photomask 54, and the resist layer 5 is exposed to light.

In the step shown in FIG. 57, the resist layer 5 exposed to light in the step shown in FIG. 56 is removed to form the liquid-repellent bank 8.

Figure 58:
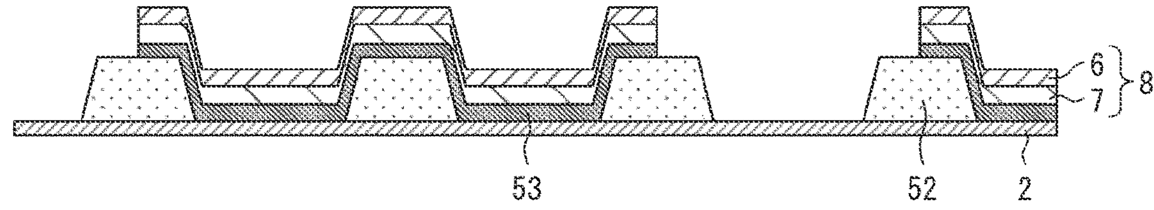
FIG. 58 is a cross-sectional view illustrating the method of manufacturing a display device in accordance with Embodiment 8 of the present disclosure.

In the step shown in FIG. 58, the liquid-repellent layer 53 remaining in the areas where the resist layer 5 is removed in the step shown in FIG. 57 is removed by, for example, etching. Examples of the etching include plasma etching and solvent washing. Examples of the solvent used in the solvent washing include fluorine-based solvents such as hydrofluoroethers and hydrofluoroolefins.

Figure 59:
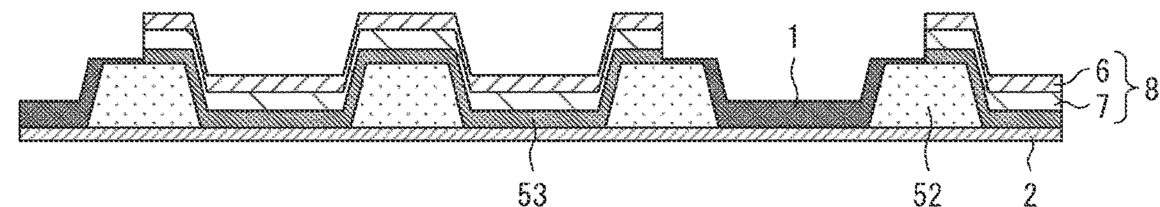
FIG. 59 is a cross-sectional view illustrating the method of manufacturing a display device in accordance with Embodiment 8 of the present disclosure.

In the step shown in FIG. 59, the coating liquid 4 is applied to a region including the area surrounded by the liquid-repellent bank 8 to form the functional layer 1 in that area (functional layer formation step).

Figure 60:
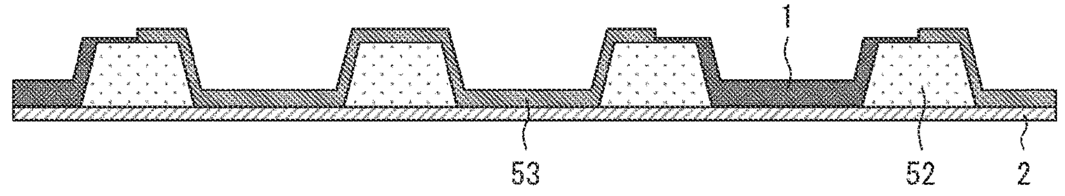
FIG. 60 is a cross-sectional view illustrating the method of manufacturing a display device in accordance with Embodiment 8 of the present disclosure.

In the step shown in FIG. 60, the liquid-repellent bank 8 (all or parts of the liquid-repellent bank) is removed (removal step).

Figure 61:
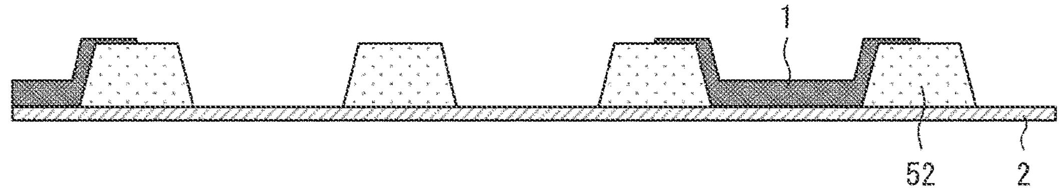
FIG. 61 is a cross-sectional view illustrating the method of manufacturing a display device in accordance with Embodiment 8 of the present disclosure.

In the step shown in FIG. 61, the liquid-repellent layer 53 is removed.

The steps shown in FIGS. 53 to 61 are repeated the number of times that is equal to the number of functional layers 1.

FIGS. 62 to 67 are cross-sectional views illustrating variation examples of the method of manufacturing the display device 100 in accordance with Embodiment 8 of the present disclosure.

Figure 62:
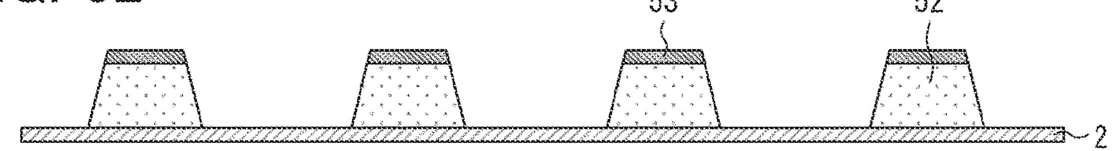
FIG. 62 is a cross-sectional view illustrating a variation example of the method of manufacturing a display device in accordance with Embodiment 8 of the present disclosure.

In the step shown in FIG. 62, the liquid-repellent layer 53 is formed on the bank 52 formed on the substrate 2.

Figure 63:
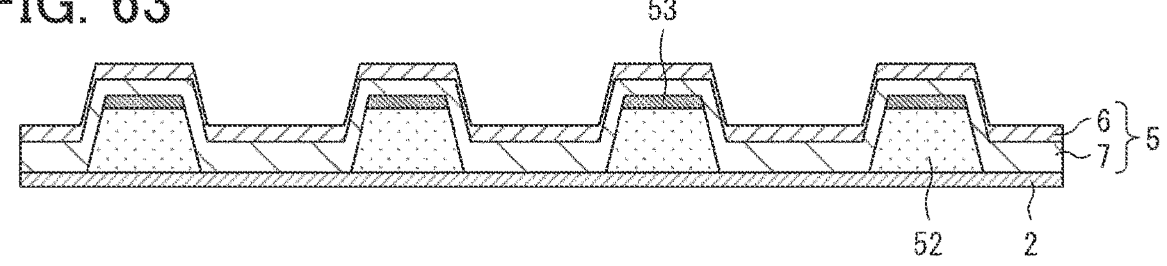
FIG. 63 is a cross-sectional view illustrating a variation example of the method of manufacturing a display device in accordance with Embodiment 8 of the present disclosure.
Figure 64:
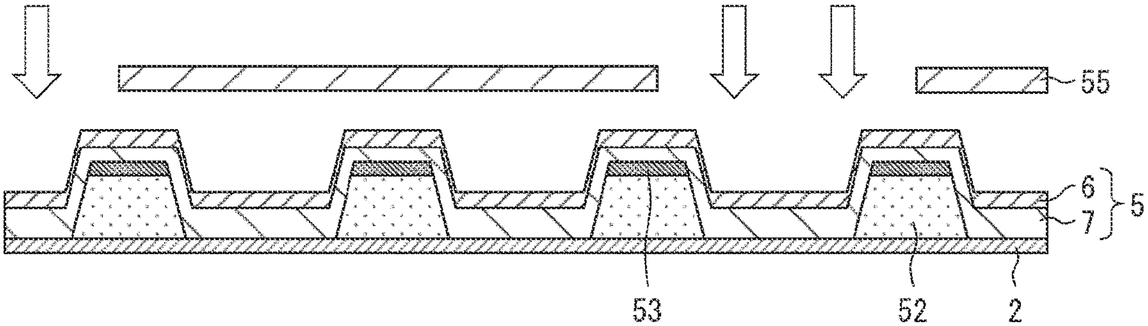
FIG. 64 is a cross-sectional view illustrating a variation example of the method of manufacturing a display device in accordance with Embodiment 8 of the present disclosure.
Figure 65:
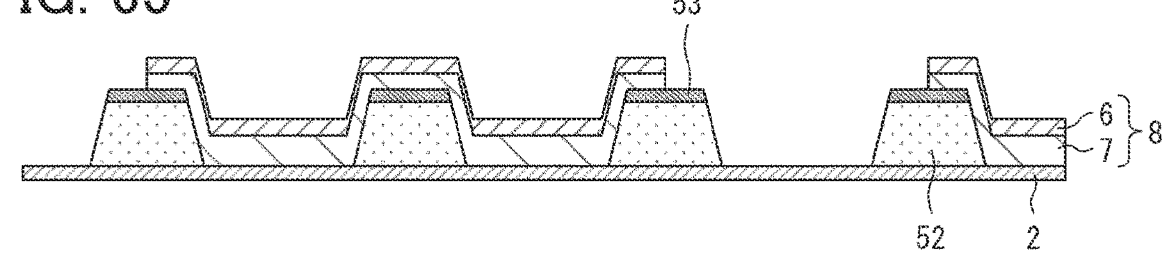
FIG. 65 is a cross-sectional view illustrating a variation example of the method of manufacturing a display device in accordance with Embodiment 8 of the present disclosure.

The steps shown in FIGS. 63 to 65 correspond to the liquid-repelling bank formation step in accordance with the present disclosure. The following will describe the step shown in FIG. 63, the step shown in FIG. 64, and the step shown in FIG. 65.

In the step shown in FIG. 63, the layered structure of the photosensitive layer 7 and the liquid-repellent layer 6 is formed by forming the resist layer 5 on the substrate 2 as well as on the liquid-repellent layer 53.

In the step shown in FIG. 64, the areas where the liquid-repellent bank 8 is to be formed are covered with a photomask 55, and the resist layer 5 is exposed to light.

In the step shown in FIG. 65, the resist layer 5 exposed to light in the step shown in FIG. 64 is removed to form the liquid-repellent bank 8.

Figure 66:
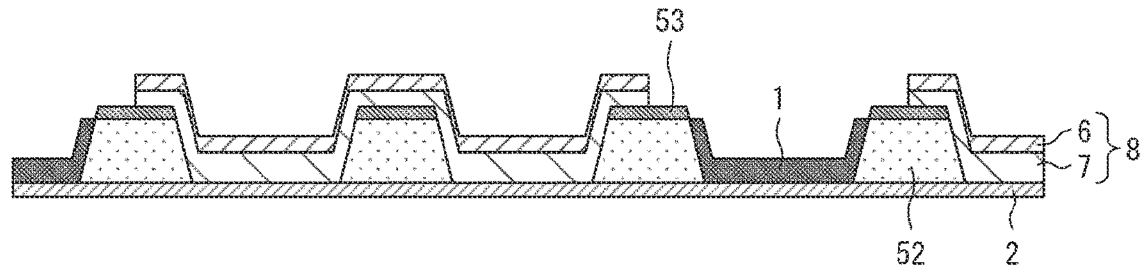
FIG. 66 is a cross-sectional view illustrating a variation example of the method of manufacturing a display device in accordance with Embodiment 8 of the present disclosure.

In the step shown in FIG. 66, the coating liquid 4 is applied to a region including the area surrounded by the liquid-repellent bank 8 to form the functional layer 1 in that area (functional layer formation step).

Figure 67:
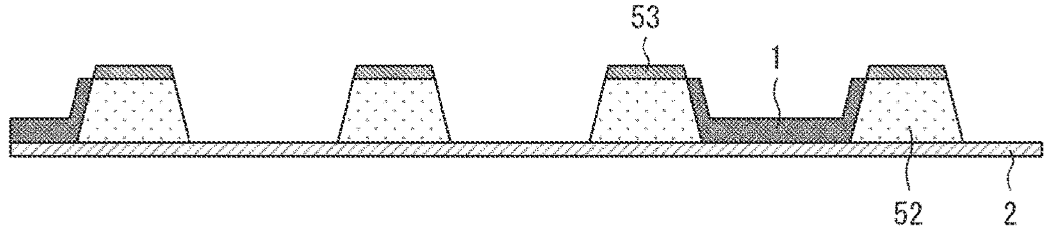
FIG. 67 is a cross-sectional view illustrating a variation example of the method of manufacturing a display device in accordance with Embodiment 8 of the present disclosure.

In the step shown in FIG. 67, the liquid-repellent bank 8 (all or parts of the liquid-repellent bank) is removed (removal step).

Embodiment 9

Figure 68:
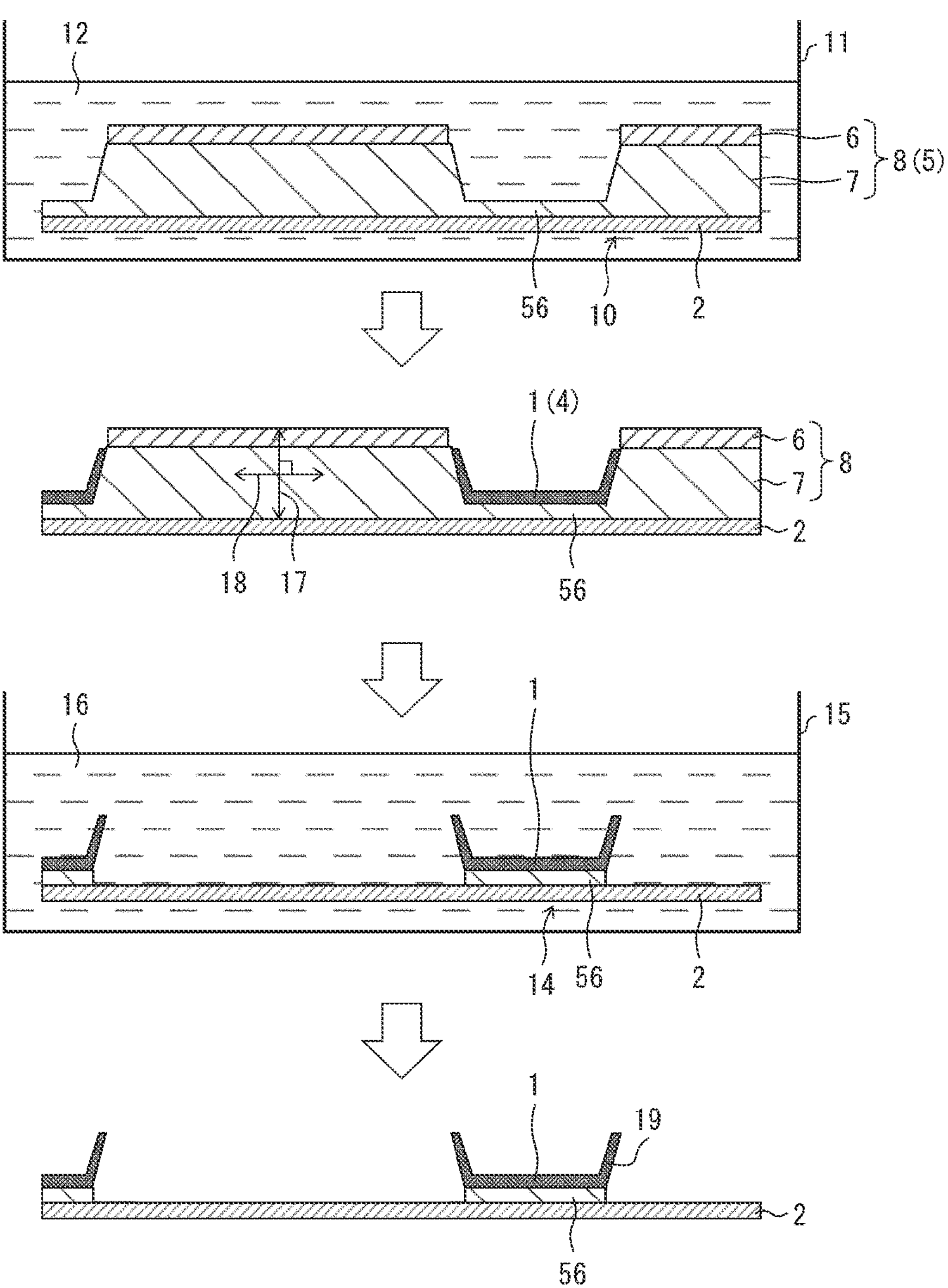
FIG. 68 is a cross-sectional view illustrating a method of manufacturing a display device in accordance with Embodiment 9 of the present disclosure.
Figure 69:
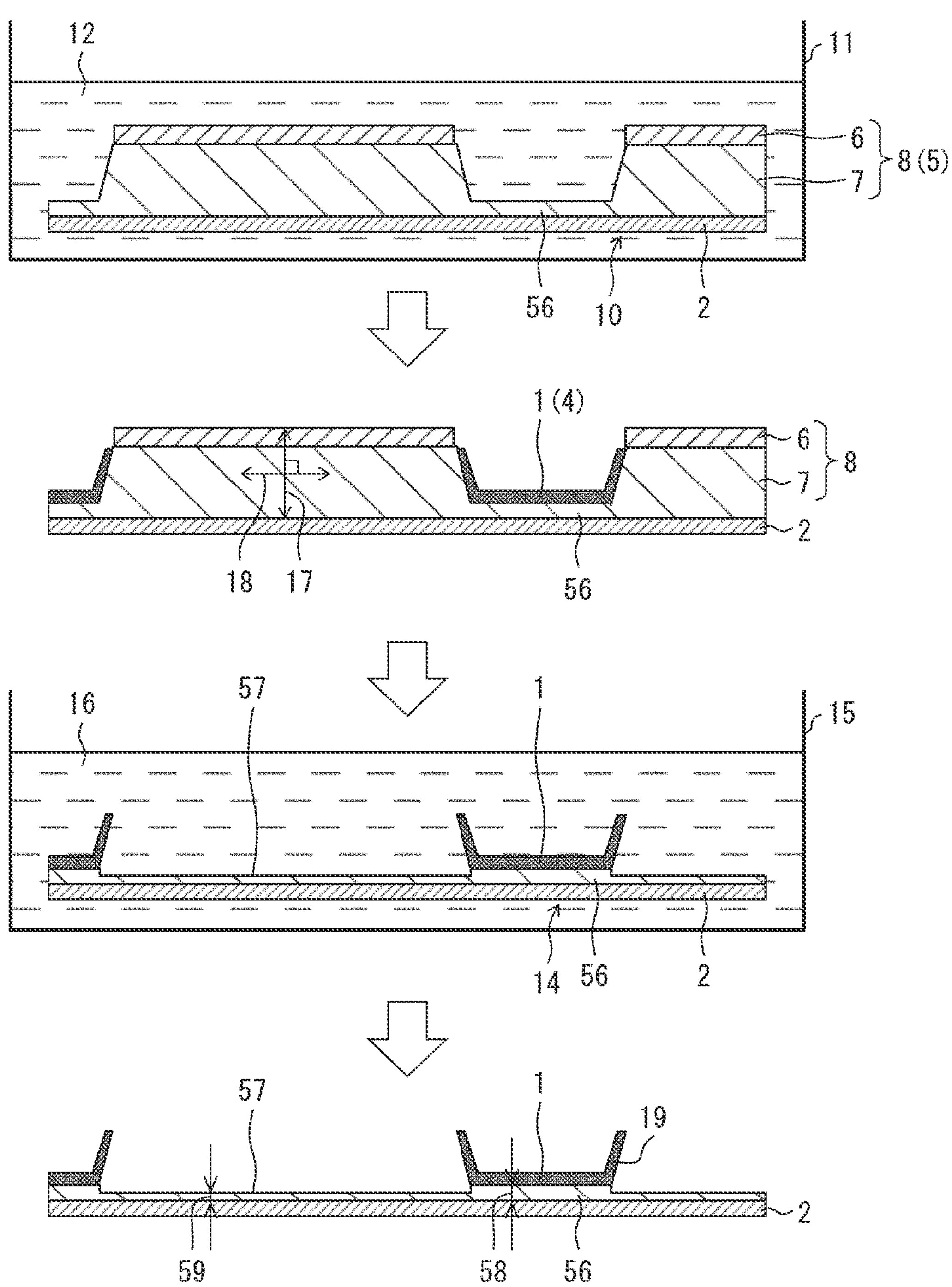
FIG. 69 is a cross-sectional view illustrating a variation example of the method of manufacturing a display device in accordance with Embodiment 9 of the present disclosure.

FIG. 68 is a cross-sectional view illustrating a method of manufacturing a display device 100 in accordance with Embodiment 9 of the present disclosure. FIG. 69 is a cross-sectional view illustrating a variation example of the method of manufacturing the display device 100 in accordance with Embodiment 9 of the present disclosure.

In the method of manufacturing the display device 100 in accordance with Embodiment 9 of the present disclosure, the four steps shown in FIG. 68 are carried out sequentially from above after the steps shown in FIGS. 2 to 4. In the variation example of the method of manufacturing the display device 100 in accordance with Embodiment 9 of the present disclosure, the four steps shown in FIG. 69 are carried out sequentially from above after the steps shown in FIGS. 2 to 4. The four steps shown in FIG. 68 and the four steps shown in FIG. 69 correspond respectively to FIGS. 5, 6, 8, and 9 sequentially from above.

According to FIG. 68, the method of manufacturing the display device 100 in accordance with Embodiment 9 of the present disclosure differs from the method of manufacturing the display device 100 in accordance with Embodiment 1 of the present disclosure in the following points.

In the method of manufacturing the display device 100 in accordance with Embodiment 9 of the present disclosure, a first thin film 56 is formed with respect to the liquid-repellent bank 8 in the direction 18, which is substantially perpendicular to the thickness direction 17 of the liquid-repellent bank 8, in the liquid-repelling bank formation step, which corresponds to the top one of the four steps. The first thin film 56, since being made of the liquid-repelling bank-formation-use solution 3 as is the liquid-repellent bank 8, contains the same material as the liquid-repellent bank 8. According to FIG. 68, the first thin film 56 may be described as being formed in those areas where no liquid-repellent bank 8 is provided.

In the method of manufacturing the display device 100 in accordance with Embodiment 9 of the present disclosure, the functional layer 1 is formed above the first thin film 56 in the functional layer formation step, which corresponds to the second top one of the four steps.

According to FIG. 69, the variation example of the method of manufacturing the display device 100 in accordance with Embodiment 9 of the present disclosure differs from the method of manufacturing the display device 100 in accordance with Embodiment 9 of the present disclosure in the following points.

In the variation example of the method of manufacturing the display device 100 in accordance with Embodiment 9 of the present disclosure, a second thin film 57 is formed by removing only some parts of the liquid-repellent bank 8 in the removal step, which corresponds to the third and fourth top steps of the four steps. The second thin film 57, since being inherently a part of the liquid-repellent bank 8, contains the same material as the liquid-repellent bank 8. The thickness 59 of the second thin film 57 is smaller than the thickness 58 of the first thin film 56.

Examples of the development solution 16 include PGMEA, PGME, acetone, IPA, DMSO, and ethanol.

Figure 70:
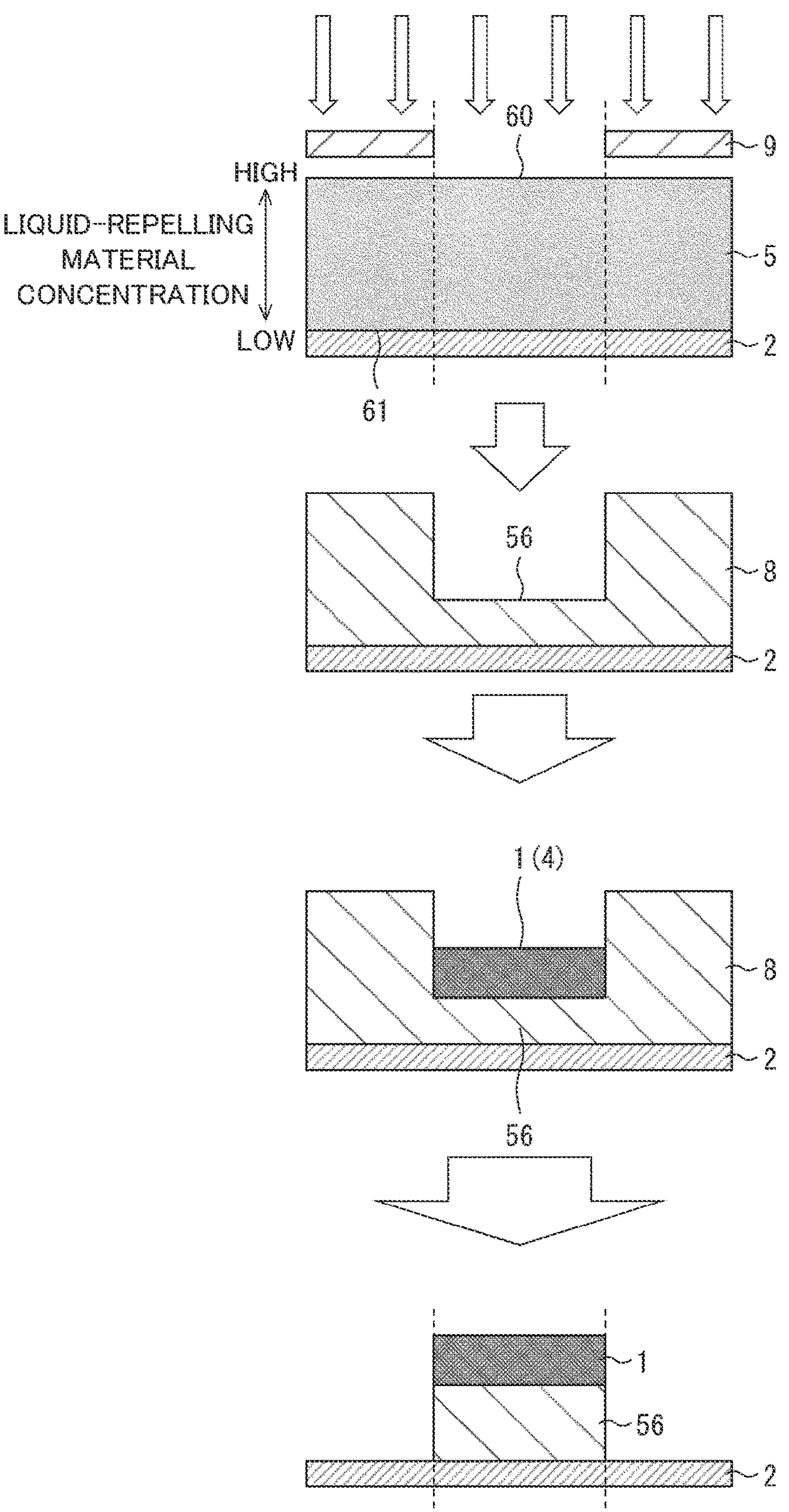
FIG. 70 is a supplementary, explanatory illustration of the method of manufacturing a display device in accordance with Embodiment 9 of the present disclosure.
Figure 71:
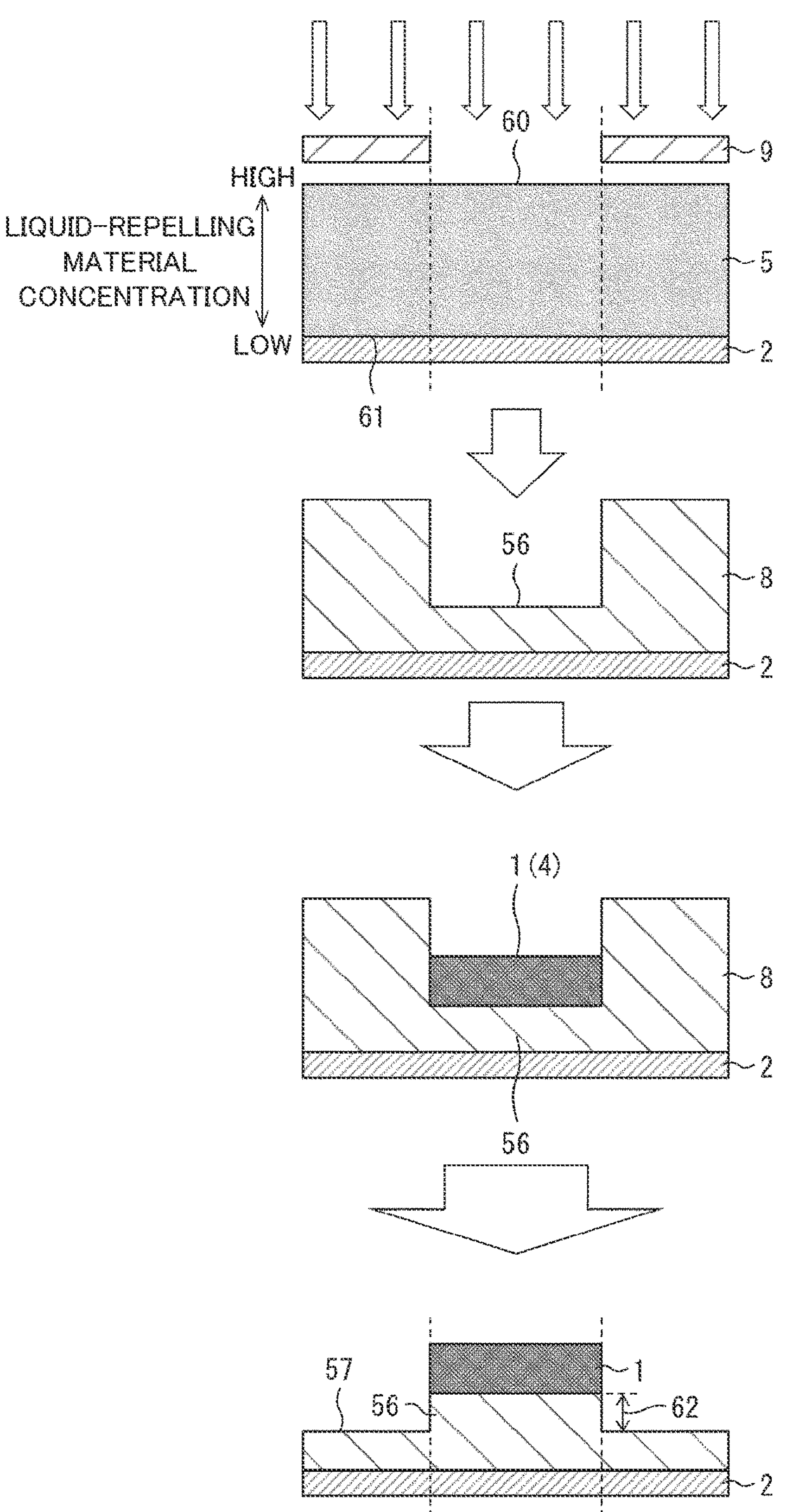
FIG. 71 is a supplementary, explanatory illustration of a variation example of the method of manufacturing a display device in accordance with Embodiment 9 of the present disclosure.

FIG. 70 is a supplementary, explanatory illustration of the method of manufacturing the display device 100 in accordance with Embodiment 9 of the present disclosure. FIG. 71 is a supplementary, explanatory illustration of a variation example of the method of manufacturing the display device 100 in accordance with Embodiment 9 of the present disclosure.

The resist layer 5 has a liquid-repelling material concentration that increases toward the top end 60 thereof. The first thin film 56 has a sufficiently low liquid-repelling material concentration because the first thin film 56 is formed by removing the resist layer 5 from the top end 60 thereof toward the bottom end 61 thereof. Therefore, it is possible to form the functional layer 1 on the first thin film 56 by applying the coating liquid 4.

The thickness of the first thin film 56 can be controlled in accordance with the type of the development solution 12 and the exposure time of the resist layer 5. For example, when the resist layer 5 has a thickness of approximately from 100 nm to 5,000 nm, both inclusive, the thickness of the first thin film 56 may be less than or equal to 20 nm.

The difference 62 between the thickness of the first thin film 56 and the thickness of the second thin film 57 can be adjusted in accordance with the difference between the type of the development solution 12 and the type of the development solution 16, more specifically, the difference between the solubility of the development solution 12 and the solubility of the development solution 16.

Embodiment 10

Figure 72:
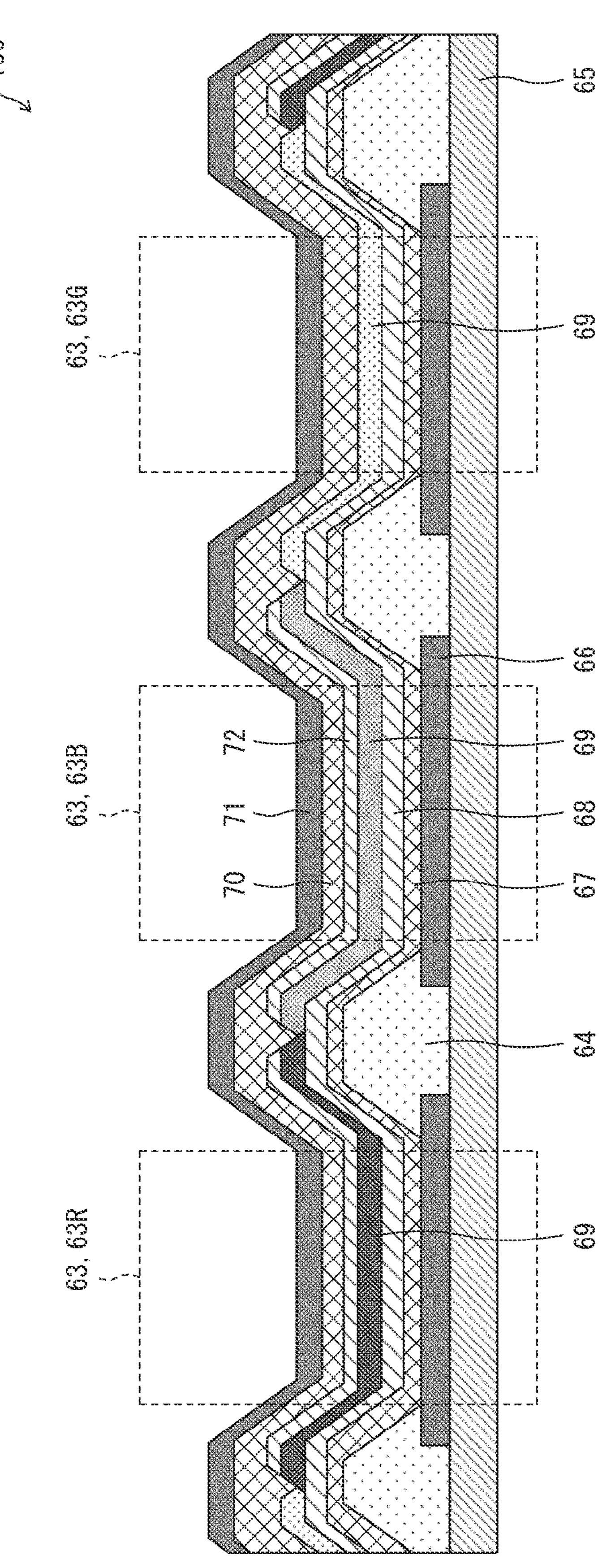
FIG. 72 is a schematic cross-sectional view of a structure of a display device in accordance with Embodiment 10 of the present disclosure.

FIG. 72 is a schematic cross-sectional view of a structure of a display device 100 in accordance with Embodiment 10 of the present disclosure.

The display device 100 shown in FIG. 72 includes three display units 63, a bank 64, and a substrate 65. These three display units 63 are, from left to right, a red display unit 63R that produces a red display, a blue display unit 63B that produces a blue display, and a green display unit 63G that produces a green display. The display units 63 correspond to pixels.

Each of the three display units 63 includes a lower electrode 66, a charge transport layer 67, a first thin film 68, a light-emitting layer (functional layer) 69, a charge transport layer 70, and an upper electrode 71 in this order when viewed from the substrate 65. FIG. 72 shows the first thin film 68 being provided between the light-emitting layer 69 and the charge transport layer 67. Each of the red display unit 63R and the blue display unit 63B includes a first thin film 72 between the light-emitting layer 69 and the charge transport layer 70. Each of the first thin films 68 and 72 is provided between the light-emitting layer 69 and another layer stacked on or below the light-emitting layer 69.

In each of the three display units 63, the light-emitting layer 69 emits light by virtue of the current flow between the lower electrode 66 and the upper electrode 71. When the lower electrode 66 is an anode, the charge transport layer 67 is a hole transport layer. When the lower electrode 66 is a cathode, the charge transport layer 67 is an electron transport layer. When the upper electrode 71 is an anode, the charge transport layer 70 is a hole transport layer. When the upper electrode 71 is a cathode, the charge transport layer 70 is an electron transport layer. The light-emitting layer 69 contains, for example, an OLED (organic light-emitting diode) or a QLED (quantum-dot light-emitting diode).

The bank 64 is disposed between adjacent two of the three display units 63. The bank 64 electrically isolates and thus separates adjacent pixels.

Each of the first thin film 68 and 72 can be readily formed by referring to the method of forming the first thin film 56 described earlier. Each of the first thin films 68 and 72, since containing the same material as the liquid-repellent bank 8 described earlier, contains a liquid-repelling material.

Each of the three display units 63 includes the first thin film 68, and each of the red display unit 63R and the blue display unit 63B includes the first thin film 72. Hence, the display device 100 shown in FIG. 72 achieves the following advantageous effects.

Each of the first thin films 68 and 72 affects the supply of electric charges to the light-emitting layer 69. Therefore, the charge-carrier balance can be improved, and the luminous efficiency can be ultimately enhanced, in the display units 63.

The first thin films 68 and 72 can be formed together with the light-emitting layer 69. Therefore, the luminous efficiency can be enhanced by a simple step.

The first thin film 72 is capable of protecting the light-emitting layer 69 from, for example, water content. The first thin film 72, since containing a liquid-repelling material, has an excellent capability of protecting the light-emitting layer 69 from, for example, water content.

Dissolution color mixing can be prevented in overlapping portions of another color.

The light-emitting layer 69 is provided also on flat surfaces outside the display units 63 unlike inkjet technology. The thickness, the liquid-repelling material type, and the liquid-repelling material concentration of the first thin film 68 and/or 72 may differ for each light-emitting layer 69, in other words, for each color of the light emitted by the pixels.

Each of the first thin films 68 and 72 may have a thickness of less than or equal to 20 nm. Hence, since each of the first thin films 68 and 72 is highly conducting, the drive voltage of the display units 63 can be lowered.

Each of the first thin films 68 and 72 contains a liquid-repelling material and a photoresist (resin, photosensitive material). Each of the first thin films 68 and 72 preferably is a continuous film formed integrally across a plurality of pixels and contains a positive photoresist. Examples of the liquid-repelling material include fluorine-based materials and silicon-based materials. When the liquid-repelling material is electron-accepting (e.g., a fluorine-based material), the LUMO energy level decreases significantly. When the liquid-repelling material is electron-donating (e.g., a silicon-based material), the HOMO energy level increases significantly.

Figure 73:
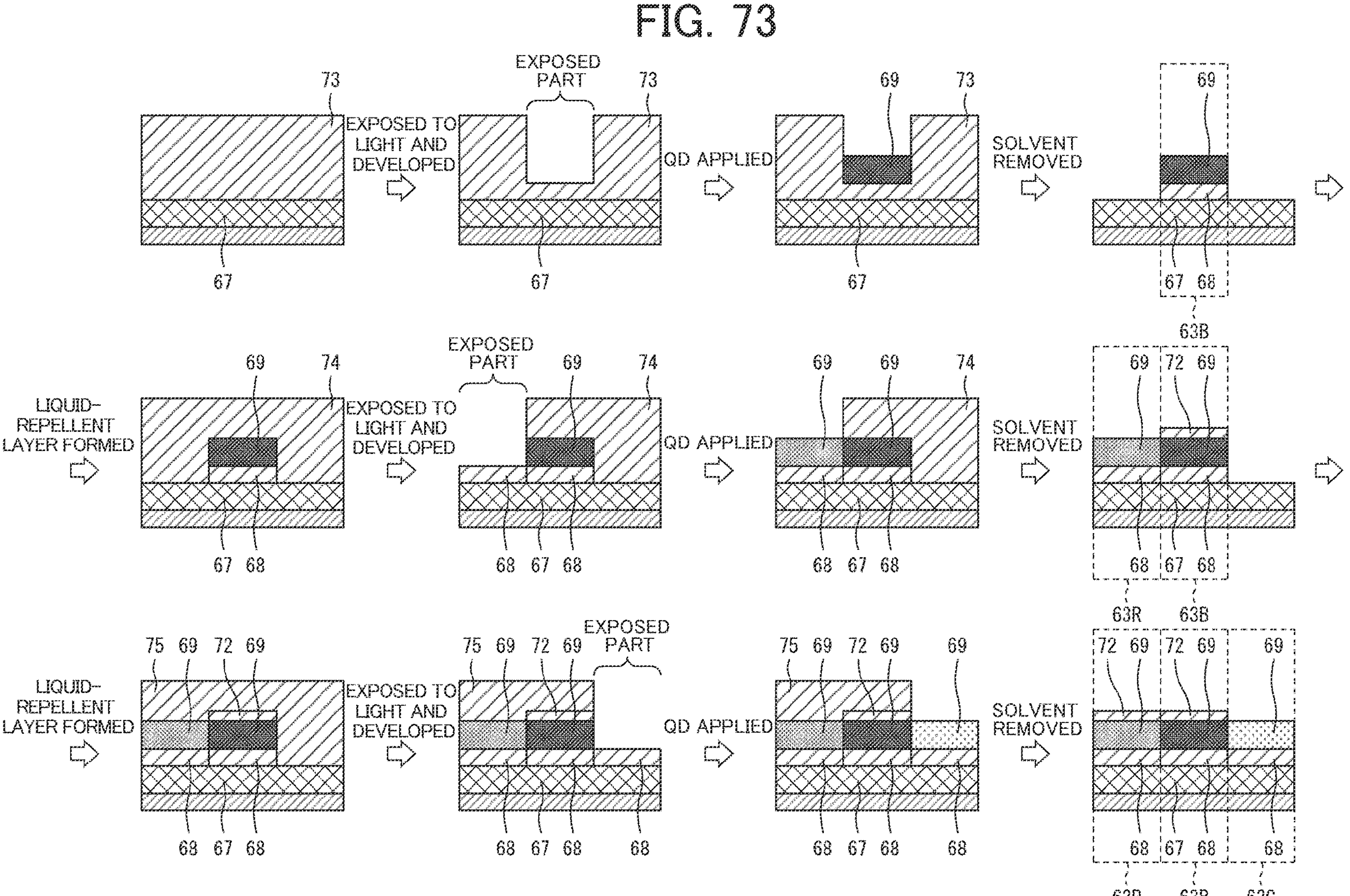
FIG. 73 is a schematic cross-sectional view illustrating major parts of a method of manufacturing the display device in accordance with Embodiment 10 of the present disclosure.

FIG. 73 is a schematic cross-sectional view illustrating major parts of a method of manufacturing the display device 100 in accordance with Embodiment 10 of the present disclosure. FIG. 73 omits the members barely related to the description for a concise description. The members denoted by reference numerals 73 to 75 in FIG. 73 are resist layers containing a liquid-repelling material.

FIG. 73 indicates the first thin film 72 missing above the light-emitting layer 69 in the green display unit 63G because none of the resist layers 73 to 75 is formed on the light-emitting layer 69 in the green display unit 63G after the light-emitting layer 69 is formed.

Embodiment 11

Figure 74:
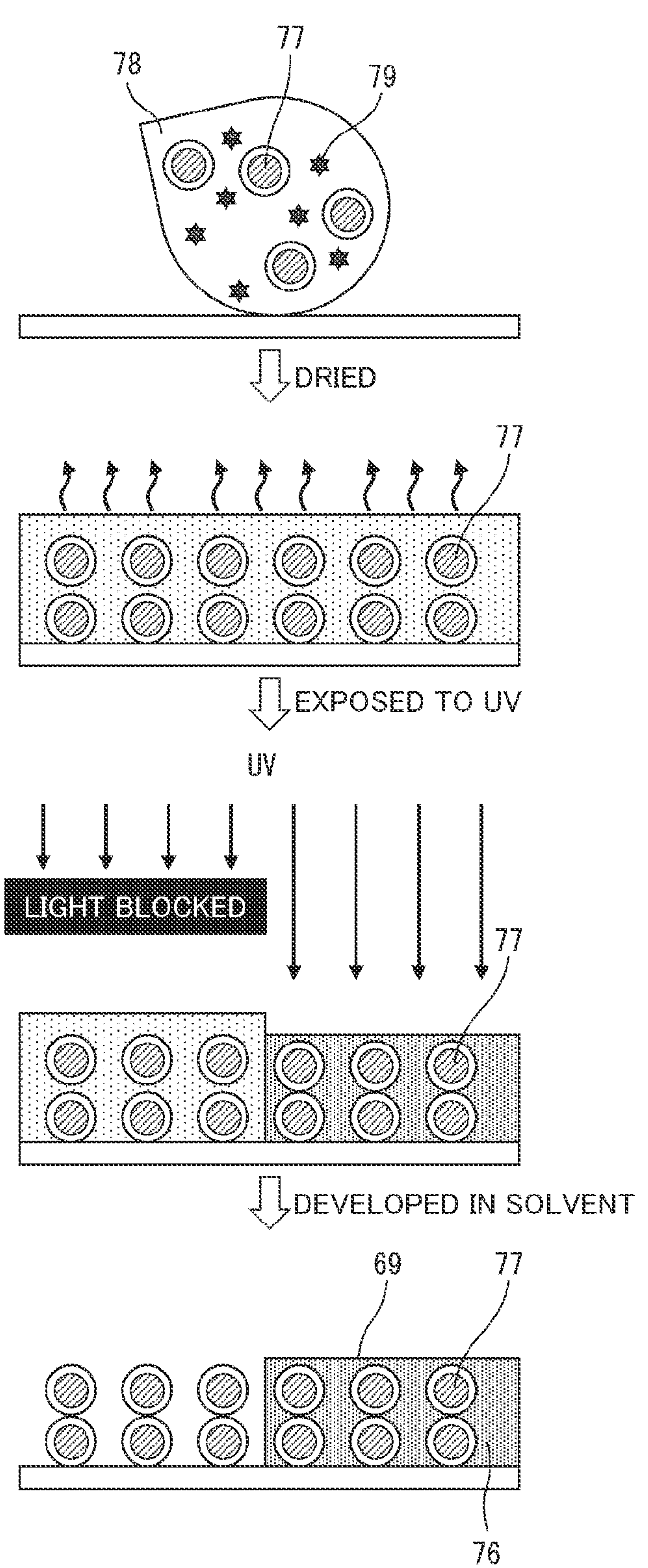
FIG. 74 is an illustration of Embodiment 11 of the present disclosure.

FIG. 74 is an illustration of Embodiment 11 of the present disclosure.

Referring to FIG. 74, a light-emitting layer 69 may include: a continuous film 76 of a metal sulfide; and a plurality of quantum dots (plurality of quantum dots 77) encaged in the continuous film 76. The light-emitting layer 69 may be formed by dispersing a metal-sulfide precursor 79 and the numerous quantum dots 77 in a polar solvent 78, thereby preparing a quantum-dot-dispersed solution, and applying, exposing to light, and developing this quantum-dot-dispersed solution. The continuous film 76 may be made of, for example, ZnS.

The light-emitting layer 69 may contain: a metal sulfide (continuous film 76) including a continuous film with an area of at least 1,000 $nm^2$ in the in-plane direction which is perpendicular to the thickness direction thereof in any location with respect to the thickness direction; and at least one quantum dot 77 encaged in the metal sulfide and also having a different composition from the metal sulfide, may have a thickness the maximum value of which is less than or equal to twice the minimum value thereof, and may contain atoms including 5 atom % or fewer carbon atoms.

The light-emitting layer 69 may contain: a metal sulfide (continuous film 76) including a continuous film with an area of at least 1,000 $nm^2$ in the in-plane direction which is perpendicular to the thickness direction thereof in any location with respect to the thickness direction; and at least one quantum dot 77 encaged in the metal sulfide and also having a different composition from the metal sulfide, may have a thickness the maximum value of which is less than or equal to twice the minimum value thereof, and may contain 1 atom % or more halogen atoms.

The light-emitting layer 69 may include at least one quantum dot 77, a metal sulfide, and halogen atoms and may have an average halogen atom concentration that is 10% or more higher within 1 nm from the outermost surface of each quantum dot 77 than in other locations.

This structure facilitates the patterning of the light-emitting layer 69 even if the light-emitting layer 69 is as thick as 50 nm to 200 nm, both inclusive.

Embodiment 12

Figure 75:
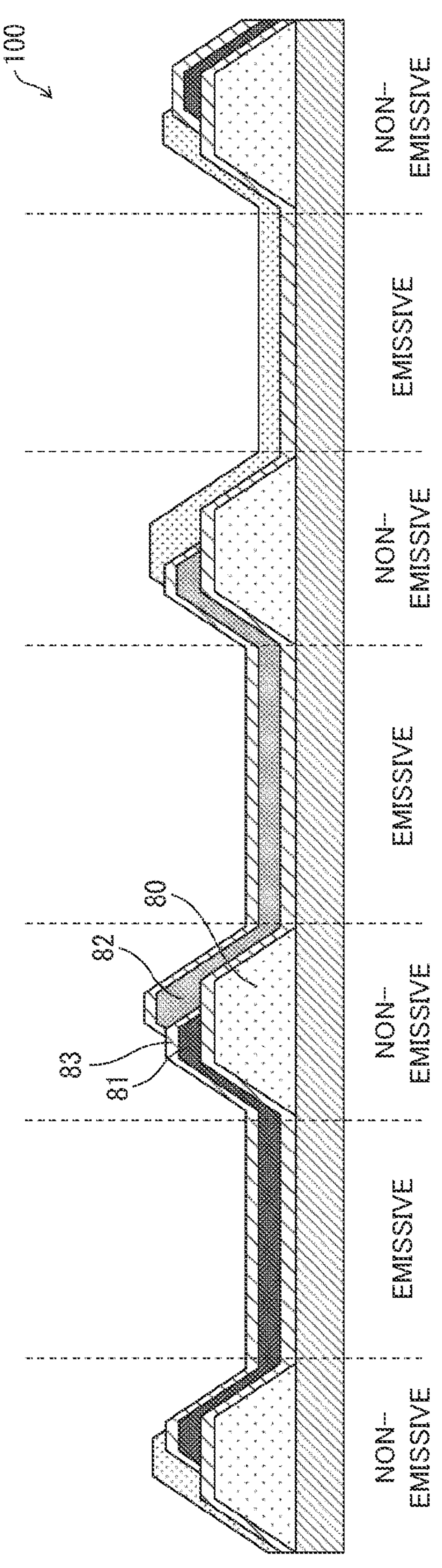
FIG. 75 is a schematic cross-sectional view of a structure of a display device in accordance with Embodiment 12 of the present disclosure.

FIG. 75 is a schematic cross-sectional view of a structure a display device 100 in accordance with Embodiment 12 of the present disclosure.

The display device 100 shown in FIG. 75 includes a bank 80 provided in order to electrically isolate and thus separate adjacent pixels and further includes a light-emitting layer (functional layer) 81 and a light-emitting layer (another functional layer) 82 that overlap each other across a first thin film 83 above the bank 80.

This structure enables restraining the light emitted by the light-emitting layers 81 and 82 from producing a mixed color because the light-emitting layer 81 and the light-emitting layer 82 are not in contact with each other. The structure can further increase the size of each light-emitting layer 81 and 82, thereby increasing the uniformity of the thickness of the light-emitting portions.

Figure 76:
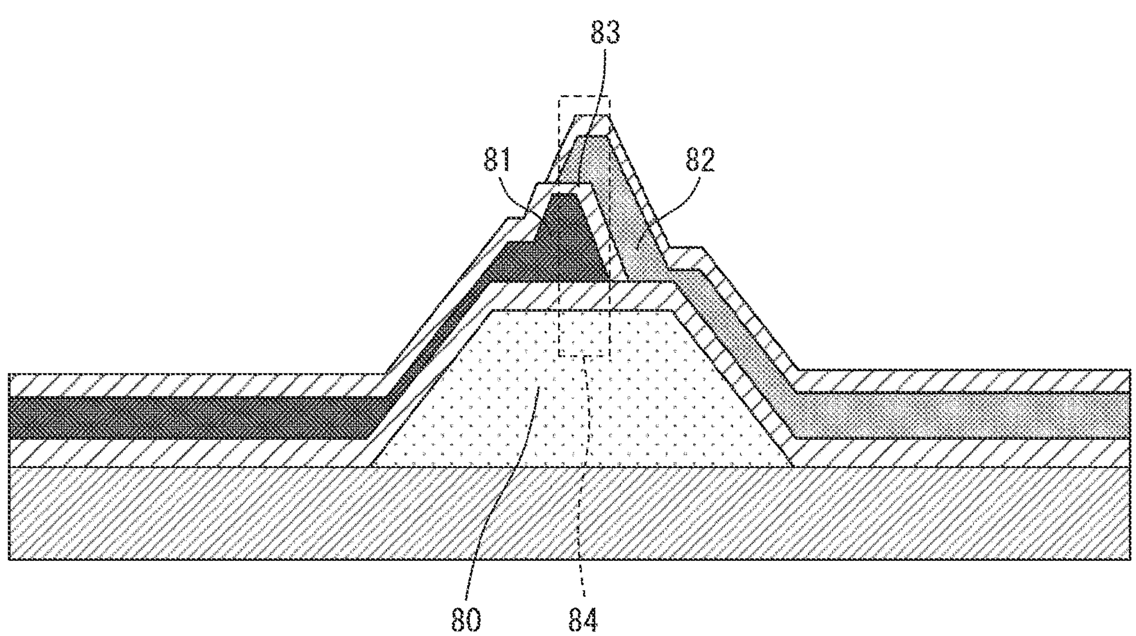
FIG. 76 is a schematic cross-sectional view of a structure of a variation example of the display device in accordance with Embodiment 12 of the present disclosure.

FIG. 76 is a schematic cross-sectional view of a structure of a variation example of the display device 100 in accordance with Embodiment 12 of the present disclosure.

The light-emitting layers 81 and 82 may have a maximum thickness portion thereof in a portion 84 where the light-emitting layer 81 and the light-emitting layer 82 overlap each other. The light-emitting layer 81 or 82 may have a maximum thickness portion thereof in a portion 84 where the light-emitting layer 81 and the light-emitting layer 82 overlap each other.

Embodiment 13

Figure 77:
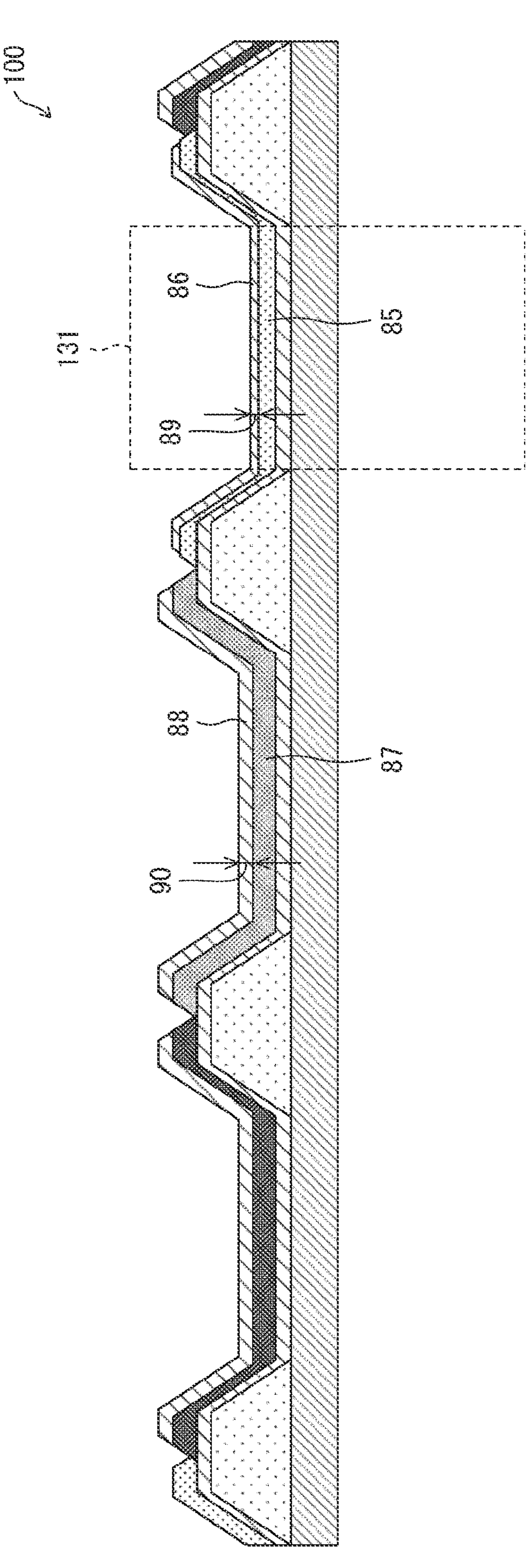
FIG. 77 is a schematic cross-sectional view of a structure of a display device in accordance with Embodiment 13 of the present disclosure.

FIG. 77 is a schematic cross-sectional view of a structure of a display device 100 in accordance with Embodiment 13 of the present disclosure.

The display device 100 shown in FIG. 77 includes a first thin film 86 above a light-emitting layer (functional layer) 85. The first thin film 86, disposed above the light-emitting layer 85, has a thickness 89 that is smaller than the thickness 90 of a first thin film 88 disposed above a light-emitting layer (other functional layer) 87. This structure enables the first thin film 86 to contribute to improvement of the charge-carrier balance of a display unit 131 which corresponds to the light-emitting layer 85, thereby allowing for enhancement of the luminous efficiency of the display unit 131.

Figure 78:
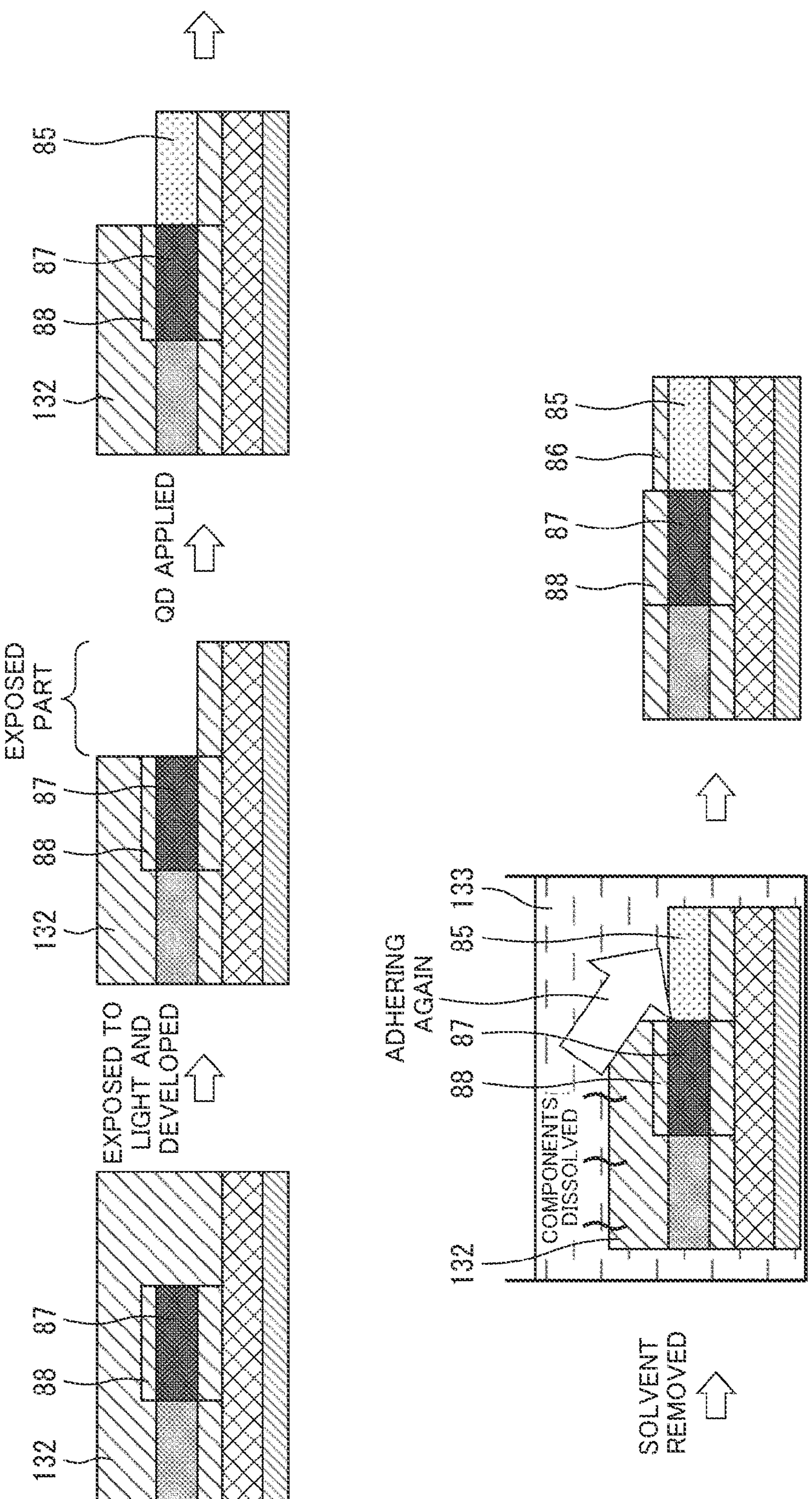
FIG. 78 is a schematic cross-sectional view illustrating major parts of a method of manufacturing the display device in accordance with Embodiment 13 of the present disclosure.

FIG. 78 is a schematic cross-sectional view illustrating major parts of a method of manufacturing the display device 100 in accordance with Embodiment 13 of the present disclosure. FIG. 78 omits the members barely related to the description for a concise description.

FIG. 78 shows that a resist layer 132 containing a liquid-repelling material is removed, with the first thin film 88 being left, after the light-emitting layer 85 is formed. In so doing, by adhering the material for the resist layer 132 contaminating a development solution 133 to above the light-emitting layer 85, the first thin film 86 containing the material for the resist layer 132 (in other words, containing a liquid-repelling material) is formed above the light-emitting layer 85. The first thin film 86 formed in this manner may either be far thinner than or have approximately the same thickness as the first thin film 88 formed by controlling exposure and/or development conditions.

Embodiment 14

Figure 79:
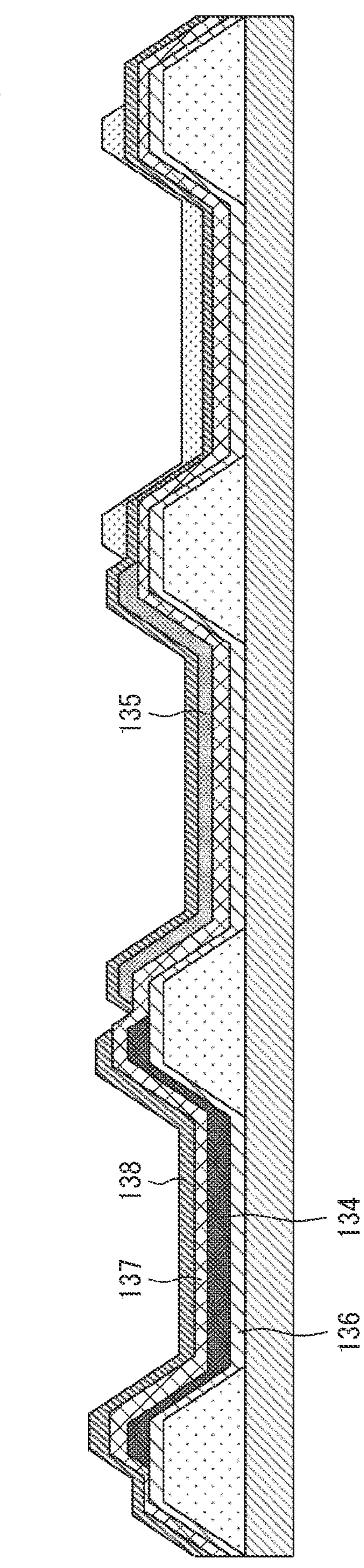
FIG. 79 is a schematic cross-sectional view of a structure of a display device in accordance with Embodiment 14 of the present disclosure.

FIG. 79 is a schematic cross-sectional view of a structure of a display device 100 in accordance with Embodiment 14 of the present disclosure.

The display device 100 shown in FIG. 79 includes a plurality of first thin films 137 and a plurality of first thin films 138 overlying a light-emitting layer (functional layer) 134. The display device 100 shown in FIG. 79 includes a plurality of first thin films 136 and a plurality of first thin films 137 underlying a light-emitting layer (functional layer) 135. There may be provided a plurality of first thin films at least either overlying the functional layers or underlying the functional layers.

Although FIG. 79 shows three first thin films, there may be provided four or more first thin films.

This structure enables more elaborately improving the charge-carrier balance of each display unit independently.

Embodiment 15

Figure 80:
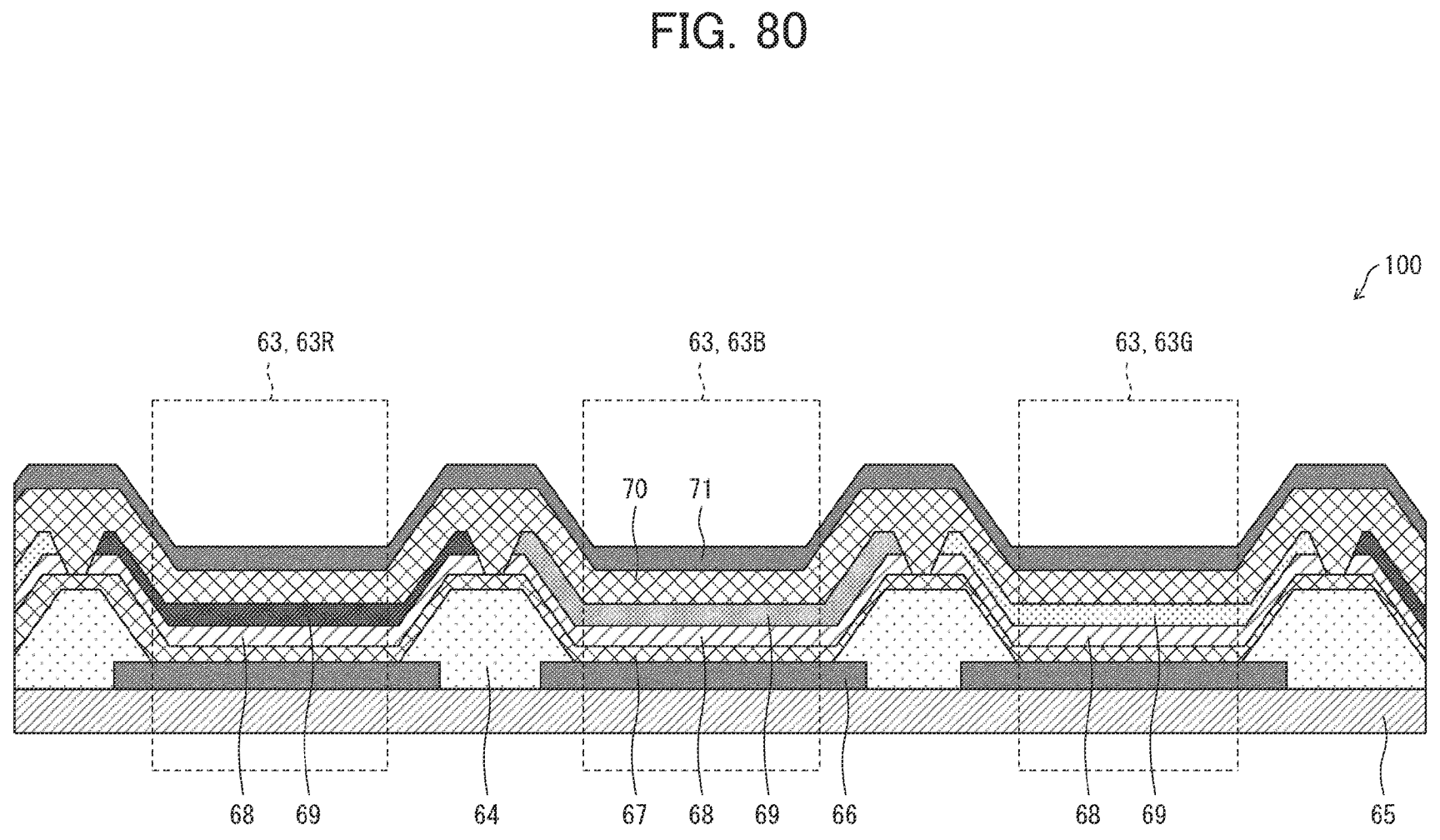
Figure 81:
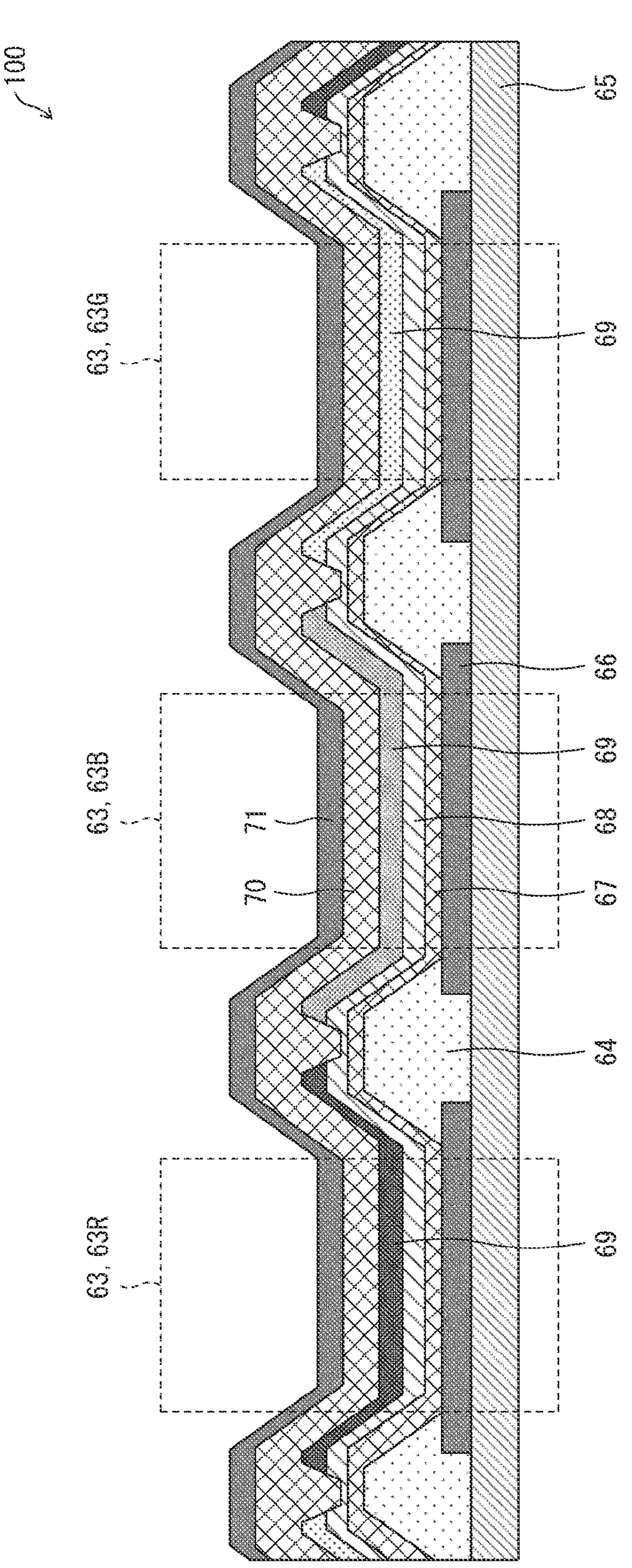
FIG. 81 is a schematic cross-sectional view of a structure of another display device in accordance with Embodiment 15 of the present disclosure.

FIG. 80 is a schematic cross-sectional view of a structure of a display device 100 in accordance with Embodiment 15 of the present disclosure. FIG. 81 is a schematic cross-sectional view of a structure of another display device 100 in accordance with Embodiment 15 of the present disclosure.

The display devices 100 shown in FIGS. 80 and 81 differ from the display device 100 shown in FIG. 72 in that the former includes no first thin film 72 provided between the light-emitting layer 69 and the charge transport layer 70. In other words, the display devices 100 shown in FIGS. 80 and 81 include no first thin film overlying the light-emitting layer 69. In addition, the display devices 100 shown in FIGS. 80 and 81 further differ from the display device 100 shown in FIG. 72 in that the former include two adjacent light-emitting layers 69 that are sufficiently separated from each other on the bank 64.

In addition, in the display device 100 shown in FIG. 80, the contact area of the first thin film 68 and the charge transport layer 70 is reduced to a minimum because the first thin film 68 is cut off at a site where the two adjacent light-emitting layers 69 are separated from each other on the bank 64. This structure enables reducing the undesirable possibility of mixing the materials produced by dissolution of the first thin film 68 and the charge transport layer 70, thereby providing the display device 100 with good properties.

A method of manufacturing the display device 100 shown in FIG. 80 has an advantage, among others, that the method allows for a wide variety of choices in selecting a material for the charge transport layer 70.

Figure 82:
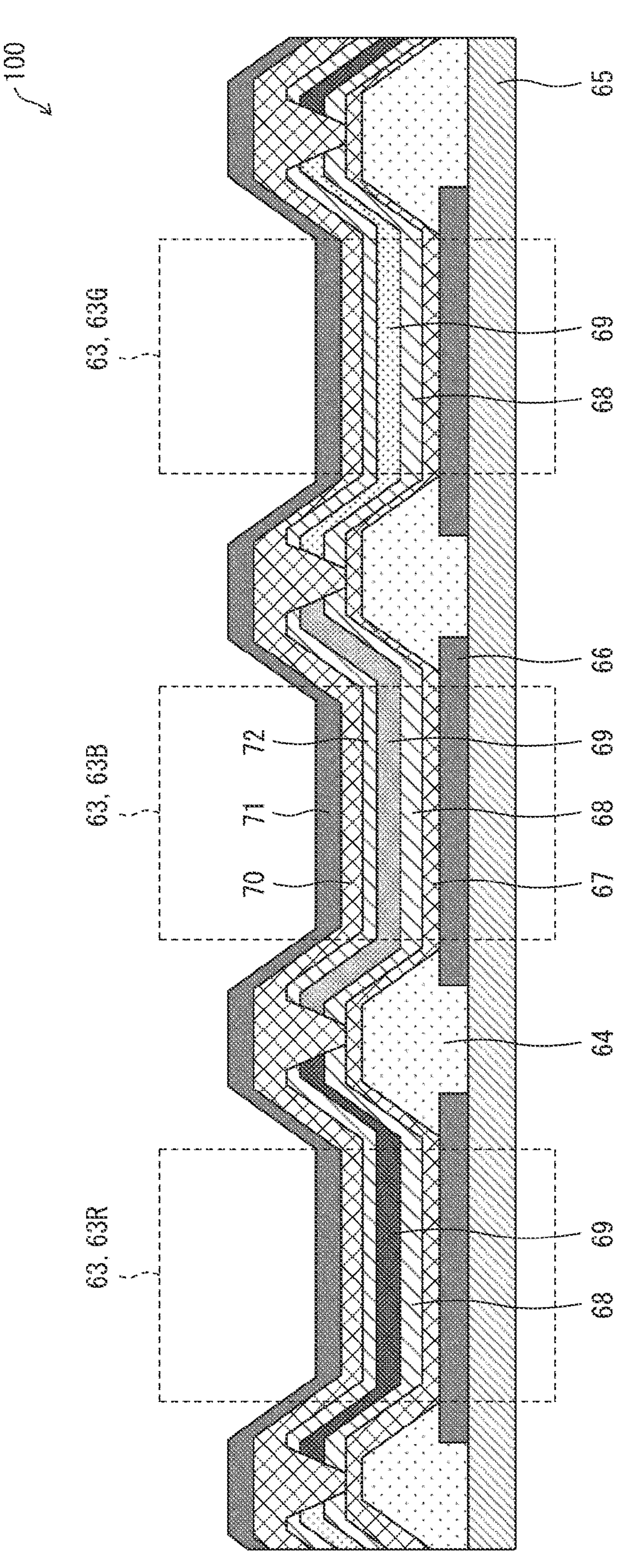
FIG. 82 is a schematic cross-sectional view of a structure of a variation example of a display device in accordance with Embodiment 15 of the present disclosure.
Figure 83:
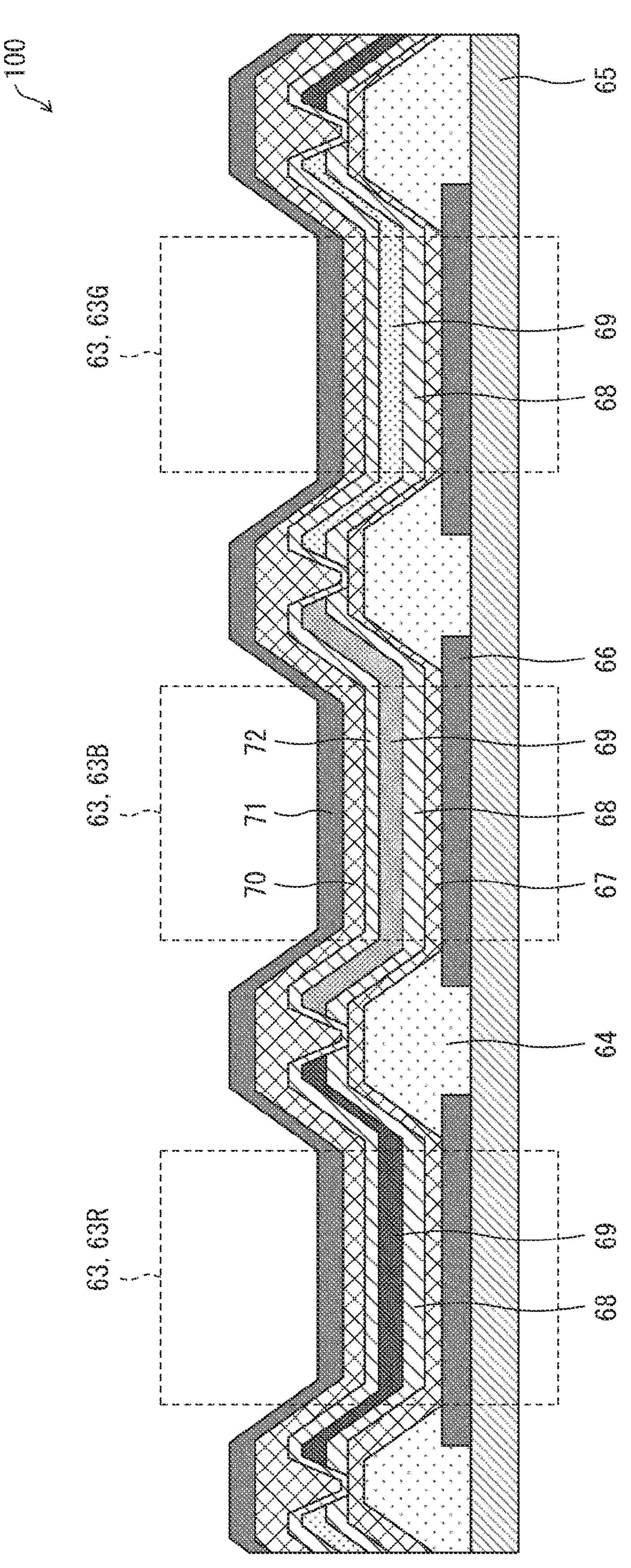
FIG. 83 is a schematic cross-sectional view of a structure of another variation example of a display device in accordance with Embodiment 15 of the present disclosure.

FIG. 82 is a schematic cross-sectional view of a structure of a variation example of the display device 100 in accordance with Embodiment 15 of the present disclosure. FIG. 83 is a schematic cross-sectional view of a structure of another variation example of the display device 100 in accordance with Embodiment 15 of the present disclosure.

The display devices 100 shown in FIGS. 82 and 83 each include a first thin film 72 between the light-emitting layer 69 and the charge transport layer 70 as well as the display device 100 shown in FIG. 80.

In the display device 100 shown in FIG. 82, the first thin film 72 is cut off (for each pixel) on the bank 64. This structure enables restraining electric current from flowing to any component other than the light-emitting layer 69, thereby providing the display device 100 with good properties.

In the display device 100 shown in FIG. 83, the first thin film 72 is continuous on the bank 64 (across a plurality of pixels). This structure enables reducing the undesirable possibility of mixing the materials produced by dissolution of the charge transport layer 67 and the charge transport layer 70, thereby providing the display device 100 with good properties.

Additional Remarks

Various examples of components of the first thin film and the second thin film are listed below. The first thin film and the second thin film may each contain other components including a curing agent, a surfactant, and other materials generally used in photoresist.

Fluorine-Based Liquid-Repellent Component

Perfluoroalkyl compound (CF3(CF2)n-R), where R can be any structure, for example, perfluoroalkyl sulfonate (CF3(CF2)nSO3H) (PFOS), perfluoroalkyl carboxylate (CF3(CF2)nCOOH) (PFOA), and fluorotelomer alcohol (F(CF2)nCH2CH2OH).

There also exists a "hybrid surfactant," which is a surfactant that includes a fluorocarbon chain and a hydrocarbon chain in a single molecule. Hydrophilic groups may be, for example, sulfonate, sulfate ester salt, phosphate ester salt, or a compound including a polyethylene oxide chain.

Silicon-Based Liquid-Repellent Agent

Polyether-modified silicone surfactant.

Resin

Acrylic-based, novolac-based, rubber-based, styrene-based, epoxy-based, etc.

Photosensitive Material

Onium salt, dicarboxyimidyl sulfonate ester, oxime sulfonate ester, diazo(sulfonylmethyl) compounds, disulfonylmethylene hydrazine compounds, nitrobenzil sulfonate ester, biimidazole compounds, diazomethane derivatives, glyoxime derivatives, β-ketosulfone derivatives, disulfone derivatives, nitrobenzil sulfonate derivatives, sulfonate ester derivatives, imidyl sulfonate derivatives, halogenated triazine compounds, equivalents of these materials, and combinations of these materials.

The plurality of first thin films may have mutually different thicknesses and/or mutually different compositions. As described in the previous embodiments, the first thin film is not necessarily formed below and/or above at least one functional layer. In addition, the plurality of first thin films may have the same thickness and/or the same composition. Furthermore, the first thin film and the second thin film may be made of the same material.

General Description

The present disclosure, in aspect 1 thereof, is directed to a method of manufacturing a display device, the method including: a liquid-repelling bank formation step of forming a liquid-repellent bank containing a liquid-repelling material that repels a coating liquid; a functional layer formation step of forming a functional layer in a region including an area surrounded by the liquid-repellent bank by applying the coating liquid to the area; and a removal step of, subsequent to the functional layer formation step, removing at least a part of the liquid-repellent bank.

In aspect 2 of the present disclosure, the method of aspect 1 is configured such that the coating liquid is a solution containing quantum dots and such that the functional layer is a light-emitting layer that emits light owing to the quantum dots.

In aspect 3 of the present disclosure, the method of aspect 1 or 2 is configured such that in the liquid-repelling bank formation step, the liquid-repellent bank is formed by applying a liquid-repelling bank-formation-use solution containing: the liquid-repelling material; a photoresist; and a solvent.

In aspect 4 of the present disclosure, the method of any one of aspects 1 to 3 is configured such that in the liquid-repelling bank formation step, the liquid-repelling material is rendered to have a concentration that increases toward a front face of the liquid-repellent bank.

In aspect 5 of the present disclosure, the method of any one of aspects 1 to 4 is configured such that in the liquid-repelling bank formation step, the liquid-repellent bank is rendered to have a dimension that increases toward a top end of the liquid-repellent bank, the dimension being measured in a direction substantially perpendicular to a thickness direction of the liquid-repellent bank.

In aspect 6 of the present disclosure, the method of any one of aspects 1 to 5 is configured such that in the functional layer formation step, a plurality of interconnected functional layers are formed.

In aspect 7 of the present disclosure, the method of any one of aspects 1 to 6 is configured such that in the functional layer formation step, a remainder of the coating liquid that does not contribute to formation of the functional layer is guided outside a display area where the display device produces a display.

In aspect 8 of the present disclosure, the method of any one of aspects 1 to 7 is configured such that in the liquid-repelling bank formation step, a groove is formed using the liquid-repellent bank in a direction substantially perpendicular to an application direction of the coating liquid in the functional layer formation step.

In aspect 9 of the present disclosure, the method of aspect 3 is configured such that in the liquid-repelling bank formation step, the liquid-repellent bank is formed that includes: a photosensitive layer made primarily of the photoresist; and a liquid-repellent layer containing the liquid-repelling material in a higher proportion than does the photosensitive layer.

In aspect 10 of the present disclosure, the method of any one of aspects 1 to 9 is configured such that in the liquid-repelling bank formation step, the liquid-repellent bank is formed on a bank formed in advance to electrically isolate and thus separate adjacent pixels.

In aspect 11 of the present disclosure, the method of aspect 3 is configured such that in the liquid-repelling bank formation step, the liquid-repellent bank is formed that includes (1): a photosensitive layer made primarily of the photoresist; and a liquid-repellent layer containing the liquid-repelling material in a higher proportion than does the photosensitive layer, (2) the liquid-repellent layer being disposed between the photosensitive layer and a bank formed in advance to electrically isolate and thus separate adjacent pixels.

In aspect 12 of the present disclosure, the method of any one of aspects 1 to 11 is configured such that in the functional layer formation step, a layer other than the functional layer is formed on the functional layer.

In aspect 13 of the present disclosure, the method of any one of aspects 1 to 12 is configured so as to further include: a first step of forming a first functional layer; a second step of forming a first resist layer containing the liquid-repelling material on the first functional layer; a third step of exposing a part of the first resist layer to light and removing the part of the first resist layer and the first functional layer under the part of the first resist layer, to form a first liquid-repellent bank; a fourth step of forming a second functional layer in an area where the first functional layer is removed in the third step; a fifth step of removing the first resist layer remaining after the third step; a sixth step of forming a second resist layer containing the liquid-repelling material on the first functional layer and on the second functional layer; a seventh step of exposing a part of the second resist layer located on the first functional layer to light and removing the part of the second resist layer and the first functional layer under the part of the second resist layer, to form a second liquid-repellent bank; and an eighth step of forming a third functional layer in an area where the first functional layer is removed in the seventh step.

In aspect 14 of the present disclosure, the method of aspect 3 is configured such that the photoresist is of a positive type.

In aspect 15 of the present disclosure, the method of any one of aspects 1 to 14 is configured such that in the liquid-repelling bank formation step, a first thin film containing a same material as the liquid-repellent bank is formed with respect to the liquid-repellent bank in a direction substantially perpendicular to a thickness direction of the liquid-repellent bank and such that in the functional layer formation step, the functional layer is formed above the first thin film.

In aspect 16 of the present disclosure, the method of aspect 15 is configured such that in the removal step, only a part of the liquid-repellent bank is removed to form a second thin film containing the same material as the liquid-repellent bank and such that the second thin film has a smaller thickness than does the first thin film.

The present disclosure, in aspect 17 thereof, is directed to a display device including: a functional layer; and a liquid-repelling material between the functional layer and another layer stacked on or below the functional layer, the liquid-repelling material being configured to repel a coating liquid that is to form the functional layer.

In aspect 18 of the present disclosure, the display device of aspect 17 is configured such that the coating liquid is a solution containing quantum dots and such that the functional layer is a light-emitting layer that emits light owing to the quantum dots.

In aspect 19 of the present disclosure, the display device of aspect 17 or 18 is configured to further include a liquid-repelling-material-missing functional layer, wherein the liquid-repelling material does not exist between the liquid-repelling-material-missing functional layer and another layer stacked on or below the liquid-repelling-material-missing functional layer.

In aspect 20 of the present disclosure, the display device of any one of aspects 17 to 19 is configured so as to further include a first thin film containing the liquid-repelling material between the functional layer and another layer stacked on or below the functional layer.

In aspect 21 of the present disclosure, the display device of aspect 20 is configured such that the first thin film is provided between the functional layer and a charge transport layer as the other layer.

In aspect 22 of the present disclosure, the display device of aspect 20 or 21 is configured such that the first thin film is a continuous film containing a positive photoresist.

In aspect 23 of the present disclosure, the display device of any one of aspects 20 to 22 is configured such that the functional layer contains: a continuous film of a metal sulfide; and a plurality of quantum dots encaged in the continuous film.

In aspect 24 of the present disclosure, the display device of any one of aspects 17 to 23 is configured so as to further include: a bank configured to electrically isolate and thus separate adjacent pixels; and a liquid-repellent bank containing the liquid-repelling material on the bank.

In aspect 25 of the present disclosure, the display device of any one of aspects 20 to 23 is configured so as to further include a bank configured to electrically isolate and thus separate adjacent pixels, wherein the functional layer and another functional layer overlap each other via the first thin film above the bank.

In aspect 26 of the present disclosure, the display device of any one of aspects 20 to 23 is configured so as to further include a bank configured to electrically isolate and thus separate adjacent pixels, wherein the functional layer and another functional layer include the first thin film below the functional layer and the other functional layer respectively on a part of the bank, and the functional layer and the other functional layer are both separated from the first thin film at a same position on the part of the bank.

In aspect 27 of the present disclosure, the display device of aspect 25 is configured such that either one or both of the functional layer and the other functional layer has/have a maximum thickness at a position where the functional layer and the other functional layer overlap each other.

In aspect 28 of the present disclosure, the display device of any one of aspects 20 to 23, 25, and 26 is configured such that the first thin film does not exist above the functional layer.

In aspect 29 of the present disclosure, the display device of any one of aspects 20 to 23, 25, and 26 is configured such that the first thin film exists above the functional layer and such that the first thin film above the functional layer has a smaller thickness than does the first thin film above another functional layer.

In aspect 30 of the present disclosure, the display device of any one of aspects 20 to 23, 25, and 26 is configured so as to further include a plurality of first thin films at least either overlying the functional layer or underlying the functional layer.

In aspect 31 of the present disclosure, the display device of any one of aspects 20 to 23 and 25 to 29 is configured such that the plurality of first thin films have a thickness of less than or equal to 20 nm.

In aspect 32 of the present disclosure, the display device of any one of aspects 20 to 23 and 25 to 29 is configured such that the plurality of first thin films have an equal thickness under the functional layer and under another functional layer.

In aspect 33 of the present disclosure, the display device of any one of aspects 20 to 23 and 25 to 29 is configured such that the plurality of first thin films have different thicknesses under the functional layer and under another functional layer.

In aspect 34 of the present disclosure, the display device of any one of aspects 20 to 23 and 25 to 29 is configured such that the plurality of first thin films contain a same material under the functional layer and under another functional layer.

In aspect 35 of the present disclosure, the display device of any one of aspects 20 to 23 and 25 to 29 is configured such that the plurality of first thin films contain different materials under the functional layer and under another functional layer.

The present disclosure is not limited to the description of the embodiments above and may be altered within the scope of the claims. Embodiments based on a proper combination of technical means disclosed in different embodiments are encompassed in the technical scope of the present disclosure. Furthermore, new technological features can be created by combining different technical means disclosed in the embodiments.

The invention claimed is:

1. A method of manufacturing a display device, the method comprising:

forming a liquid-repellent bank containing a liquid-repelling material that repels a coating liquid, wherein the liquid-repellent bank is formed such that a size of the liquid-repellent bank, as measured in a dimension substantially perpendicular to a thickness direction of the liquid-repellent bank, increases toward a top end of the liquid-repellent bank;

forming a functional layer in a region, including an area surrounded by the liquid-repellent bank, by applying the coating liquid to the area; and subsequent to the functional layer formation, removing at least a part of the liquid-repellent bank.

2. The method according to claim 1, wherein the coating liquid is a solution containing quantum dots, and the functional layer is a light-emitting layer that emits light from the quantum dots.

3. The method according to claim 1, wherein, in the liquid-repelling bank formation, the liquid-repellent bank is formed by applying a liquid-repelling bank-formation-use solution containing the liquid-repelling material, a photoresist, and a solvent.

4. The method according to claim 3, wherein, in the liquid-repelling bank formation, the formed liquid-repellent bank comprises (1): a photosensitive layer, made primarily of the photoresist, and a liquid-repellent layer containing the liquid-repelling material in a higher proportion than does the photosensitive layer, and (2) the liquid-repellent layer that is disposed between the photosensitive layer and an isolation bank formed in advance to electrically isolate and separate adjacent pixels.

5. The method according to claim 3, wherein, in the liquid-repelling bank formation, the formed liquid-repellent bank comprises: a photosensitive layer, made primarily of the photoresist, and a liquid-repellent layer containing the liquid-repelling material in a higher proportion than does the photosensitive layer.

6. The method according to claim 3, wherein the photoresist is of a positive type.

7. The method according to claim 1, wherein, in the liquid-repelling bank formation, the liquid-repelling material is rendered to have a concentration that increases toward a front face of the liquid-repellent bank.

8. The method according to claim 1, wherein, in the functional layer formation, a plurality of interconnected functional layers is formed.

9. The method according to claim 1, wherein, in the liquid-repelling bank formation, a groove is formed in the liquid-repellent bank in a direction substantially perpendicular to an application direction of the coating liquid in the functional layer formation.

10. The method according to claim 1, wherein, in the liquid-repelling bank formation, the liquid-repellent bank is formed on a separation bank formed in advance to electrically isolate and separate adjacent pixels.

11. The method according to claim 1, further comprising:

forming a first functional layer;

forming a first resist layer containing the liquid-repelling material on the first functional layer;

exposing a part of the first resist layer to light, and removing the part of the first resist layer and a part of the first functional layer under the part of the first resist layer, to form a first liquid-repellent bank;

forming a second functional layer in an area where the part of the first functional layer is removed;

removing the first resist layer remaining after the exposing and removing;

forming a second resist layer containing the liquid-repelling material on the first functional layer and on the second functional layer;

exposing a part of the second resist layer located on the first functional layer to light, and removing the part of the second resist layer and a part of the first functional layer under the part of the second resist layer, to form a second liquid-repellent bank; and forming a third functional layer in an area where the part of the first functional layer is removed.

12. The method according to claim 1, wherein, in the functional layer formation, a layer other than the functional layer is formed on the functional layer.

13. A method of manufacturing a display device, the method comprising:

forming a liquid-repellent bank containing a liquid-repelling material that repels a coating liquid;

forming a functional layer in a region, including an area surrounded by the liquid-repellent bank, by applying the coating liquid to the area, wherein a remainder of the coating liquid that does not contribute to the formation of the functional layer is guided outside of a display area where the display device produces a display; and subsequent to the functional layer formation, removing at least a part of the liquid-repellent bank.

14. A method of manufacturing a display device, the method comprising:

forming a liquid-repellent bank containing a liquid-repelling material that repels a coating liquid, wherein a first thin film containing a same material as the liquid-repellent bank is formed in a direction substantially perpendicular to a thickness direction of the liquid-repellent bank;

forming a functional layer in a region including an area surrounded by the liquid-repellent bank, by applying the coating liquid to the area, wherein the functional layer is formed above the first thin film; and subsequent to the functional layer formation, removing at least a part of the liquid-repellent bank.

15. The method according to claim 14, wherein, in the removal, only the part of the liquid-repellent bank is removed, so as to form a second thin film containing the same material as the liquid-repellent bank, and the second thin film has a smaller thickness than the first thin film.

* * * * *